United States Patent [19]
Oberman et al.

[11] Patent Number: 6,115,733
[45] Date of Patent: Sep. 5, 2000

[54] METHOD AND APPARATUS FOR CALCULATING RECIPROCALS AND RECIPROCAL SQUARE ROOTS

[75] Inventors: Stuart F. Oberman, Sunnyvale; Norbert Juffa; Fred Weber, both of San Jose, all of Calif.

[73] Assignee: Advanced Micro Devices, Inc., Sunnyvale, Calif.

[21] Appl. No.: 09/074,826

[22] Filed: May 8, 1998

Related U.S. Application Data

[60] Provisional application No. 60/063,600, Oct. 23, 1997, and provisional application No. 60/063,601, Oct. 23, 1997.

[51] Int. Cl.[7] .................................................. G06F 7/552
[52] U.S. Cl. ........................................... 708/654; 708/605
[58] Field of Search ................................ 708/654, 605, 708/606

[56] References Cited

U.S. PATENT DOCUMENTS

| | | | |
|---|---|---|---|
| 3,633,018 | 1/1972 | Ling | 708/654 |
| 3,777,132 | 12/1973 | Bennett, Jr. | 708/654 |
| 4,163,287 | 7/1979 | Munter et al. | 708/625 |
| 4,573,136 | 2/1986 | Rossiter | 708/603 |
| 4,607,343 | 8/1986 | Chevillat et al. | 708/654 |
| 4,849,923 | 7/1989 | Samudrala et al. | 708/505 |
| 5,157,624 | 10/1992 | Hesson | 708/605 |
| 5,206,823 | 4/1993 | Hesson | 708/654 |
| 5,343,416 | 8/1994 | Eisig et al. | 708/625 |
| 5,606,677 | 2/1997 | Balmer et al. | 712/208 |
| 5,633,818 | 5/1997 | Taniguchi | 708/551 |
| 5,729,481 | 3/1998 | Schwarz | 708/551 |
| 5,737,255 | 4/1998 | Schwarz | 708/551 |
| 5,737,257 | 4/1998 | Chen et al. | 708/620 |
| 5,841,684 | 11/1998 | Dockser | 708/625 |

FOREIGN PATENT DOCUMENTS

| | | |
|---|---|---|
| 0 239 899 | 10/1987 | European Pat. Off. . |
| 0 383 965 | 8/1990 | European Pat. Off. . |
| 0 754 998 | 1/1997 | European Pat. Off. . |

OTHER PUBLICATIONS

A.D. Booth, "A signed binary multiplication technique," *Quaterly Journal of Mechanics and Applied Mathematics*, vol. 4, No. 2, pp. 236–240, 1951.

W.S. Briggs and D.W. Matula, "A 17x69 Bit multiply and add unit with redundant binary feedback and single cycle latency," in *Proceedings of the 11$^{th}$ IEEE Symposium on Computer Arithmetic*, Jul. 1993, pp. 163–170.

D.L. Fowler and J.E. Smith, "An accurate high speed implementation of division by reciprocal approximation," in *Proceedings of the 9$^{th}$ IEEE Symposium on Computer Arithmetic*, Sep. 1989, pp. 60–67.

(List continued on next page.)

*Primary Examiner*—David H. Malzahn
*Attorney, Agent, or Firm*—Conley, Rose & Tayon, P.C.; Dan R. Christen

[57] ABSTRACT

A processor capable of efficiently evaluating constant powers of an operand such as the reciprocal and reciprocal square root is disclosed. The processor comprises a multiplier that is configured to perform iterative multiplication operations to evaluate constant powers of an operand such as the reciprocal and reciprocal square root. Intermediate products that are formed may be rounded and normalized in two paths, one assuming an overflow will occur, and then compressed and stored for use in the next iteration. The processor comprises a multiplier capable of performing signed and unsigned scalar and vector multiplication is disclosed. The multiplier may performing rounded by adding a rounding constant.

30 Claims, 36 Drawing Sheets

OTHER PUBLICATIONS

J.A. Kowaleski, et al, "A dual execution pipelined floating-point CMOS processor," in *Digest of Technical Papers, IEEE International Solid-State Circuits Conference*, 1996, pp. 358–359.

N.T. Quach, et al, "On fast IEEE rounding," Technical Report No. CSL-TR-91-459, Computer Systems Laboratory, Standford University, Jan. 1991.

M.R. Santoro, et al, "Rounding algorithms for IEEE multipliers," in *Proceedings of the 9th IEEE Symposium on Computer Arithmetic*, Sep. 1989, pp. 176–183.

H.P. Sit, et al, "An 80 MFLOPS floating–point engine in the Intel i860 processor," in *Digest of Technical Papers, IEEE International Conference on Computer Design*, 1989, pp. 374–379.

Hennessy & Patterson, "Computer Architecture: A Quantitative Approach," Appendix A (pp. A–2 to A–53), Morgan Kaufmann Publishers, Inc., 1990.

Yu & Zyner, "167 MHz Radix–4 Floating Point Multiplier," SPACR Technology Business, Sun Microsystems, Inc., Sunnyvale, California, pp. 149–154.

| | BASE 10 | BINARY |
|---|---|---|
| SCALAR MULTIPLICATION | | |
| SCALAR MULTIPLICAND | 24 | 0001 1000 (8-BIT) |
| SCALAR MULTIPLIER | 200 | 1100 1000 (8-BIT) |
| SCALAR FINAL PRODUCT | 4800 | 0001 0010 1100 0000 (16-BIT) |
| VECTOR MULTIPLICATION | | |
| VECTOR MULTIPLICAND | (12, 5) | 1100 0101 (4 BITS PER COMPONENT) |
| VECTOR MULTIPLIER | (7, 4) | 0111 0100 (4 BITS PER COMPONENT) |
| VECTOR FINAL PRODUCT | (84, 20) | 0101 0100 0001 0100 (8 BITS PER COMPONENT) |

FIG. 1

Multiplicand ("M") = 11100110 ($230_{10}$)
Multiplier = 11110000 ($240_{10}$)

```
       00000000      0   LSB
       00000000      0
       00000000      0
       00000000      0  ->Multiplier
       11100110      1
       11100110      1
       11100110      1
       11100110      1   MSB
------------------------
  1101011110100000  -> final product
```

Add-and-shift Algorithm

FIG. 5A

Multiplicand ("M") = 11100110 ($230_{10}$)
Multiplier = 11110000 ($240_{10}$)

```
                         0  (padding zero)
         100000000000    0  LSB
                         0
          11000000000    0
                         0  ->Multiplier
          10100011010    1
                         1
           1000000000    1
                         1  MSB
            011100110    0  (padding zero)
       +                 0  (padding zero)
------------------------
      1101011110100000  -> final product
```

2-bit Booth's Algorithm

FIG. 5B

| Rounding Mode → | Round to Nearest (Even) | Truncate to Zero | Round to + ∞ | Round to − ∞ |
|---|---|---|---|---|
| Rounding Constant | +1 | +000... | -Effective Sign | +Effective Sign |
| Carry-Save Adder 276A (assuming overflow) | | | | |
| Sum Value 274A | 00001000 | 00001000 | 00001000 | 00001000 |
| Carry Value 274B | 10100000 | 10100000 | 10100000 | 10100000 |
| Sum + Carry | 10101000 | 10101000 | 10101000 | 10101000 |
| Selected Rounding Constant 268 | 00001000 | 0000 | 1111 | 0000 |
| Output 282A | 10110000 | 10101000 | 10110111 | 10101000 |
| Sticky Bit 286A | 0 | do not care | do not care | do not care |
| LSB | 0 | do not care | do not care | do not care |
| Guard Bit | 1 | do not care | do not care | do not care |
| Perform Fix-up? | YES | NO | NO | NO |
| Output from Fix-up Logic 288A | 1010 | 1010 | 1011 | 1010 |
| Carry-Save Adder 276B (assuming overflow) | | | | |
| Sum Value 274A | x00001000 | x00001000 | x00001000 | x00001000 |
| Carry Value 274B | x10100000 | x10100000 | x10100000 | x10100000 |
| Sum + Carry | 010101000 | 010101000 | 010101000 | 010101000 |
| Selected Rounding Constant 268 | x00010000 | 00000 | 11111 | 00000 |
| Output 282B | 010111000 | 010101000 | 011000111 | 010101000 |
| Sticky Bit 286B | 1 | do not care | do not care | do not care |
| LSB | 1 | do not care | do not care | do not care |
| Guard Bit | 0 | do not care | do not care | do not care |
| Perform Fix-up? | NO | NO | NO | NO |
| Output from Fix-up Logic 288A | 0101 | 0101 | 0110 | 0101 |

FIG. 22

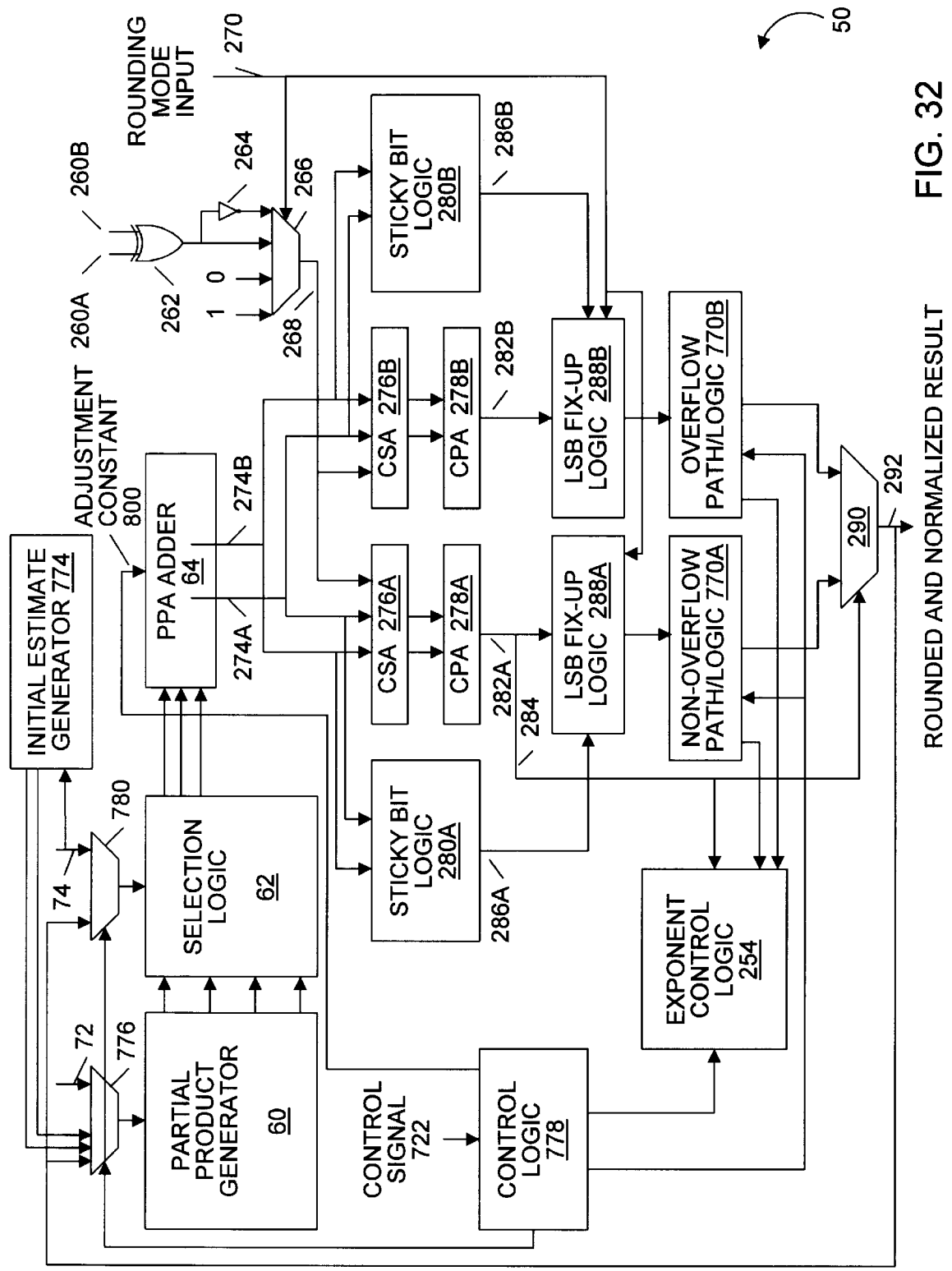

METHOD AND APPARATUS FOR CALCULATING RECIPROCALS AND RECIPROCAL SQUARE ROOTS

This application claims the benefit of U.S. Provisional Application No. 60/063,600, entitled Method And Apparatus For Reciprocal And Reciprocal Square Root, filed Oct. 23, 1997, and of U.S. Provisional Application No. 60/063,601, entitled Multimedia Instruction Unit, filed Oct. 23, 1997.

BACKGROUND OF THE INVENTION

1. Field of the Invention

This invention relates generally to the field of microprocessors and, more particularly, to calculating reciprocal and reciprocal square roots within multiplication arithmetic units in microprocessors.

2. Description of the Related Art

Microprocessors are typically designed with a number of "execution units" that are each optimized to perform a particular set of functions or instructions. For example, one or more execution units within a microprocessor may be optimized to perform memory accesses, i.e., load and store operations. Other execution units may be optimized to perform general arithmetic and logic functions, e.g., shifts and compares. Many microprocessors also have specialized execution units configured to perform more complex arithmetic operations such as multiplication and reciprocal operations. These specialized execution units typically comprise hardware that is optimized to perform one or more particular arithmetic functions. In the case of multiplication, the optimized hardware is typically referred to as a "multiplier."

In older microprocessors, multipliers were implemented using designs that conserved die space at the expense of arithmetic performance. Until recently, this was not a major problem because most applications, i.e., non-scientific applications such as word processors, did not frequently generate multiplication instructions. However, recent advances in computer technology and software are placing greater emphasis upon multiplier performance. For example, three dimensional computer graphics, rendering, and multimedia applications all rely heavily upon a microprocessor's arithmetic capabilities, particularly multiplication and multiplication-related operations. As a result, in recent years microprocessor designers have favored performance-oriented designs that use more die space. Unfortunately, the increased die space needed for these high performance multipliers reduces the space available for other execution units within the microprocessor. Thus, a mechanism for increasing multiplier performance while conserving die space in needed.

The die space used by multipliers is of particular importance to microprocessor designers because many microprocessors, e.g., those configured to execute MMX™ (multimedia extension) or 3D graphics instructions, may use more than one multiplier. MMX and 3D graphics instructions are often implemented as "vectored" instructions. Vectored instructions have operands that are partitioned into separate sections, each of which is independently operated upon. For example, a vectored multiply instruction may operate upon a pair of 32-bit operands, each of which is partitioned into two 16-bit sections or four 8-bit sections. Upon execution of a vectored multiply instruction, corresponding sections of each operand are independently multiplied. FIG. 1 illustrates the differences between a scalar (i.e., non-vectored) multiplication and a vector multiplication. To quickly execute vectored multiply instructions, many microprocessors use a number of multipliers in parallel. In order to conserve die space, a mechanism for reducing the number of multipliers in a microprocessor is desirable. Furthermore, a mechanism for reducing the amount of support hardware (e.g., bus lines) that may be required for each multiplier is also desirable.

Another factor that may affect the number of multipliers used within a microprocessor is the microprocessor's ability to operate upon multiple data types. Most microprocessors must support multiple data types. For example, x86 compatible microprocessors must execute instructions that are defined to operate upon an integer data type and instructions that are defined to operate upon floating point data types. Floating point data can represent numbers within a much larger range than integer data. For example, a 32-bit signed integer can represent the integers between $-2^{31}$ and $2^{31}-1$ (using two's complement format). In contrast, a 32-bit ("single precision") floating point number as defined by the Institute of Electrical and Electronic Engineers (IEEE) Standard 754 has a range (in normalized format) from $2^{-126}$ to $2^{127} \times (2-2^{-23})$ in both positive and negative numbers. While both integer and floating point data types are capable of representing positive and negative values, integers are considered to be "signed" for multiplication purposes, while floating point numbers are considered to be "unsigned." Integers are considered to be signed because they are stored in two's complement representation.

Turning now to FIG. 2A, an exemplary format for an 8-bit integer 100 is shown. As illustrated in the figure, negative integers are represented using the two's complement format 104. To negate an integer, all bits are inverted to obtain the one's complement format 102. A constant of one is then added to the least significant bit (LSB).

Turning now to FIG. 2B, an exemplary format for a 32-bit (single precision) floating point number is shown. A floating point number is represented by a significand, an exponent and a sign bit. The base for the floating point number is raised to the power of the exponent and multiplied by the significand to arrive at the number represented. In microprocessors, base 2 is typically used. The significand comprises a number of bits used to represent the most significant digits of the number. Typically, the significand comprises one bit to the left of the radix point and the remaining bits to the right of the radix point. In order to save space, the bit to the left of the radix point, known as the integer bit, is not explicitly stored. Instead, it is implied in the format of the number. Additional information regarding floating point numbers and operations performed thereon may be obtained in IEEE Standard 754. Unlike the integer representation, two's complement format is not typically used in the floating point representation. Instead, sign and magnitude form are used. Thus, only the sign bit is changed when converting from a positive value 106 to a negative value 108. For this reason, many microprocessors use two multipliers, i.e., one for signed values (two's complement format) and another for unsigned values (sign and magnitude format). Thus, a mechanism for increasing floating point, integer, and vector multiplier performance while conserving die space is needed.

SUMMARY OF THE INVENTION

The problems outlined above are in large part solved by a multiplier configured in accordance with the present invention. In one embodiment, the multiplier may perform signed and unsigned scalar and vector multiplication using the same hardware. The multiplier may receive either signed or unsigned operands in either scalar or packed vector format and accordingly output a signed or unsigned result that is either a scalar or a vector quantity. Advantageously, this embodiment may reduce the total number of multipliers needed within a microprocessor because it may be shared by execution units and perform both scalar and vector multiplication. This space savings may in turn allow designers to optimize the multiplier for speed without fear of using too much die space.

In another embodiment, speed may be increased by configuring the multiplier to perform fast rounding and normalization. This may be accomplished configuring the multiplier to calculate two version of an operand, e.g., an overflow version and a non-overflow version, in parallel.

In other embodiments, the multiplier may be further optimized to perform certain calculations such as evaluating constant powers of an operand (e.g., reciprocal or reciprocal square root operations). Iterative formulas may be used to recast these operations into multiplication operations. Iterative formulas generate intermediate products which are used in subsequent iterations to achieve greater accuracy. In some embodiments, the multiplier may be configured to store these intermediate products for future iterations. Advantageously, some embodiments of the multiplier may be configured to compress these intermediate products before storing them, which may further conserve die space.

In one embodiment, the multiplier may comprise a partial product generator, a selection logic unit, and an adder. The multiplier may also comprise a multiplicand input configured to receive a multiplicand operand (signed or unsigned), a multiplier input configured to receive a multiplier operand (also signed or unsigned), and a sign-in input. The sign-in input is configured to receive a sign-in signal indicative of whether the multiplier is to perform signed or unsigned multiplication. The partial product generator, which is coupled to the multiplicand input, is configured to generate a plurality of partial products based upon the multiplicand operand. The selection logic unit, which is coupled to the partial product generator and the multiplier input, is configured to select a number of partial products from the partial product generator based upon the multiplier operand. The adder, which is coupled to the selection logic unit, is configured to sum the selected partial products to form a final product. The final product, which may be signed or unsigned, may then be output to other parts of the microprocessor.

In addition, the multiplier may further comprise an "effective sign" calculation unit. In one embodiment, the calculation unit may comprise a pair of AND gates, each configured to receive the most significant bit of one operand and the sign-in signal. The output of each AND gate is used as the effective sign for that gate's operand. The effective sign may be appended to each operand for use as the operand's sign during the multiplication process. Advantageously, the effective sign may allow both unsigned operands and signed operands to be multiplied on the same hardware.

A method for operating a multiplier within a microprocessor is also contemplated. In one embodiment, the method comprises receiving a multiplier operand, a multiplicand operand, and a sign-in signal from other functional units within the microprocessor. An effective sign bit for the multiplicand operand is generated from the sign-in signal and the most significant bit of the multiplicand operand. A plurality of partial products may then be calculated from the effective sign bit and the multiplicand operand. Next, a number of the partial products may be selected according to the multiplier operand. The partial products are then summed, and the results are output. In other embodiments, the steps may be performed in parallel or in a different order.

In another embodiment, the multiplier may be capable of multiplying one pair of N-bit operands or two pairs of N/2-bit operands simultaneously. The multiplier may comprise a multiplier input and a multiplicand input, each configured to receive an operand comprising one N-bit value or two N/2-bit values. The multiplier may also comprise a partial product generator coupled to the multiplicand input, wherein the partial product generator is configured to generate a plurality of partial products based upon the value of the multiplicand operand. The multiplier may further comprise a selection logic unit coupled to the partial product generator and the multiplier input. The selection logic unit may be configured to select a plurality of partial products from the partial product generator based upon the value of the multiplier operand. An adder may be coupled to the selection logic unit to receive and sum the selected partial products to form a final product comprising either one 2N-bit value or two N-bit values. The multiplier may receive a vector_in signal indicating whether vector or scalar multiplication is to be formed.

A method for operating a multiplier capable of scalar and vector multiplication is also contemplated. The method may comprise receiving a multiplier operand, a multiplicand operand, and a vector-in signal as inputs from functional units within the microprocessor and then calculating a number of partial products from the multiplicand operand using inverters and shifting logic. Certain partial products may be selected according to the multiplier operand. The selected partial products may then be summed to generate a final product. The final product may be in scalar form if the vector_in signal is unasserted, and in vector form if the vector_in signal is asserted.

In another embodiment, the multiplier may also be configured to calculate vector dot products and may comprise a multiplier input and a multiplicand input, each configured to receive a vector. A partial product generator may be coupled to the multiplicand input and may be configured to generate a plurality of partial products based upon one of the vectors. A first adder may be coupled to receive the partial products and sum them to generate vector component products for each pair of vector components. A second adder may be coupled to the first adder and may be configured to receive and sum the vector component products to form a sum value and a carry value. A third adder may be configured to receive the sum and carry values and one or more vector component products from the first adder. The third adder may be configured to output the sum of the sum and carry values (and any carry bits resulting from the summation of the one or more vector components) as a final result.

In yet another embodiment, the multiplier may be configured to output the results in segments or portions. This may advantageously reduce the amount of interface logic and the number of bus lines needed to support the multiplier. Furthermore, the segments or portions may be rounded. In this embodiment, the multiplier may comprise a multiplier input, a multiplicand input, and a partial product generator. The generator is coupled to the multiplicand input and is configured to generate one or more partial products. An adder, coupled to the partial product generator and the multiplier input, may be configured to receive a number of the partial products. The adder may sum the partial products together with rounding constants to form a plurality of vector component products which are logically divided into portions. One or more of the portions may be rounded.

In another embodiment the multiplier may be configured to round its outputs in a number of different modes. Thus, an apparatus and method for rounding and normalizing results within a multiplier is also contemplated. In one embodiment, the apparatus comprises an adder configured to receive a plurality of redundant-form components. The adder is configured to sum the redundant-form components to generate a first non-redundant-form result. The adder may also be configured to generate a second non-redundant-form result comprising the sum of the redundant-form components plus a constant. Two shifters are configured to receive the results. Both shifters may be controlled by the most significant bits of the results they receive. A multiplexer may be coupled to receive the output from the shifters and select one of them for output based upon the least significant bits in the first non-redundant-form result. By generating more than version of the result (e.g., the result and the result plus a constant) in parallel, rounding may be accomplished in less time than previously required.

A multiplier configured to round and normalize products is also contemplated. In one embodiment, the multiplier may comprise two paths. Each path may comprise one or more adders, each configured to receive a redundant-form product and reduce it to a non-redundant form. The first path does so assuming no overflow will occur, while the second path does so assuming an overflow will occur. A multiplexer may be coupled to the outputs of the two paths, so as to select between the results from the first and second paths.

A method for rounding and normalizing results within a multiplier is also contemplated. In one embodiment, the method comprises multiplying a first operand and a second operand to form a plurality of redundant-form components. A rounding constant is generated and added to the redundant-form component in two different bit positions. The first position assumes an overflow will occur, while the second position assumes no overflow will occur. A particular set of bits are selected for output as the final result from either the first addition or the second addition.

Also contemplated is an apparatus for evaluating a constant power of an operand using a multiplier. In one embodiment, the apparatus comprises an initial estimate generator configured to receive the operand and output an initial estimate of the operand raised to the desired constant power. A multiplier may be coupled to receive the operand and the initial estimate, wherein the multiplier is configured to calculate the product of the initial estimate and the operand. A first plurality of inverters may be coupled to receive, invert, and normalize selected bits from the product to form a first approximation, wherein the first approximation assumes an overflow has occurred in the multiplier. A second plurality of inverters may be coupled to receive, invert, and normalize selected bits from the product to form a second approximation, wherein the second approximation assumes an overflow has not occurred in the multiplier. A multiplexer may be configured to select either the first or second approximations for output.

Also contemplated is a method for evaluating a constant power of an operand using a multiplier. In one embodiment, the method comprises determining an initial estimate of the operand raised to a first constant power. The operand and the initial estimate are then multiplied in the multiplier to form a first product. A normalized first intermediate approximation is calculated by performing a bit-wise inversion on the first product assuming an overflow occurred during the multiplying. A normalized second intermediate approximation is calculated by performing a bit-wise inversion on the first product assuming no overflow occurred during the multiplying. Finally, a set of bits are selected from either the first intermediate approximation or the second intermediate approximation to form a selected approximation that may be output or used in subsequent iterations to achieve a more accurate result.

An apparatus for rounding and normalizing a redundant-form value is also contemplated. In one embodiment, the apparatus may comprise two adders and a multiplexer. The first adder is configured to receive the redundant-form value and add a rounding constant to its guard bit position, thereby forming a first rounded result, wherein the guard bit position is selected assuming no overflow will occur. The second adder is similarly configured and performs the same addition assuming, however, that an overflow will occur. A multiplexer is configured to select either the first rounded result or the second rounded result based upon one or more of the most significant bits from the first and second rounded results. Performing the rounding in parallel may advantageously speed the process by allowing normalization to take place in parallel with the multiplexer's selection.

A method for operating a multiplier that compresses intermediate results is also contemplated. In one embodiment, this method comprises calculating an intermediate product to a predetermined number of bits of accuracy. Next, a signaling bit is selected from the intermediate product. The signaling bit is equal to each of the N most significant bits of the intermediate product. Next, the intermediate product is compressed by replacing the N most significant bits of the intermediate product with the signaling bit. The compressed intermediate product is then stored into a storage register. During the next iteration, the storage register is read to determine the value of the compressed intermediate product. The compressed intermediate product may be expanded to form an expanded intermediate product by padding the compressed intermediate product with copies of the signaling bit.

A multiplier configured to perform iterative calculations and to compress intermediate products is also contemplated. In one embodiment, the multiplier comprises a multiplier input, a multiplicand input, and a partial product generator as described in previous embodiments. The multiplier also comprises a partial product array adder which is configured to receive and add a selected plurality of partial products to form an intermediate product. Compression logic may be coupled to the partial product array adder. The compression logic may comprise a wire shifter configured to replace a predetermined number of bits of the intermediate product with a single signal bit, which represents the information stored in the predetermined number of bits. The signal bit is selected so that it equals the value of each individual bit within the predetermined number of bits. A storage register may be coupled to receive and store the compressed intermediate product from the compression logic.

In another embodiment, the multiplier may be configured to add an adjustment constant to increase the frequency of exactly rounded results. In such an embodiment, the multiplier may comprise a multiplier input configured to receive a multiplier operand, a multiplicand input configured to receive a multiplicand operand, a partial product generator, and selection logic. In one embodiment, the partial product generator is coupled to the multiplicand input and configured to generate one or more partial products based upon the multiplicand operand. The selection logic may be coupled to the partial product generator and the multiplier, wherein the selection logic is configured to select a plurality of partial products based upon the multiplier. The partial product array adder may be coupled to the selection logic, wherein the adder is configured to receive and sum a number of the partial products and an adjustment constant to form a product. The adjustment constant is selected to increase the frequency that the result is exactly rounded.

A method for increasing the frequency of exactly rounded results is also contemplated. In one embodiment, the method comprises receiving an operand and determining an initial estimate of the result of an iterative calculation using the operand. The initial estimate and the operand are multiplied to generate an intermediate result. The multiplication is repeated a predetermined number of times, wherein the intermediate result is used in place of the initial estimate in subsequent iterations. The final repetition generates a final result, and an adjustment constant may be added to the final result, wherein the adjustment constant increases the probability that the final result will equal the exactly rounded result of the iterative calculation.

BRIEF DESCRIPTION OF THE DRAWINGS

Other objects and advantages of the invention will become apparent upon reading the following detailed description and upon reference to the accompanying drawings in which:

FIG. 1 is a diagram illustrating an exemplary scalar multiplication and an exemplary vector multiplication.

FIG. 5A illustrates one embodiment of the shift-and-add algorithm for binary multiplication.

FIG. 5B illustrates one embodiment of Booth's algorithm for binary multiplication.

FIG. 22 is a diagram illustrating a numerical example of the operation of the multiplier from FIG. 19.

FIG. 32 is a figure illustrating one embodiment of a multiplier configured to achieve a higher frequency of exactly rounded results.

Figure 2:
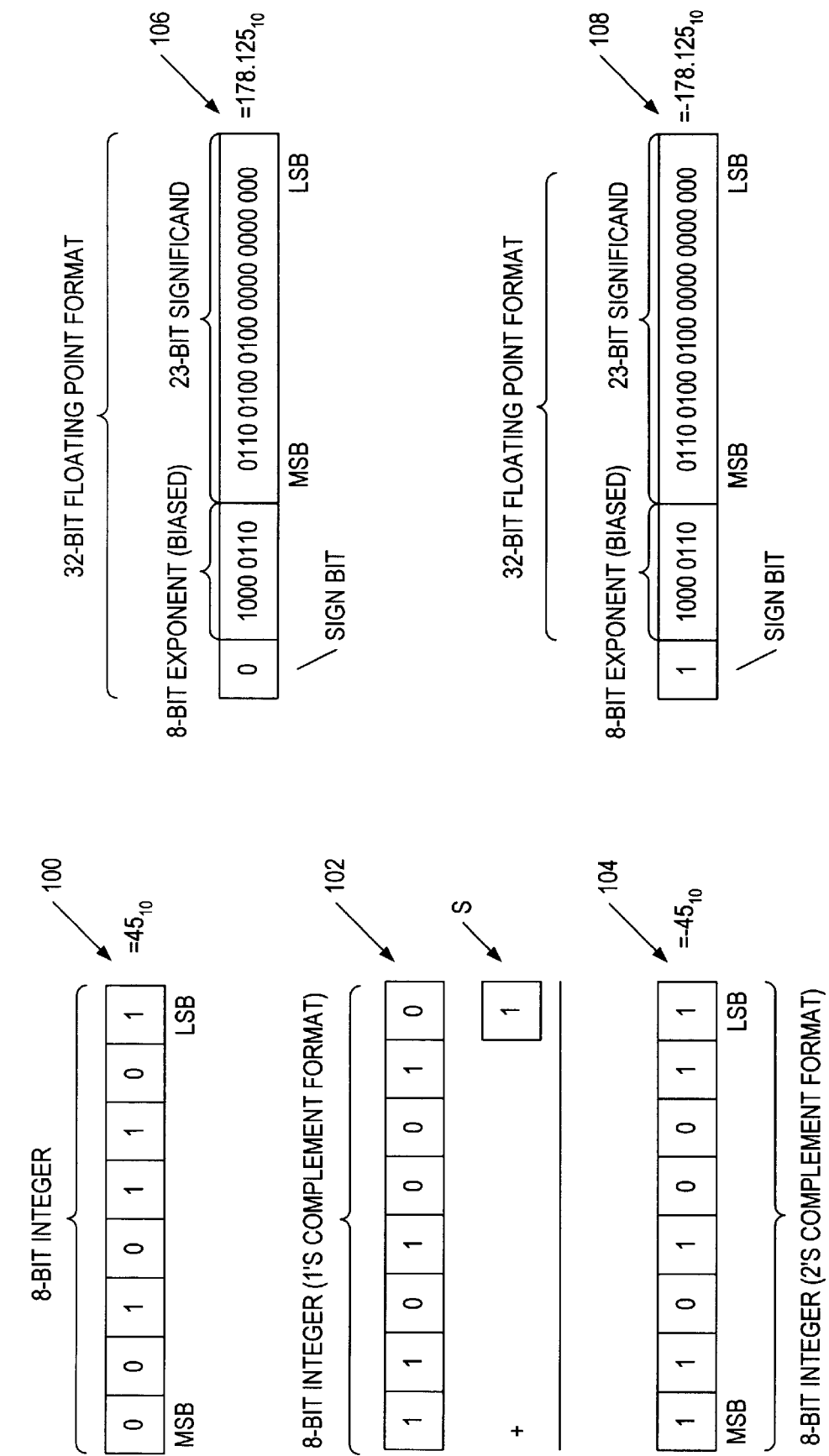
FIG. 2A is a diagram of an exemplary integer data format using two's complement representation.
FIG. 2B is a diagram of an exemplary floating point data format.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims.

DETAILED DESCRIPTION OF AN EMBODIMENT

Figure 3:
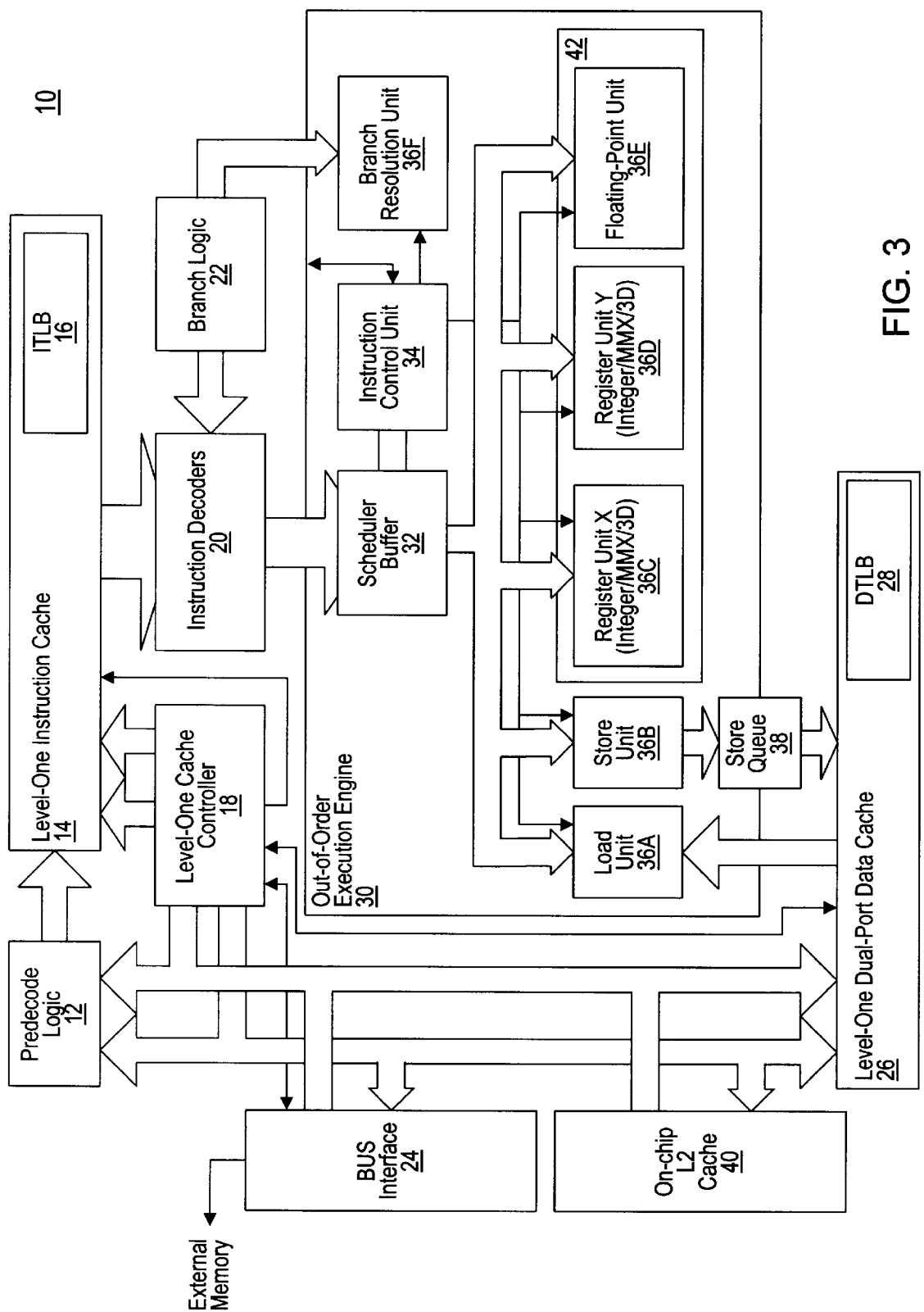
FIG. 3 is a block diagram of one embodiment of an exemplary microprocessor.

Turning now to FIG. 3, a block diagram of one embodiment of a microprocessor 10 is shown. As depicted, microprocessor 10 comprises a predecode logic block 12, a bus interface unit 24, and a level one-cache controller 18, all of which are coupled to the following three caches: a level-one instruction cache 14, a level-one data cache 26, and an on-chip level-two cache 40. Both instruction cache 14 and data cache 26 are configured with translation lookaside buffers, i.e., TLBs 16 and 28, respectively. Microprocessor 10 further comprises a decode unit 20 which receives instructions from instruction cache 14, decodes them, and then forwards them to an execution engine 30 in accordance with inputs received from a branch logic unit 22.

Execution engine 30 comprises a scheduler buffer 32, an instruction control unit 34, and a plurality of execution units 36A–36F. Note that blocks referred to herein with a reference number followed by a letter may be collectively referred to by the reference number alone. For example, execution units 36A–F may be collectively referred to as execution units 36. Scheduler buffer 32 is coupled to receive decoded instructions from decode unit 20 and convey them to execution units 36 in accordance with input received from instruction control unit 34. In one embodiment, execution units 36A–F include a load unit 36A, a store unit 36B, two integer/MMX/3D units 36C and 36D, a floating point unit 36E, and a branch resolving unit 36F. Load unit 36A receives input from data cache 26, while store unit 36B interfaces with data cache 26 via a store queue 38. Integer/MMX/3D units 36C and 36D, and floating point unit 36E collectively form a computational core 42 for microprocessor 10. Computational core 42 may further comprise other execution units and specialized hardware such as multipliers.

Before describing computational core 42 in detail, other features of microprocessor 10 will be discussed. In one embodiment, instruction cache 14 is organized into sectors, with each sector including two 32-byte cache lines. The two cache lines within each sector share a common tag but have separate state bits that indicate the status of the line. Accordingly, two forms of cache misses (and associated cache fills) may take place: (1) sector replacement and (2) cache line replacement. In the case of sector replacement, the cache miss is caused by a tag mismatch in instruction cache 14. Thus the required cache line is supplied by external memory via bus interface unit 24. The cache line within the sector that is not needed is then marked invalid. In the case of a cache line replacement, a tag matches the requested address but the corresponding cache line is marked as invalid. The required cache line is then supplied by external memory, but unlike a sector replacement, the cache line within the sector that was not requested remains unaltered. In alternate embodiments, other organizations and replacement policies for instruction cache 14 may be utilized.

In one embodiment, microprocessor 10 may be configured to perform prefetching only in the case of sector replacements. During sector replacement, the required cache line is filled. If the required cache line is in the first half of the sector, the other cache line in the sector is prefetched. If the required cache line is in the second half of the sector, no prefetching is performed. Other prefetching methodologies may also be employed in different embodiments of microprocessor 10.

When cache lines of instruction data are retrieved from external memory by bus interface unit 24, the data is conveyed to predecode logic block 12. In one embodiment, the instructions processed by microprocessor 10 and stored in cache 14 are variable-length (e.g., the x86 instruction set). Because decoding variable-length instructions is particularly complex, predecode logic 12 may be configured to provide additional information to be stored in instruction cache 14 to aid during decode. In one embodiment, predecode logic 12 generates "predecode bits" for each byte in instruction cache 14. The predecode bits may provide various information useful during the decode process, e.g., the number of bytes to the start of the next variable-length instruction. The predecode bits are passed to decode unit 20 when instruction bytes are requested from cache 14.

In one embodiment, instruction cache 14 is implemented as a 32-Kbyte, two-way set-associative, writeback cache. The cache line size may be 32 bytes in this embodiment. Cache 14 also includes a 64-entry TLB that may be used to speed linear to physical address translation. Other variations of instruction cache 14 are possible and contemplated.

Instruction cache 14 receives instruction fetch addresses from cache controller 18. In one embodiment, up to 16 bytes may be fetched from cache 14 per clock cycle. The fetched information is placed into an instruction buffer that feeds into decode unit 20. In one embodiment of microprocessor 10, fetching may occur along a single execution stream with seven outstanding branches taken. In another embodiment, fetching may take place along multiple execution streams.

In one embodiment, the instruction fetch logic within cache controller 18 is capable of retrieving any 16 contiguous instruction bytes within a 32-byte boundary of cache 14 with no additional penalty when the 16 bytes cross a cache line boundary. New instructions are loaded into the instruction buffer as the current instructions are consumed by decode unit 20. Other configurations of cache controller 18 are also possible and contemplated.

In one embodiment, decode logic 20 may be configured to decode multiple instructions per processor clock cycle. Decode unit 20 may further be configured to accept instruction and predecode bytes from the instruction buffer (in x86 format), locate actual instruction boundaries, and generates corresponding "RISC ops". RISC ops are fixed-format internal instructions, most of which are executable by microprocessor 10 in a single clock cycle. In one embodiment of microprocessor 10, RISC ops are combined to form every function in the x86 instruction set. Microprocessor 10 may use a combination of decoders to convert x86 instructions into RISC ops. In one embodiment, the hardware comprises three sets of decoders: two parallel short decoders, one long decoder, and one vector decoder. The parallel short decoders translate the most commonly-used x86 instructions (e.g., moves, shifts, branches, etc.) into zero, one, or two RISC ops each. The short decoders only operate on x86 instructions that are up to seven bytes long. In addition, they are configured to decode up to two x86 instructions per clock cycle. Commonly-used x86 instructions which are greater than seven bytes long, as well as those semi-commonly-used instructions that are up to seven bytes long, are handled by the long decoder.

The long decoder in decode unit 20 only performs one decode per clock cycle generating up to four RISC ops. All other translations (complex instructions, interrupts, etc.) are handled by a combination of the vector decoder and an on-chip ROM. For complex operations, the vector decoder logic provides the first set of RISC ops and an initial address to a sequence of further RISC ops within the on-chip ROM. The RISC ops fetched from the on-chip ROM are of the same type that are generated by the hardware decoders.

In one embodiment, decode unit 20 generates a group of four RISC ops each clock cycle. For clock cycles in which four RISC ops cannot be generated, decode unit 20 places RISC NOP operations in the remaining slots of the grouping. These groupings of RISC ops (and possible NOPs) are then conveyed to scheduler buffer 32. It is noted that in other embodiments, microprocessor 10 may be configured to decode other instructions sets in place of, or in addition to, the x86 instruction set.

Instruction control logic 34 contains the logic necessary to manage out-of-order execution of instructions stored in scheduler buffer 32. Instruction control logic 34 also manages data forwarding, register renaming, simultaneous issue and retirement of RISC ops, and speculative execution. In one embodiment, scheduler buffer 32 holds up to 24 RISC ops at one time, which is equivalent to a maximum of twelve x86 instructions. When possible, instruction control logic 34 may simultaneously issue (from buffer 32) RISC ops to any available execution units 36. In one embodiment, control logic 34 may be configured to issue up to six and retire up to four RISC ops per clock cycle.

In one embodiment, store unit 36A and load unit 36B may each have two-stage pipelines. Store unit 36A may be configured to perform memory and register writes such that the data is available for loading after one clock cycle. Similarly, load unit 36B may be configured to perform memory reads such that the data is available after two clock cycles. Other configurations for load and store units 36A and 36B are also possible with varying latencies.

Execution unit 36G (the branch resolving unit) is separate from branch prediction logic 22 in that it resolves conditional branches such as JCC and LOOP after the branch condition has been evaluated. Branch resolving unit 36G allows efficient speculative execution, enabling microprocessor 10 to execute instructions beyond conditional branches before knowing whether the branch prediction was correct. As described above, microprocessor 10 may be configured to handle up to seven outstanding branches in one embodiment.

Branch prediction logic 22, coupled to decode unit 20, is configured to increase the accuracy with which conditional branches are predicted in microprocessor 10. Ten to twenty percent of the instructions in typical applications include conditional branches. Branch prediction logic 22 is configured to handle this type of program behavior and its negative effects on instruction execution, such as stalls due to delayed instruction fetching. In one embodiment, branch prediction logic 22 includes an 8192-entry branch history table, a 16-entry by 16 byte branch target cache, and a 16-entry return address stack. Branch prediction logic 22 may implement a two-level adaptive history algorithm using the branch history table. The table stores executed branch information, predicts individual branches, and predicts behavior of groups of branches. In one embodiment, the branch history table does not store predicted target addresses in order to save space. Instead, the addresses are calculated on-the-fly during the decode stage.

To avoid a clock cycle penalty for a cache fetch when a branch is predicted taken, a branch target cache within branch logic 22 supplies the first 16 bytes at that address directly to the instruction buffer (assuming a hit occurs in the branch target cache). In one embodiment, branch prediction logic 22 achieves branch prediction rates of over 95%.

Branch logic 22 may also include special circuitry designed to optimize the CALL and RET instructions. This circuitry allows the address of the next instruction following the CALL instruction in memory to be pushed onto a return address stack. When microprocessor 10 encounters a RET instruction, branch logic 22 pops this address from the return stack and begins fetching.

Like instruction cache 14, data cache 26 may also be organized as two-way set associative 32-Kbyte storage. In one embodiment, data TLB 28 includes 128 entries that may be used to translate linear to physical addresses. Like instruction cache 14, data cache 26 may also be sectored. Data cache 26 may further implement a MESI (modified-exclusive-shared-invalid) protocol to track cache line status. Other configurations of data cache 26 are also possible and are contemplated.

Computational Core

Figure 4:
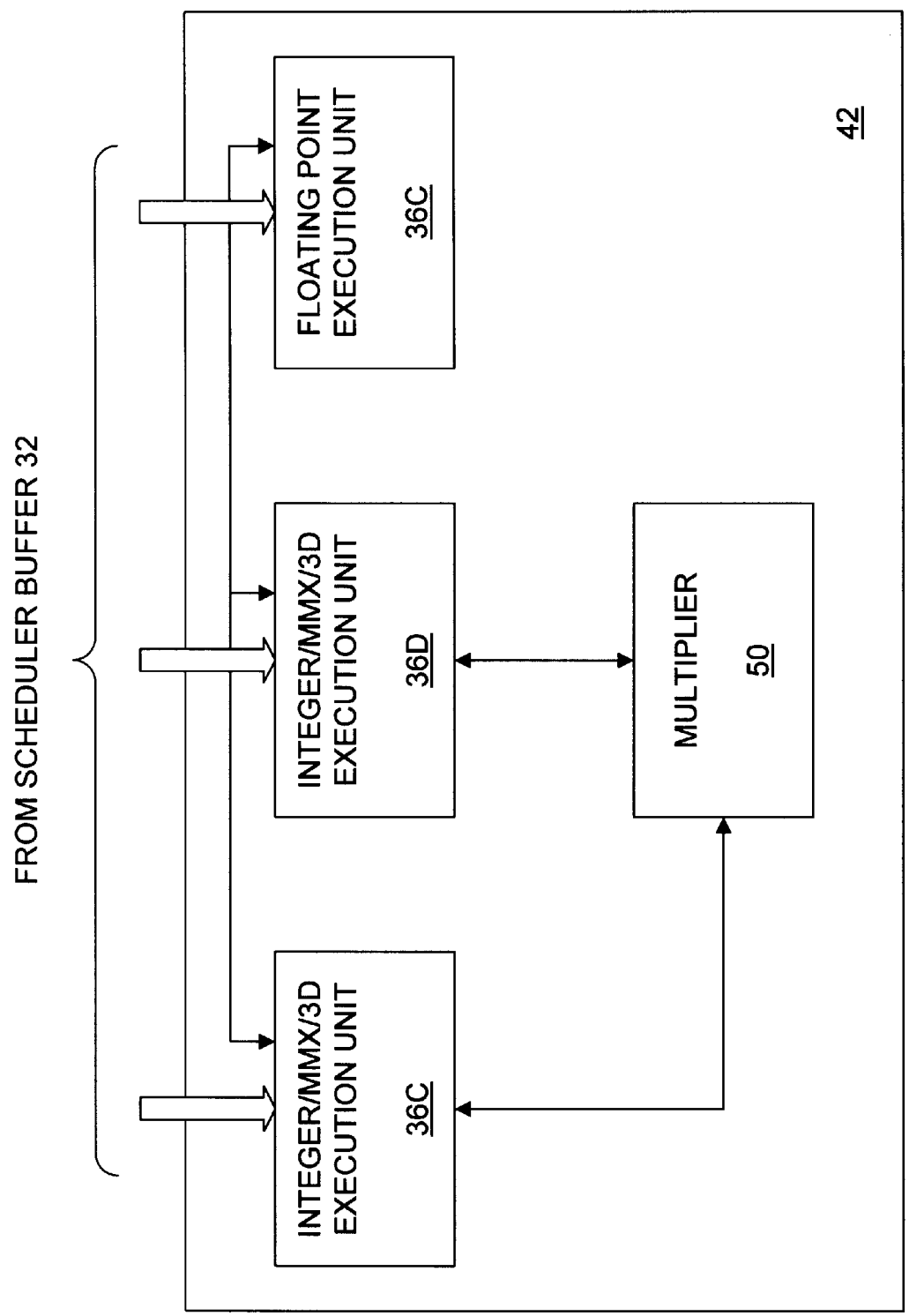
FIG. 4 is a block diagram of one embodiment of the computational core from the microprocessor of FIG. 3.

Turning now to FIG. 4, more detail of one embodiment of computation core 42 is shown. In one embodiment, computation core 42 comprises three execution units 36C–E and a multiplier 50. Integer/MMX/3D execution unit 36C is a fixed point execution unit which is configured to operate on all ALU operations, as well as multiplies, divides (both signed and unsigned), shifts, and rotates. In contrast, integer/MMX/3D execution unit 36E (Integer Y unit) is a fixed point execution unit configured to operate only on the basic word and doubleword ALU operations (ADD, AND, CMP, etc.).

Execution units 36C and 36D are also configured to accelerate performance of software written using multimedia and 3D graphics instructions. Applications that can take advantage of multimedia and 3D graphics instructions include 3D modeling and rendering, video and audio compression/decompression, speech recognition, and telephony. Execution units 36C and 36D may be configured to execute multimedia instructions in a single clock cycle. Many of these instructions are designed to perform the same operation to multiple sets of data at once (i.e., vector processing). In one embodiment, execution units 36C and 36D use registers which are mapped onto the stack of floating point unit 36E.

Execution unit 36E contains an IEEE 754-compatible floating point unit designed to accelerate the performance of software which utilizes the x86 instruction set. Floating point software is typically written to manipulate numbers that are either very large or small, require a great deal of precision, or result from complex mathematical operations such as transcendentals. Floating point execution unit 36E may comprise an adder unit, a multiply unit, and a divide/square root unit. In one embodiment, these low-latency units are configured to execute floating point instructions in as few as two clock cycles.

In one embodiment, execution units 36C and 36D are coupled to multiplier 50 and are configured to utilize multiplier 50 as a shared resource. Advantageously, this configuration allows both execution units 36C and 36D to perform multiplication without requiring two multipliers. In another configuration, each execution unit 36C and 36D may each have their own dedicated multiplier. Still other configurations are possible and contemplated. For example, two n-bit multipliers may be shared by execution units 36C and 36D. Configuring microprocessor 10 with two multipliers each having a width of 32-bits advantageously allows two single precision multiplications to be executed in parallel (each operand/significand is 24 bits wide), or one MMX packed multiply (i.e., multiplying a pair of vectors wherein each vector comprises four 16-bit components). In another embodiment, multiplier 50 may be configured to accept operands that are 76-bits wide (i.e., the width of the significand in a double precision floating point data type), thereby providing the same functionality as two separate 32-bit multipliers while further alleviating the need for a separate multiplier in floating point unit 36E. In such an embodiment, execution units 36C–36E may be directly coupled to multiplier 50, with each execution unit sharing multiplier 50.

Multiplier 50 may also be configured to perform both signed and unsigned multiplication. Advantageously, this allows multiplier 50 to support both integer multiplication for MMX instructions, and floating point multiplication for 3D graphics instructions.

While multiplier 50 may be configured to perform multiplication using a number of different algorithms, the embodiment shown in the figure is configured to use a modified version of Booth's Algorithm to improve multiplication times. Booth's algorithm relies upon calculating a number of partial products and then summing them to obtain a final product. Booth's algorithm is able to improve multiplication times over the standard "add-and-shift" algorithm by reducing the number of partial products that need to be summed in order to obtain the final product. For example, in performing an 8-bit by 8-bit multiplication, the shift-and-add algorithm generates eight partial products. By contrast, same 8-bit by 8-bit multiplication using the 2-bit version of Booth's algorithm generates only five partial products. This reduction in the number of partial products is illustrated in FIGS. 5A and 5B.

Figure 6:
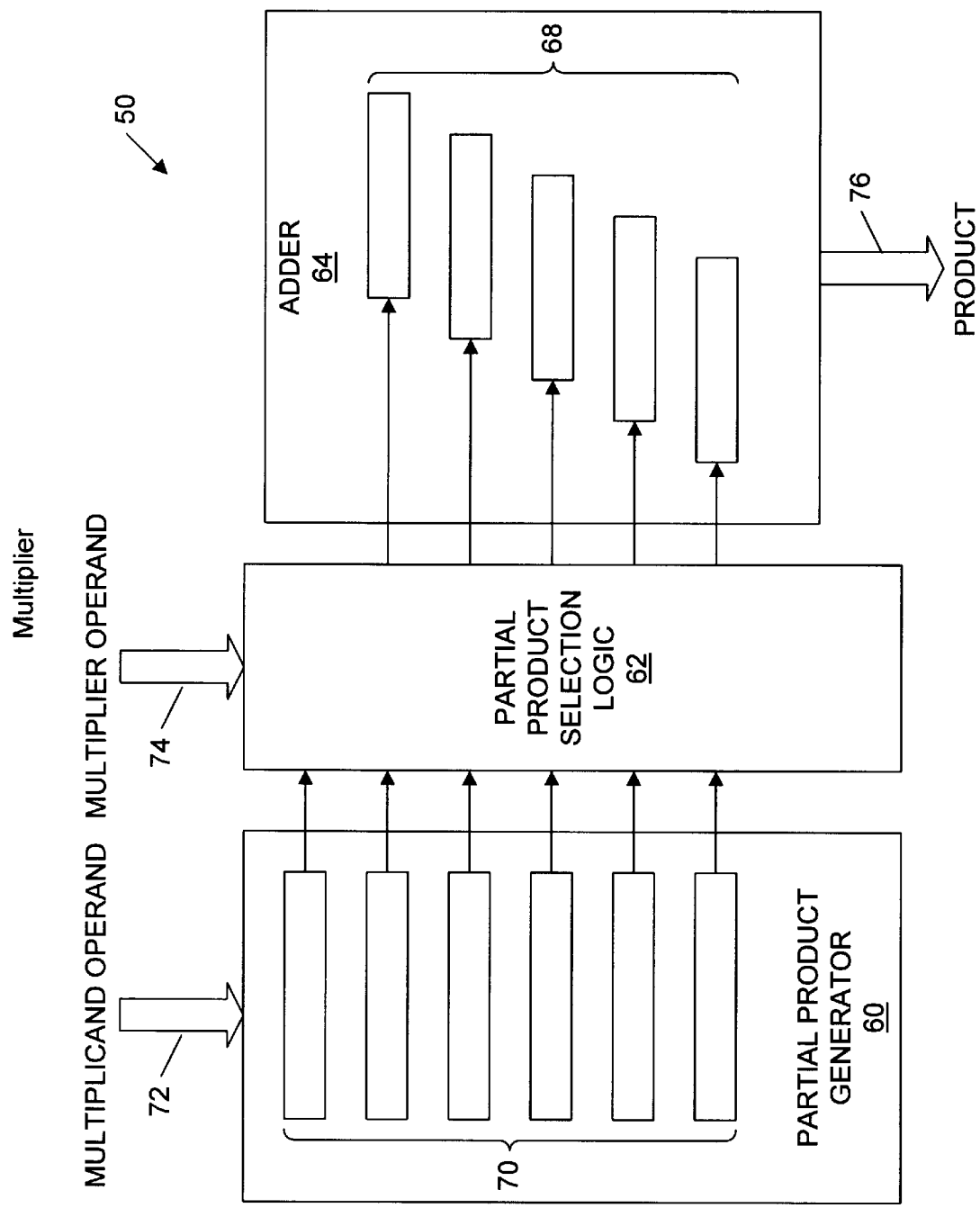
FIG. 6 is a block diagram illustrating details of one embodiment of the multiplier from FIG. 4.

Turning now to FIG. 6, more detail of one embodiment of multiplier 50 is shown. In this embodiment, multiplier 50 comprises a partial product generator 60, a partial product selection logic unit 62, and an adder 64. As shown in the figure, partial product generator 60 is coupled to selection logic unit 62, which is in turn coupled to adder 64. When one of execution units 36C–36E receives an instruction invoking the multiplication function, the execution unit conveys two operands to multiplier 50, i.e., a multiplicand operand 72 and a multiplier operand 74. Partial product generator 60 is coupled to receive multiplicand operand 72, which is used as a starting value for calculating a plurality of partial products 70. For example, if partial product generator 60 is configured to use the 2-bit version of Booth's algorithm, the following partial products would be generated: the multiplicand itself ("+M"), a shifted version of the multiplicand ("+2M"), an inverted version of the multiplicand ("−M"), a shifted and inverted version of the multiplicand ("−2M"), and two constants, i.e., a positive zero ("+0") and a negative zero ("−0") in two's complement form.

Partial product selection unit 62 is coupled to receive multiplier operand 74. Selection unit 62 is configured to select a number of partial products from generator 60 based upon particular fields within multiplier operand 74. For example, using the 2-bit version of Booth's algorithm, multiplier operand 74 is padded with leading and trailing zeros (assuming an unsigned multiplication is being performed), and then one partial product is selected by each 3-bit field within the operand.

Finally, adder 64 is configured to receive and sum the partial products selected by selection unit 62. As noted in the figure, the selected partial products 68 are shifted before they are summed. The resulting final product 76 is output to the execution unit that transmitted the operands. As previously noted, multiplier 50 may advantageously be configured to perform both signed and unsigned multiplication. This is described in greater detail below.

Scalar Unsigned Multiplication

Figure 7:
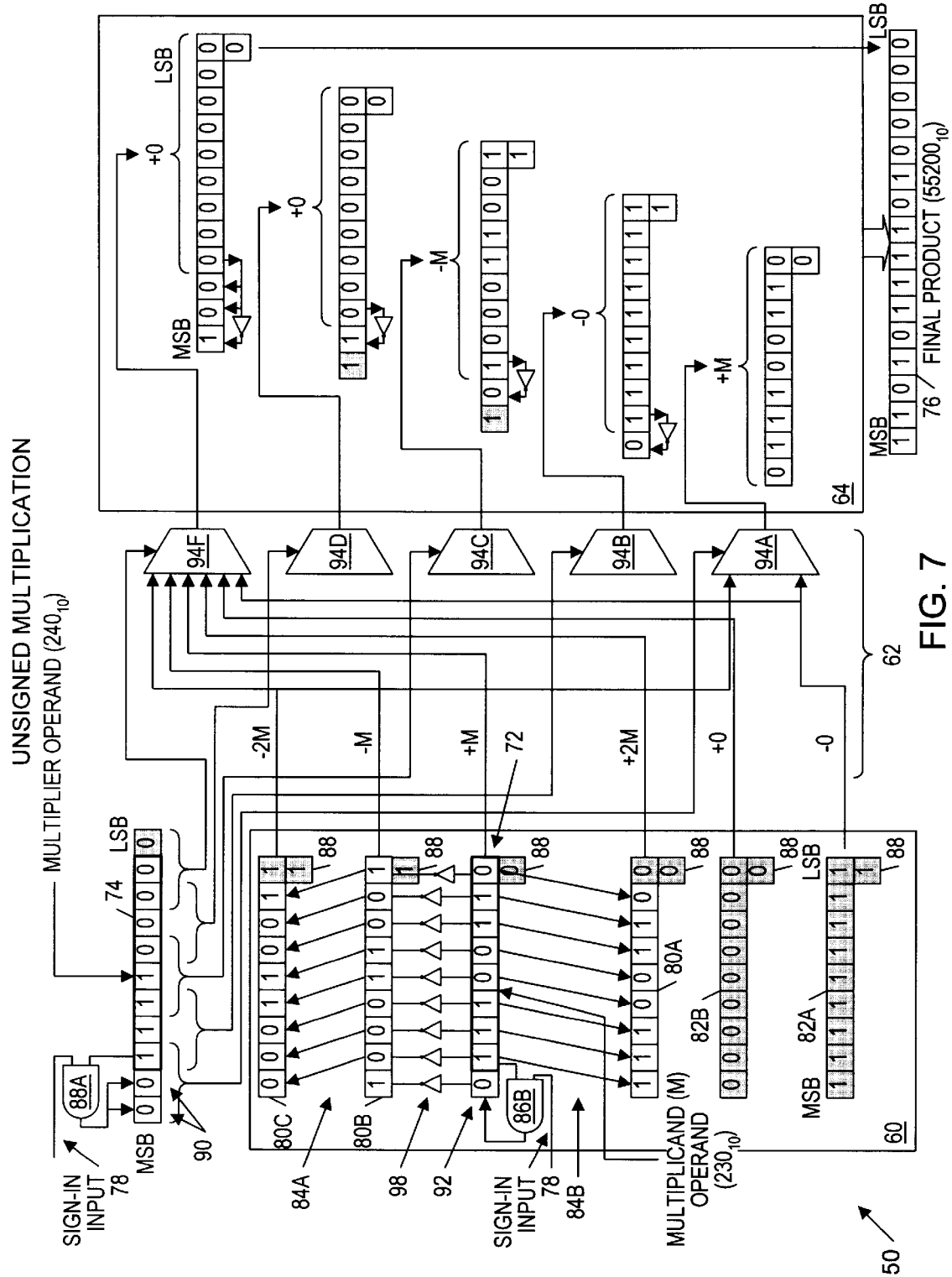
FIG. 7 is a block diagram illustrating the operation of the multiplier from FIG. 6 for unsigned operands.

Turning now to FIG. 7, details of one embodiment of multiplier 50 are shown. The figure also illustrates the operation of multiplier 50 for an unsigned multiplication. While the figure shows an 8-bit by 8-bit multiplier using the 2-bit version of Booth's algorithm, other configurations are possible and contemplated, e.g., a 32-bit by 32-bit multiplier using a 3-bit version of Booth's algorithm. In this embodiment, multiplier 50 further comprises a "sign-in" input 78, which indicates whether a signed or unsigned multiplication is to be performed. Sign-in input 78 is coupled to AND gate 86A, which also receives the most significant bit ("MSB") of multiplier operand 74. AND gate 86A outputs an "effective sign" bit 90 for multiplier operand 74 which is copied and appended to multiplier operand 74 for use by selection logic unit 62. Sign-in input 78 is also routed to AND gate 88B, which similarly calculates and appends an effective sign bit 92 for multiplicand operand 72. While other effective sign calculation logic may be used, the configuration illustrated advantageously generates an effective sign of zero for all unsigned operands and positive signed operands using a minimum amount of logic. Furthermore, in the embodiment shown only signed negative operands receive an asserted effective sign bit.

Partial product generation logic 60 uses multiplicand operand 72 and effective sign bit 92 to generate a number of partial products 80A–80C. For example, a shifted version 80A of multiplicand operand 72 is generated by shifting logic 84B. Shifted version 80A is equivalent to two times the multiplicand operand (+2M). Similarly, inverters 98 generate an inverted (i.e., one's complement) version (−M) of multiplicand operand 72. Shifting logic 84A is used to generate a shifted and inverted version 80C (−2M) of multiplicand operand 72. Partial product generation logic 60 also generates constants for use as partial products, e.g., positive zero 82B (+0) and negative zero 82A (−0). As illustrated in the figure, each partial product 80A, 80B, 80C, 72, 82A, and 82B may have an extra constant bit 88 associated with it. Extra constant bit 88 is asserted only for negative partial products, i.e., −M, −2M, and −0, and is added to the partial product within adder 64 to generate two's complement versions of the inverted partial products. The shaded areas of the figure denote constants that may be designed into multiplier 50.

Once partial product generator 60 has generated the partial products, selection logic 62 is configured to select partial products based upon 3-bit fields from multiplier operand 74. Multiplier operand 74 is padded with zeros and copies of effective sign bit 90 so that there are no fractional 3-bit fields. Selection logic 62 may comprise a number of multiplexers 94A–94F, one for each partial product to be selected. Each multiplexer 94A–94E is controlled by a different 3-bit field from multiplier operand 74. The 3-bit fields determine which partial product from those generated by partial product generator 60, i.e., +M, +2M, −M, −2M, +0, −0, will be selected. The selected partial products are then conveyed to adder 64. Using 2-bit Booth decoding, Table 1 describes how partial products will be selected.

TABLE 1

| 3-bit Multiplier Field Value | Partial Product Selected |
| --- | --- |
| 000 | +0 |
| 001 | +M |
| 010 | +M |
| 011 | +2M |

TABLE 1-continued

| 3-bit Multiplier Field Value | Partial Product Selected |
|---|---|
| 100 | −2M |
| 101 | −M |
| 110 | −M |
| 111 | −0 |

Adder 64 is configured to receive and sum the selected partial products. As illustrated in the figure, the partial products are shifted before being summed. Some of the partial products may have prefix bits added to eliminate the need for sign extending the partial product's most significant bit (i.e., sign bit) to the maximum width of final product 76. The prefixes may be generated using simple inverters coupled to the partial product's most significant bit and constants. Once the partial products are shifted, padded, and summed, final product 76 is output and conveyed to the execution unit that provided the operands. Adder 64 may use a number of different algorithms for summing the partial products. For example, adder 64 may configured as a carry look-ahead adder, a carry skip adder, a carry select adder, a carry-save adder, or a carry propagate adder.

The exemplary values in the figure illustrate the unsigned multiplication of two values, $240_{10}$ and $230_{10}$. Sign-in input 78 is unasserted because unsigned multiplication to be performed. Sign-in input 78 may be provided by the same execution unit that provided the operands. The execution unit may generate sign-in input bit 78 based upon the type of multiply instruction it received. In the example shown in the figure, effective signs 90 and 92 are both zero because sign-in input 78 is unasserted. As shown in the illustration, an 8-bit by 8-bit version of multiplier 50 is able to multiply 8-bit unsigned operands (i.e., operands that do not have a sign bit) having values from 0 to 255 to obtain a 16-bit unsigned result.

Scalar Signed Multiplication

Figure 8:
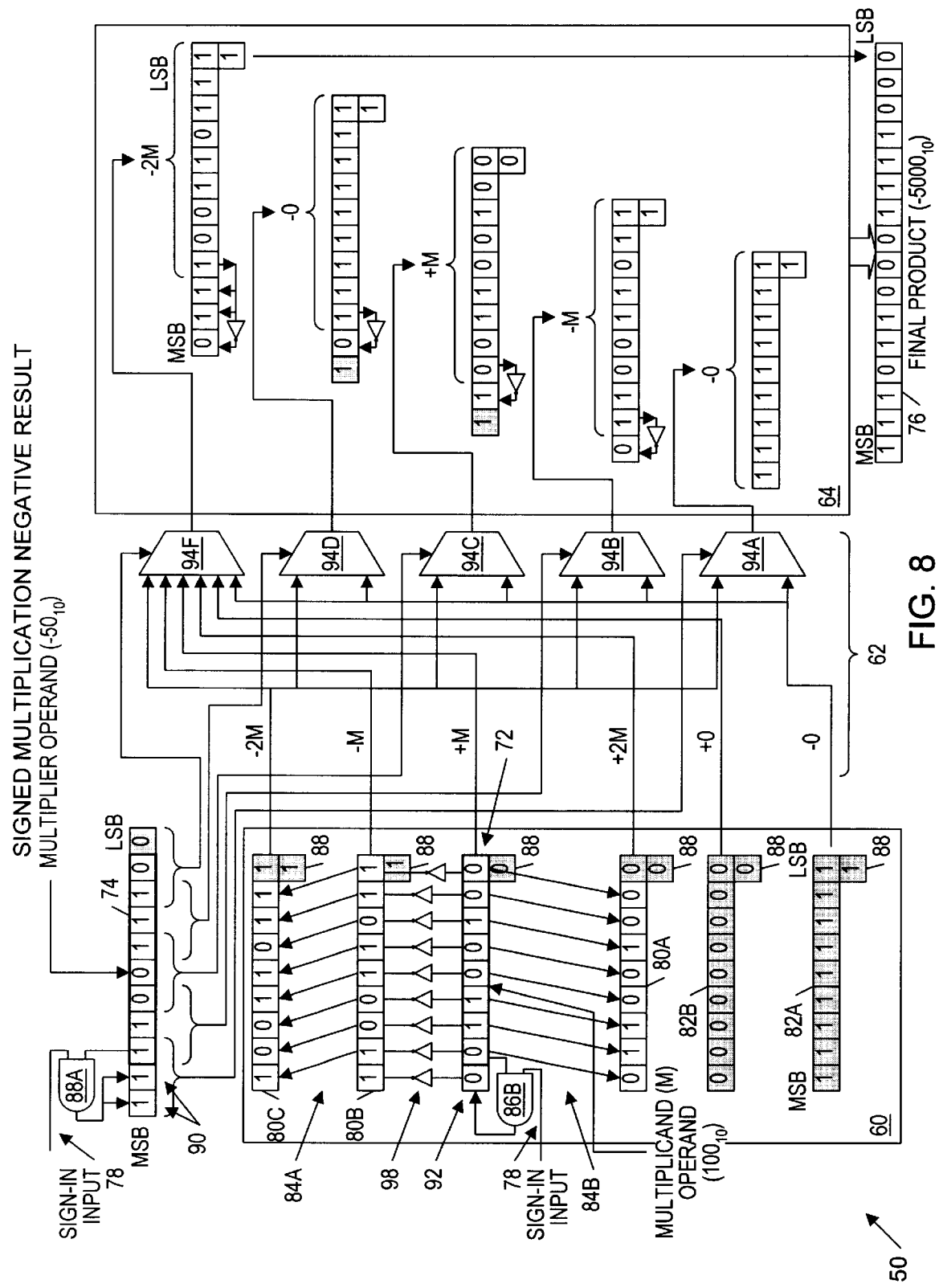
FIG. 8 is a block diagram illustrating an example of the operation of the multiplier from FIG. 6 for signed operands.

Turning now to FIG. 8, the same 8-bit by 8-bit version of multiplier 50 is shown. In this figure, however, multiplier 50 is performing signed multiplication. Sign-in input 78 is asserted because signed multiplication is to be performed. In the example illustrated, multiplicand operand 72 equals $100_{10}$, while multiplier operand 74 equals $-50_{10}$. Multiplier operand 74 is received in two's complement format because it is a negative signed value. Thus its effective sign bit 90 (as calculated by AND gate 88A) is asserted. In contrast, effective sign bit 92 for multiplicand operand 72 is unasserted because multiplicand operand 72 is positive. The final product 76 is a negative 16-bit number ($-5000_{10}$) represented in two's complement format with the MSB indicating the sign.

Figure 9:
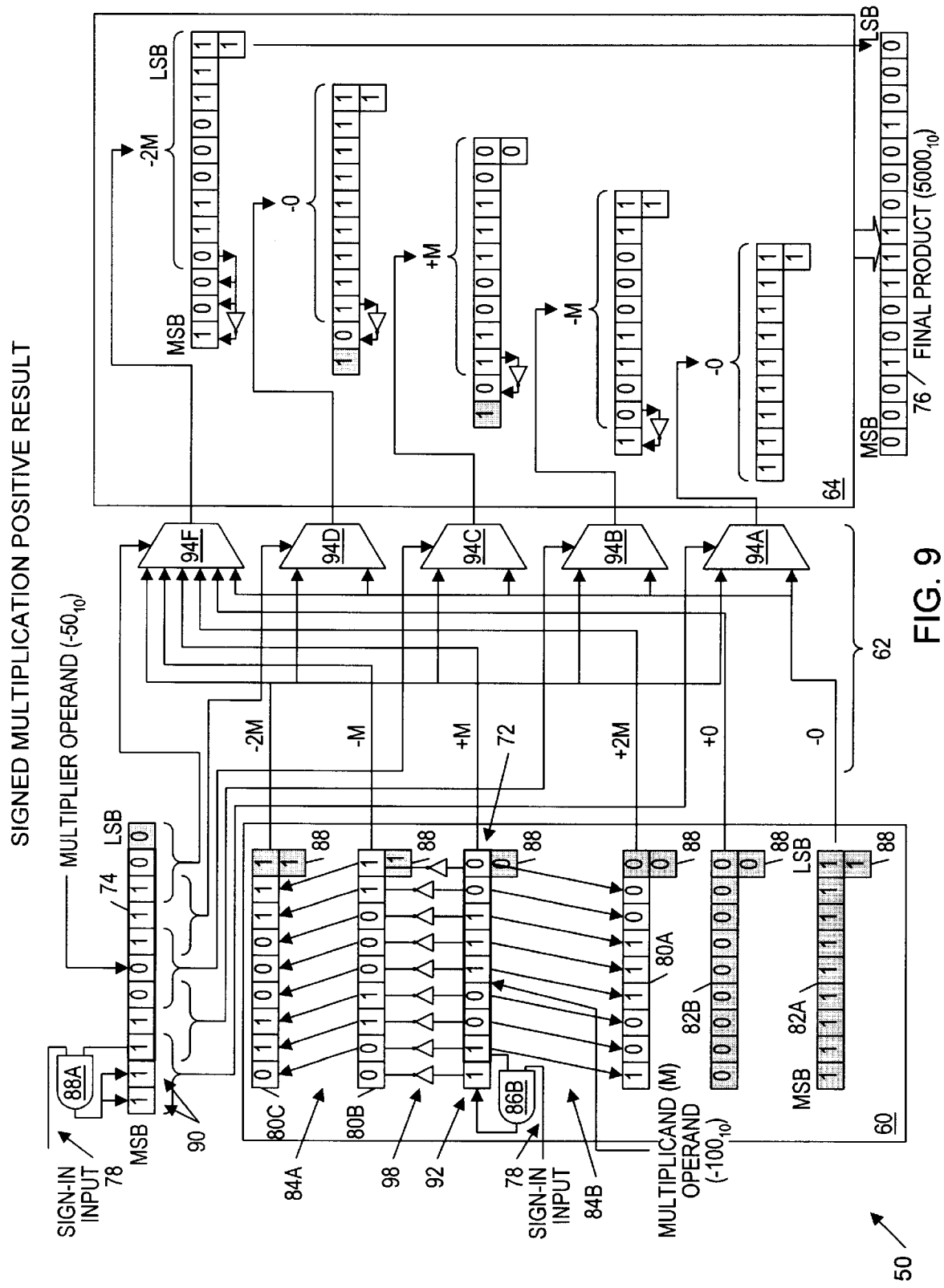
FIG. 9 is a block diagram illustrating another example of the operation of the multiplier from FIG. 6 for signed operands.

Turning now to FIG. 9, another example of multiplier 50 performing a signed multiplication is shown. In this example, however, both multiplier operand 74 (having a value of $-50_{10}$) and multiplicand operand 72 (having a value of $-100_{10}$) are received in two's complement format. The multiplication results in a signed final product 76 (having a value of $5000_{10}$) that is positive. As FIGS. 6–8 illustrate, multiplier 50 may advantageously perform both signed and unsigned multiplication with the same hardware. Furthermore, multiplier 50 may advantageously be configured to use Booth's algorithm to further increase multiplication performance.

Component-wise Vector Multiplication

Figure 10:
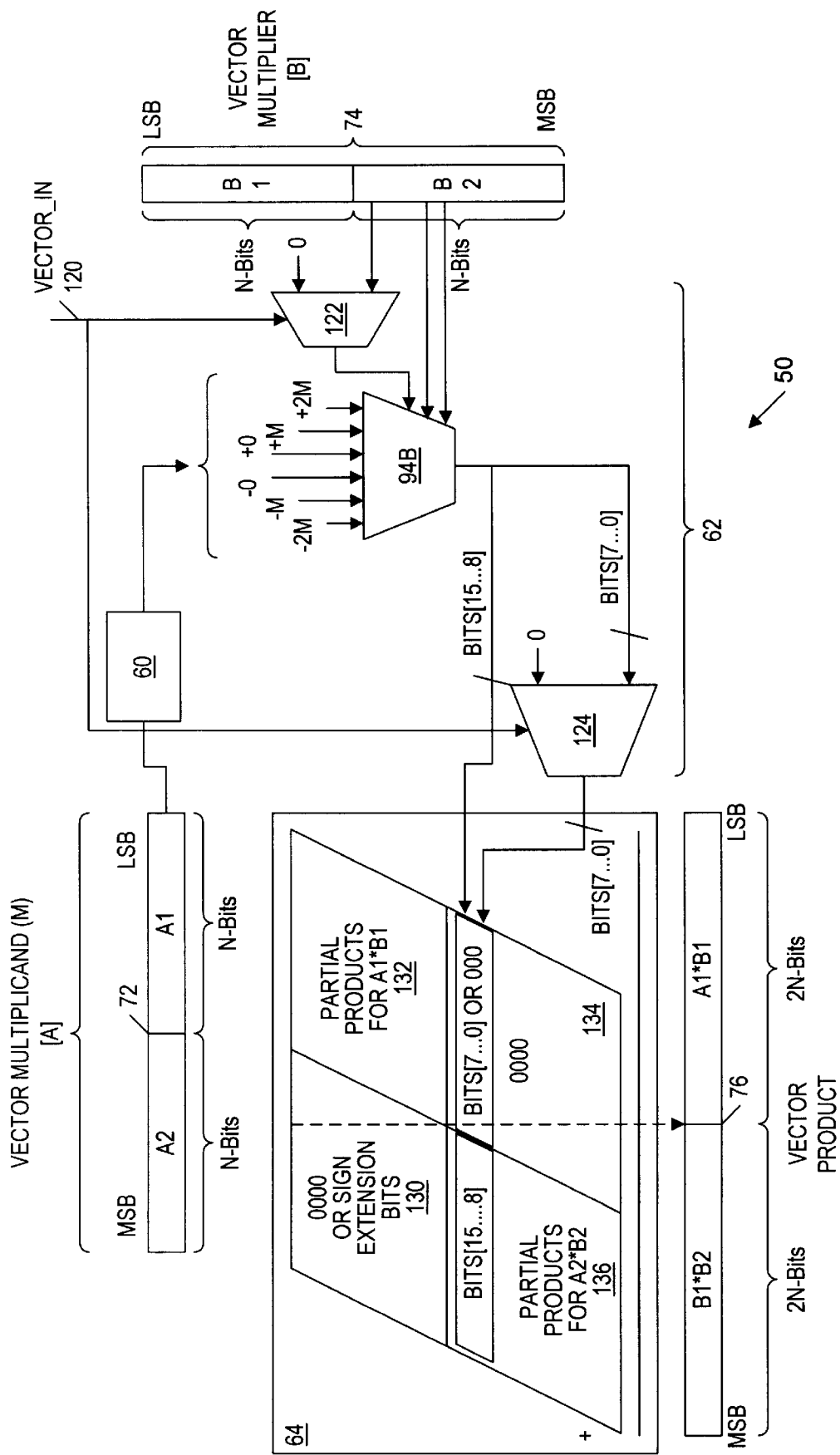
FIG. 10 is a diagram illustrating one embodiment of the multiplier from FIG. 4 that is configured to perform vector multiplication.

As previously noted, recent advances have placed a greater emphasis on microprocessors' multimedia and graphics performance. Multimedia and 3D extensions to the basic x86 instruction set include vectored multiply instructions to improve performance. Turning now to FIG. 10, an embodiment of multiplier 50 capable of performing vector multiplication is shown. As in previous embodiments, multiplier 50 comprises partial product generator 60, selection logic 62, and adder 64. This embodiment of multiplier 50 is configured to perform component-wise vector multiplication of two pairs of N-bit values (A1×B1 and A2×B2) simultaneously or a scalar multiplication of one pair of 2N-bit values (A×B). Advantageously, multiplier 50 may take the place of three separate multipliers (i.e., one for scalar multiplication and two for the vector multiplication), thereby saving valuable die space.

In this embodiment, multiplier 50 has several features which allow it to perform both scalar and component-wise vector multiplication. When scalar multiplication is performed, multiplier 50 functions as previously disclosed, i.e., adder 64 will sum the partial products selected by selection logic 62 from partial product generator 60 to form final product 76. When performing component-wise vector multiplication, however, multiplier 50 is configured to effectively operate as two separate multipliers. This behavior ensures that the results generated by multiplier 50 will equal the results that would have been generated had two separate multipliers been used. To indicate whether multiplier 50 should perform component-wise vector multiplication or scalar multiplication, multiplier 50 receives a vector_in input signal 120. When an asserted vector_in signal is received, a plurality of multiplexers within selection logic 62 (e.g., multiplexers 122 and 124) effectively isolate the two "logical halves" of multiplier 50. This separation prevents partial products from one pair of vector components (e.g., A1 and B1) from interfering with the multiplication of another pair of vector components (e.g., A2 and B2). The operation of multiplexers 122 and 124 is described in greater detail below.

As shown in the figure, multiplicand operand 72 and multiplier operand 74 may each comprise a vector (two N-bit values) or a scalar value (a single 2N-bit value). For example, multiplicand operand 72 may comprise a vector (A2, A1) or a single scalar value A. The partial products selected by selection logic 62 may be logically divided into four quadrants 130–136 for component-wise vector multiplications (assuming vector operands each having two vector components). Quadrant 130 represents the higher order bits of partial products selected by the least significant vector component of vector multiplier 74 (i.e., B1). Quadrant 132 represents the lower order bits of partial products selected by the least significant vector component of vector multiplier 74 (i.e., B1). Quadrant 134 represents the lower order bits of partial products selected by the most significant vector component of vector multiplier 74 (i.e., B2). Quadrant 136 represents the higher order bits of partial products selected by the most significant vector component of vector multiplier 74 (i.e., B2).

As the selected partial products are shifted before being summed in adder 64, the least significant bits of partial products selected by vector component B2 located within quadrant 134 may affect the addition performed to generate A1×B1 within final product 76. To prevent this "corruption" of final product 76, multiplexer 124 is configured to "zero-out" the lower order bits of partial products located within quadrant 134. Similarly, in some embodiments the higher order bits of partial products selected by vector component B1 may extend into quadrant 130, thereby possibly affecting the summation used to form B1×B2 within final product 76.

Thus additional multiplexers similar to multiplexer 124 may be used to zero-out the higher order bits within quadrant 130.

Multiplexer 122 also assists in the logical separation that is advantageous for component-wise vector multiplication. Staggered bit fields within multiplier operand 74 are used to select partial products from partial product generator 60. When a bit field encompasses bits from more than one vector component within multiplier operand 74, the resulting partial product may also be "corrupted." For example, selecting a partial product using one bit from vector component B1 and two bits from vector component B2 (as illustrated in the figure) will result in a partial product that is partially representative of vector component B1 and partially representative of vector component B2. This is undesirable because B1 is to be multiplied with A1 separately from B2. To remedy this, a multiplexer 122 may be used. When a bit field encompasses bits from more than one vector component, multiplexer 122 may zero-out the unwanted bit or bits (e.g., the most significant bit from B1 as shown in the figure). Thus, the partial product selected by multiplexer 94B will reflect only the bit values within the desired vector component. A second multiplexer similar to multiplexer 122 may zero out the opposite bits. Thus two partial products may be selected, one representing the end of vector operand B1 and one representing the beginning of vector operand B2. The zeroing-out of bits for partial product selection and summation are illustrated in more detail by way of a numerical example in FIGS. 11A through 12.

Figure 11A:
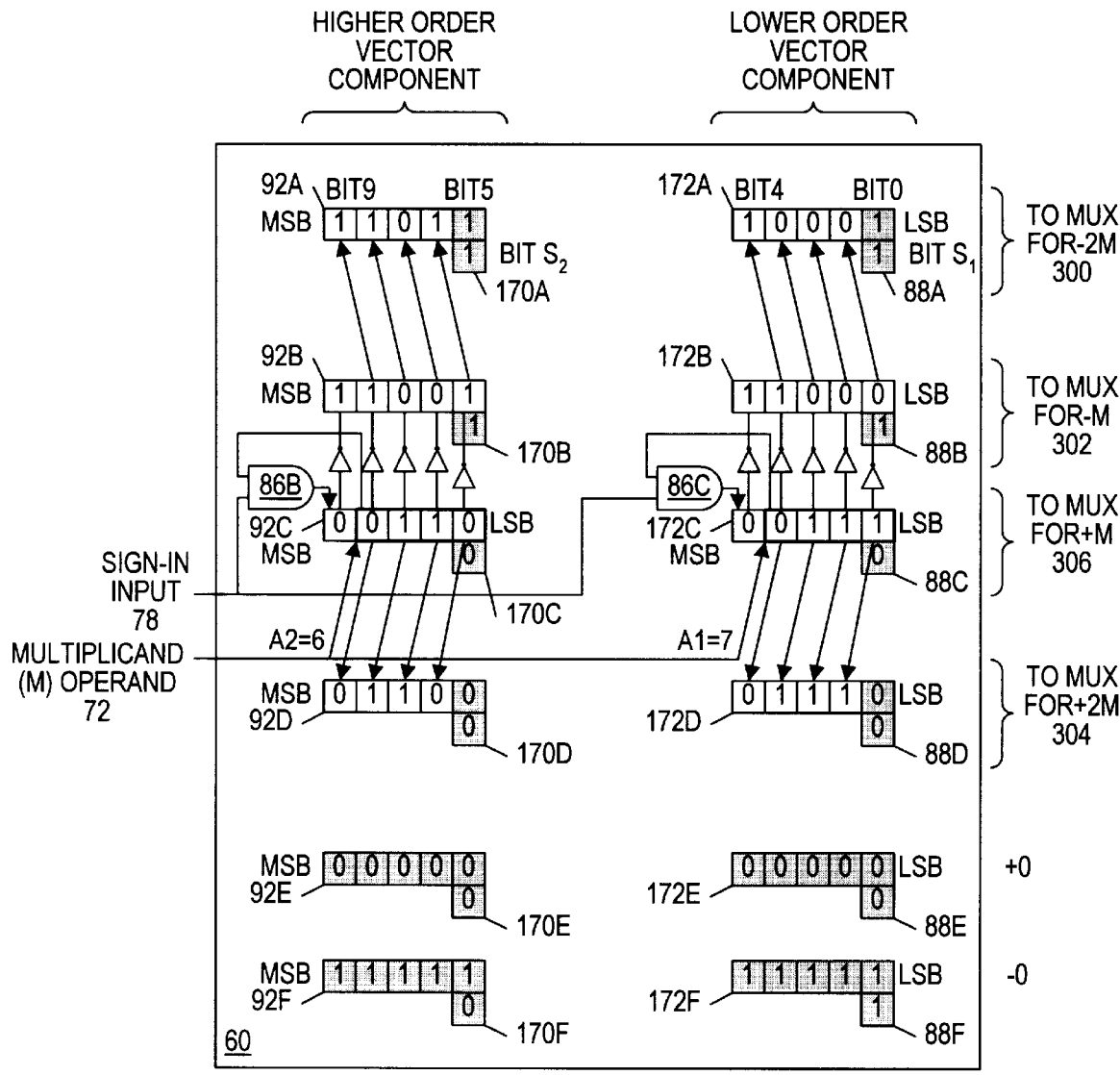
FIG. 11A is a diagram that illustrates details of one embodiment of the partial product generator from FIG. 6.

Turning now to FIG. 11A, more detail of one embodiment of partial product generator 60 is shown. To support component-wise vector multiplication when the vector components are signed, an additional effective sign bit 172A–172F may be generated for the lower-order portion of each partial product. The same logic may be used as previously disclosed, with AND-gate 86B being duplicated (see AND-gate 86C) to generate an effective sign for each lower-order vector component. Advantageously, multiplier 50 may be configured to perform both signed and unsigned vector multiplication. Generator 60 may also be configured to generate separate constant bits 88A–F (referred to as S1) and 170A–F (referred to as S2) to further improve separability when the selected partial products are summed in adder 64. The extra constant bits 170A–F and effective sign bits 172A–F may simply remain unused or unselected during scalar multiplication. Note the figure illustrates one possible set of partial products generated for an unsigned component-wise vector multiplication wherein the multiplicand operand 72 has the values of (6,7), i.e., A2=6 and A1=7. Sign_in input 78 is unasserted to indicate that an unsigned multiplication is being performed.

Figure 11B:
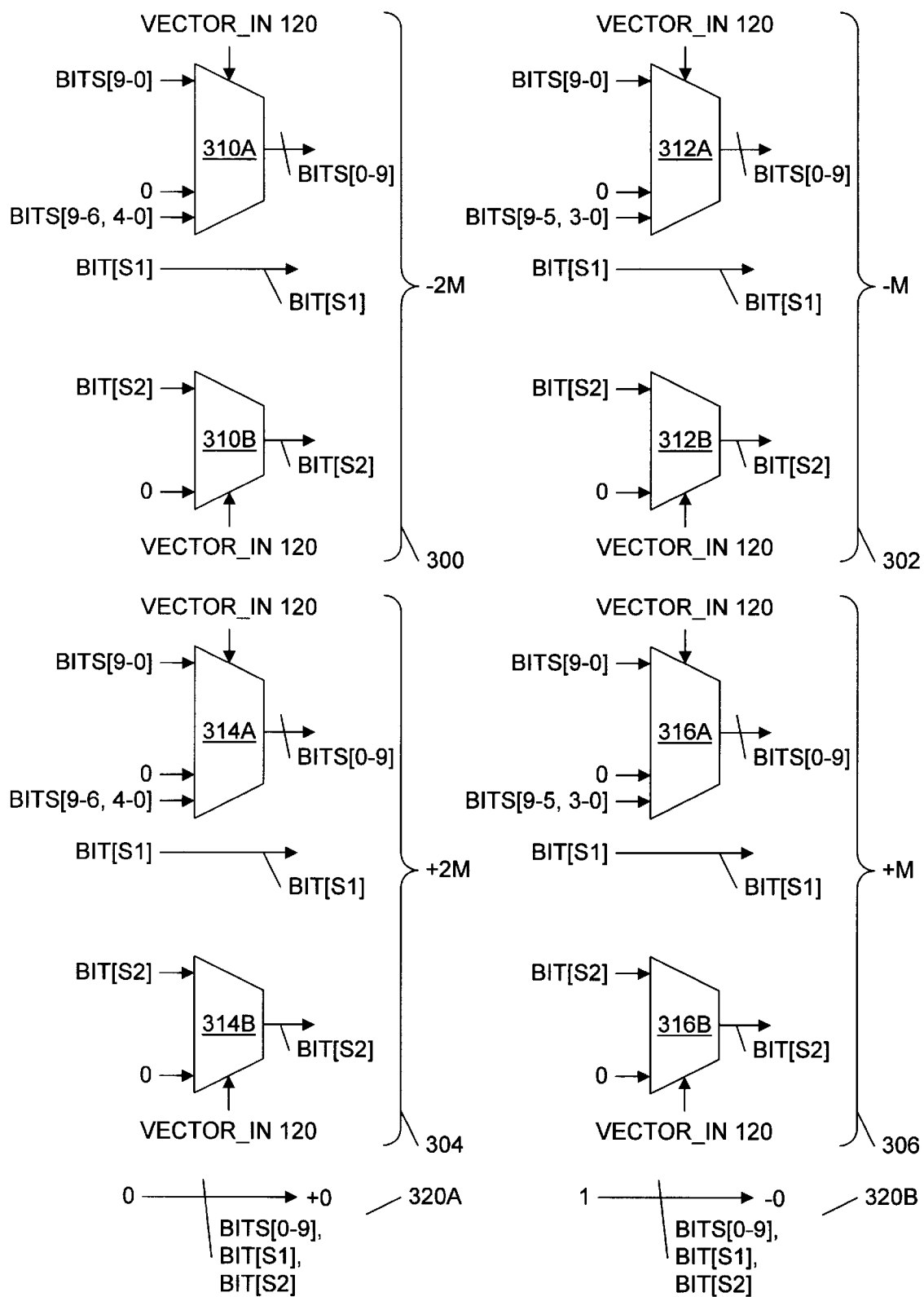
FIG. 11B is a diagram that illustrates in detail part of one embodiment of the selection logic from FIG. 6.

Turning now to FIG. 11B, detail of part of one embodiment of selection logic 62 is shown. In order to support both scalar and vector multiplication, selection logic 62 may comprise a plurality of multiplexers 310A–B, 312A–B, 314A–B, and 316A–B. These multiplexers operate to select particular bits from partial product generator 60 according to the status of vector_in signal 120. Each partial product has its own set of selection multiplexers (excluding constants +0 and −0 which are simply fed through as is; see 320A and 320B). For example, multiplexer 310A selects bits [9-0] from the partial product −2M and outputs them to the rest of selection logic 62 and adder 64 if vector_in is asserted. This may ensure that both effective sign bits 92A and 172A are conveyed to adder 64. Two effective sign bits are needed because two separate multiplications are being performed. Conversely, if vector_in is unasserted (indicating a scalar multiplication), extra effective sign bit 172A is not needed, thus multiplexer 310A selects bits [9-6, 4-0] and outputs them as bits [0-8]. The extra effective sign bit 172A is removed, and a constant zero is padded to the output to create bit [9]. As indicated in the figure, bit [S1] may be passed through as it is needed in both cases (scalar and component-wise vector multiplication). Multiplexer 310B selects bit [S2] if vector_in signal 10 is asserted, thereby providing two constants 88A and 170A. If vector_in signal 120 is not asserted and scalar multiplication is being performed, bit [S2] is not needed (and may cause an incorrect result if it is passed through to adder 64). Thus, multiplexer 310B is configured to select and convey a constant zero in place of actual S2 bit 170A if scalar multiplication is performed. Multiplexers 312A–B, 314A–B, and 316A–B operate in a similar fashion. Each multiplexer may be configured to select the required bits from partial product generator 60 without passing extra bits unless they are needed.

Figure 12A:
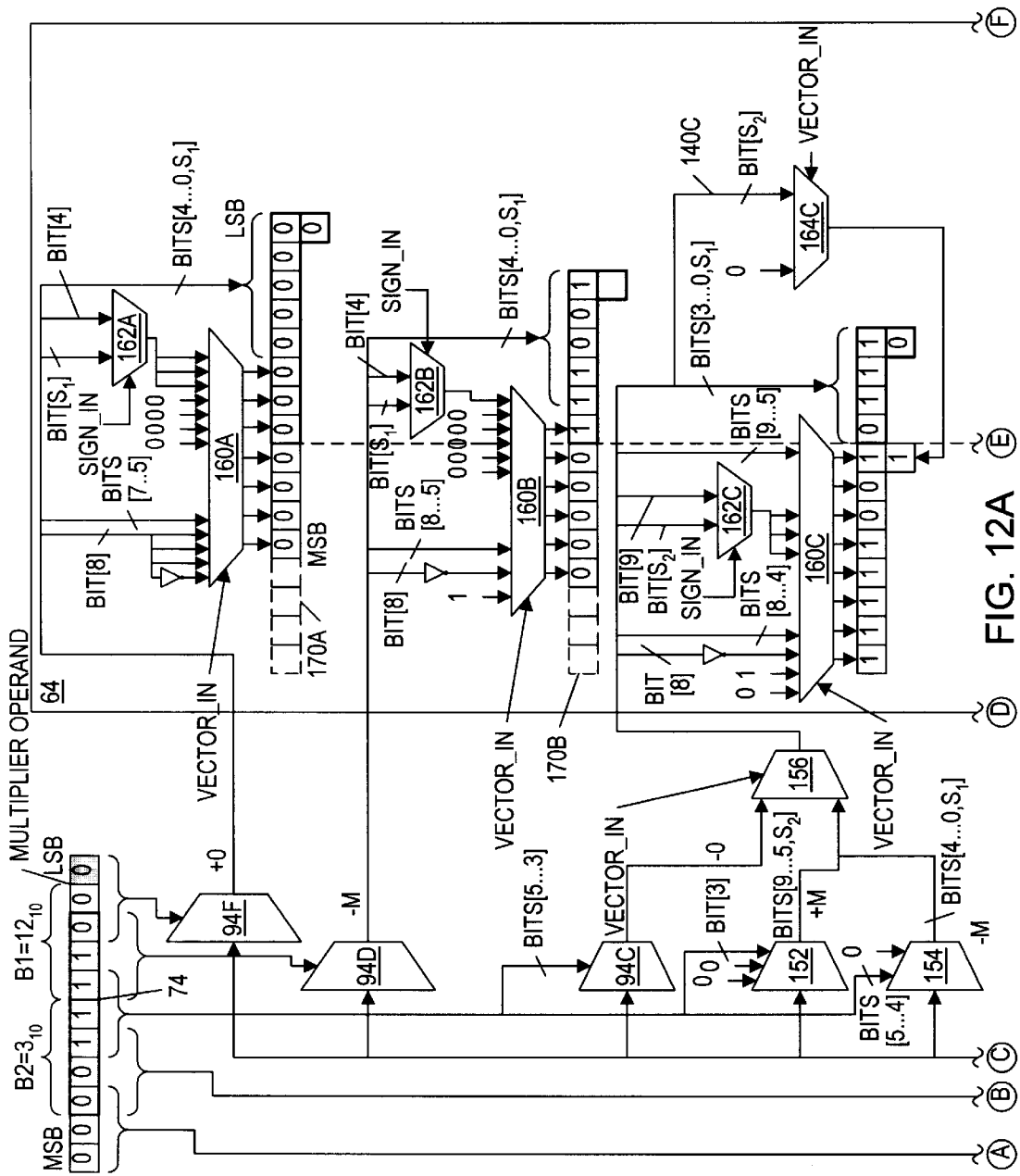
FIGS. 12A–B is a diagram that illustrates details of one embodiment of the selection logic and adder from FIG. 6
Figure 12B:
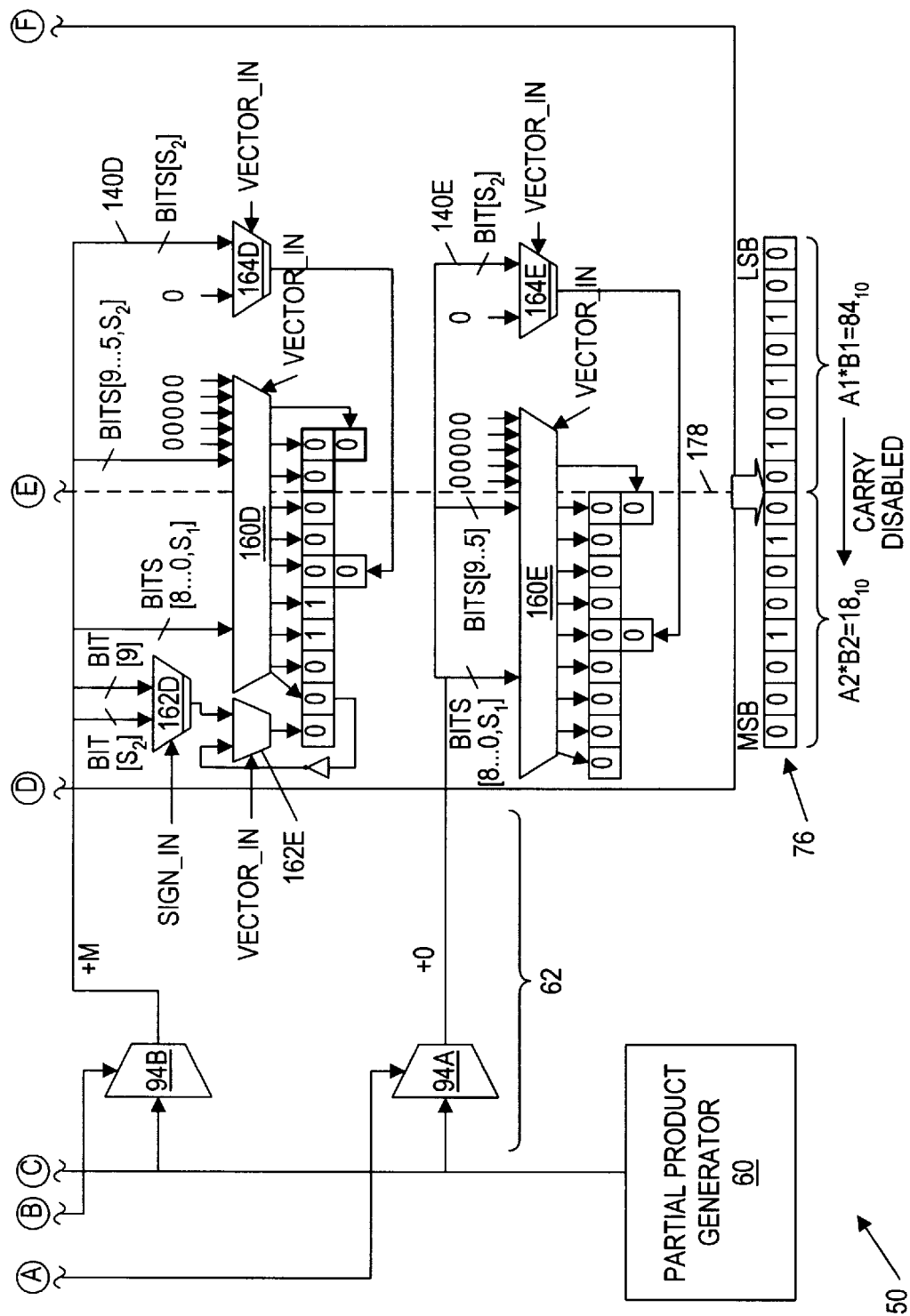

Turning now to FIG. 12A–B, more details of one embodiment of selection logic 62 and adder 64 are shown. In this embodiment, selection logic 62 comprises a plurality of multiplexers 94A–94F as in the previous embodiments. Note that multiplexers 312A–B, 314A–B, and 316A–B are not shown, but are instead included within partial product generator 60. Selection logic 62 further comprises multiplexers 152–156, which operate to select two portions of partial products: (1) a portion of the partial product corresponding to the higher order bits of vector operand B1, and (2) a portion of the partial product corresponding to the lower order bits of vector operand B2. Multiplexer 156 then selects this "combination" partial product when vector_in signal 120 is asserted. Advantageously, this configuration may remedy the problem of summation corruption when a bit field encompassing bits from more than one vector operand is used to select a partial product. This problem is described in greater detail below (see FIGS. 13 and 14).

In this embodiment, adder 64 comprises three pluralities of multiplexers 160A–160D, 162A–162E, and 164C–164E. Multiplexers 160A–160D are controlled by vector_in signal 120 and operate to "zero-out" portions of the partial products to prevent corruption of the vector components within final product 76 during the summation within adder 64. Multiplexers 164C–E are also controlled by vector_in signal 120 and operate to select either extra constant bits 140C–140E (in the event of a vector multiplication) or a zero constant (in the event of a scalar multiplication) for addition into the more significant product. Multiplexers 162A–162D are controlled by sign_in input 78 and are configured to select either the effective sign bit of the more significant portion of the selected partial product (in the event of a signed vector multiplication) or the actual sign (in the event of an unsigned vector multiplication). Multiplexers 164C–164E are also controlled by vector_in signal 102 and perform the same function as multiplexers 310B, 312B, 314B, and 316B, i.e., they select a constant zero instead of extra constant bit S2 if scalar multiplication is performed. Note that other configurations of logic for zeroing out and partial product selection are possible and contemplated. Further note that multiplexers 160A–160D, 162A–162E, and 164C–164E may be configured as part of adder 64, selection logic unit 62, or as a separate part of multiplier 50.

In addition to the features disclosed above, adder 64 may further comprise a plurality of multiplexers (not shown) to prevent carries across the boundaries of vector operands within final product 76 when summing the selected partial products. This boundary is represented by a dashed line 178 in the figure. Other embodiments of multiplier 50 may utilize different configurations of multiplexers. For example, multiplexers 160A–160C may be configured to select either additional sign-extension bits or the most significant bits of the selected partial products. In addition, multiplexers 160A–160C may be configured to pad each selected partial product with prefix bits until the most significant bit of each selected product corresponds to the most significant bit of final product 76 (as indicated by dashed bit positions 170A–170B). The prefix bits may comprise a constant, sign extension bits, or a combination thereof.

Note that FIGS. 11A–B and 12 together illustrate the exemplary component-wise multiplication of two vector operands, i.e., multiplier operand 74 having a value of (3,12), i.e., B2=3 and B1=12, and multiplicand operand 72 having a value of (6,7), i.e., A2=6, and A1=7 resulting in final product 76 having a value of (18,84). Further note that while the figures and exemplary embodiments have illustrated a multiplier configured to perform component-wise vector multiplication on vector operands having up to two vector components, other configurations are possible and contemplated, e.g. vectors having four or six vector components may be multiplied component-wise in parallel. Furthermore, a number of multipliers configured similarly to multiplier 50 may be used in parallel to achieve even higher performance. The widths of multiplier operand 74 and multiplicand operand 72 may also be varied, e.g., 32-bits or 64-bits, as may the widths of their vector components.

In addition, other embodiments of multiplier 50 may be configured to return only a portion of final product 76 per clock cycle. For example, the most significant vector component of final product 76 may be returned during a first clock cycle. Other vector components may be returned during subsequent clock cycles in order of their significance.

Figure 13:
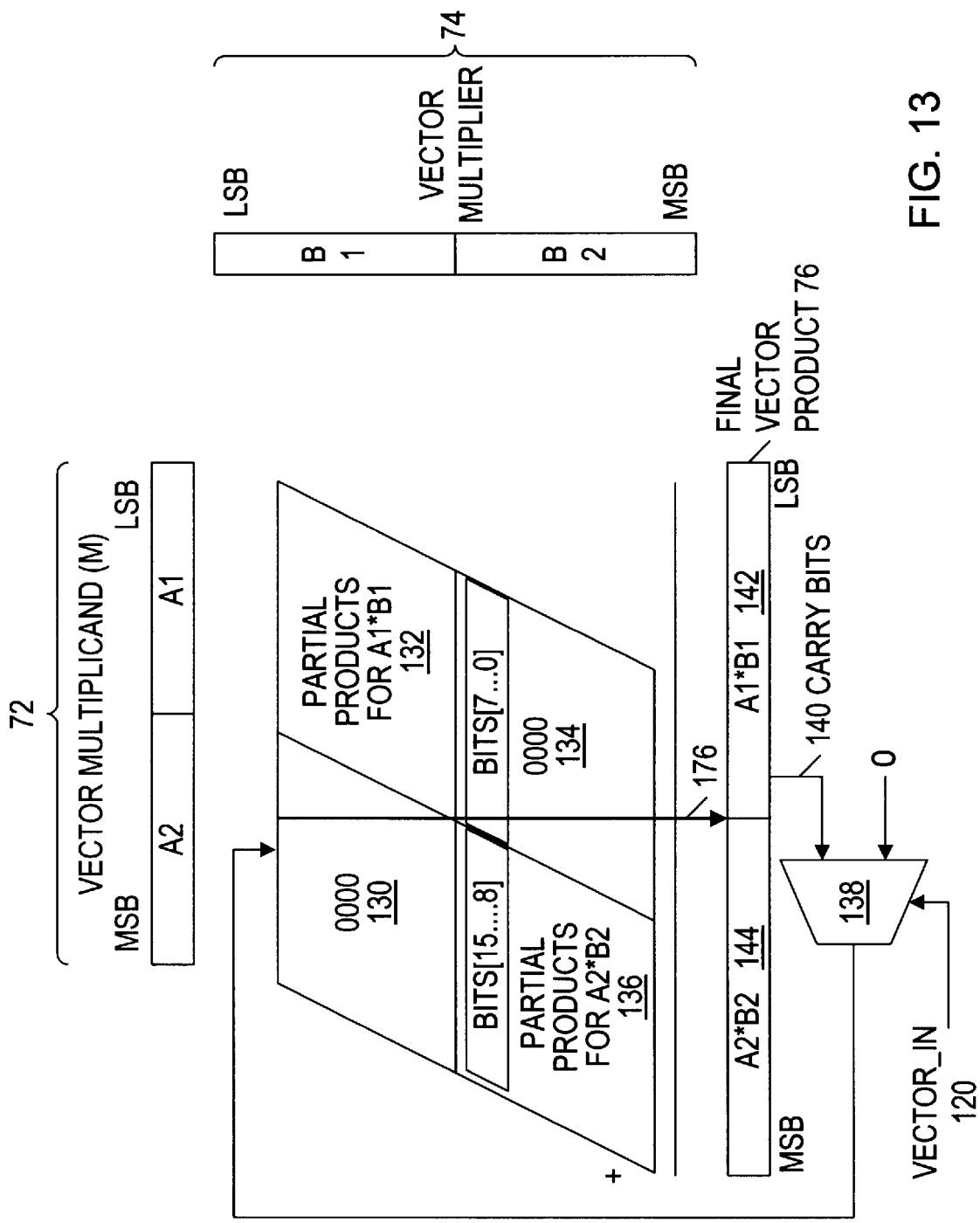
FIG. 13 is a diagram illustrating another embodiment of the multiplier from FIG. 4 that is configured to perform vector multiplication.

Turning now to FIG. 13, another embodiment of multiplier 50 is shown. In this embodiment, multiplier 50 further comprises multiplexer 138. When vector_in signal 120 is asserted, component-wise vector multiplication is performed. If the summing of partial products generates one or more carry bits 140, the upper vector component in final product 144 may be corrupted if carry bits 140 are allowed to propagate across boundary 176. To prevent this, multiplier 50 may comprise one or more carry multiplexers 138 to prevent carry bits from propagating to higher order vector components within final product 76. When multiplier 50 is performing scalar multiplication, multiplexers 138 may be configured to propagate carry bits normally. As shown in the figure, in this embodiment of multiplier 50 the partial products in quadrant 130 are zeroed out such that they will not affect the value of final product 144.

Figure 14:
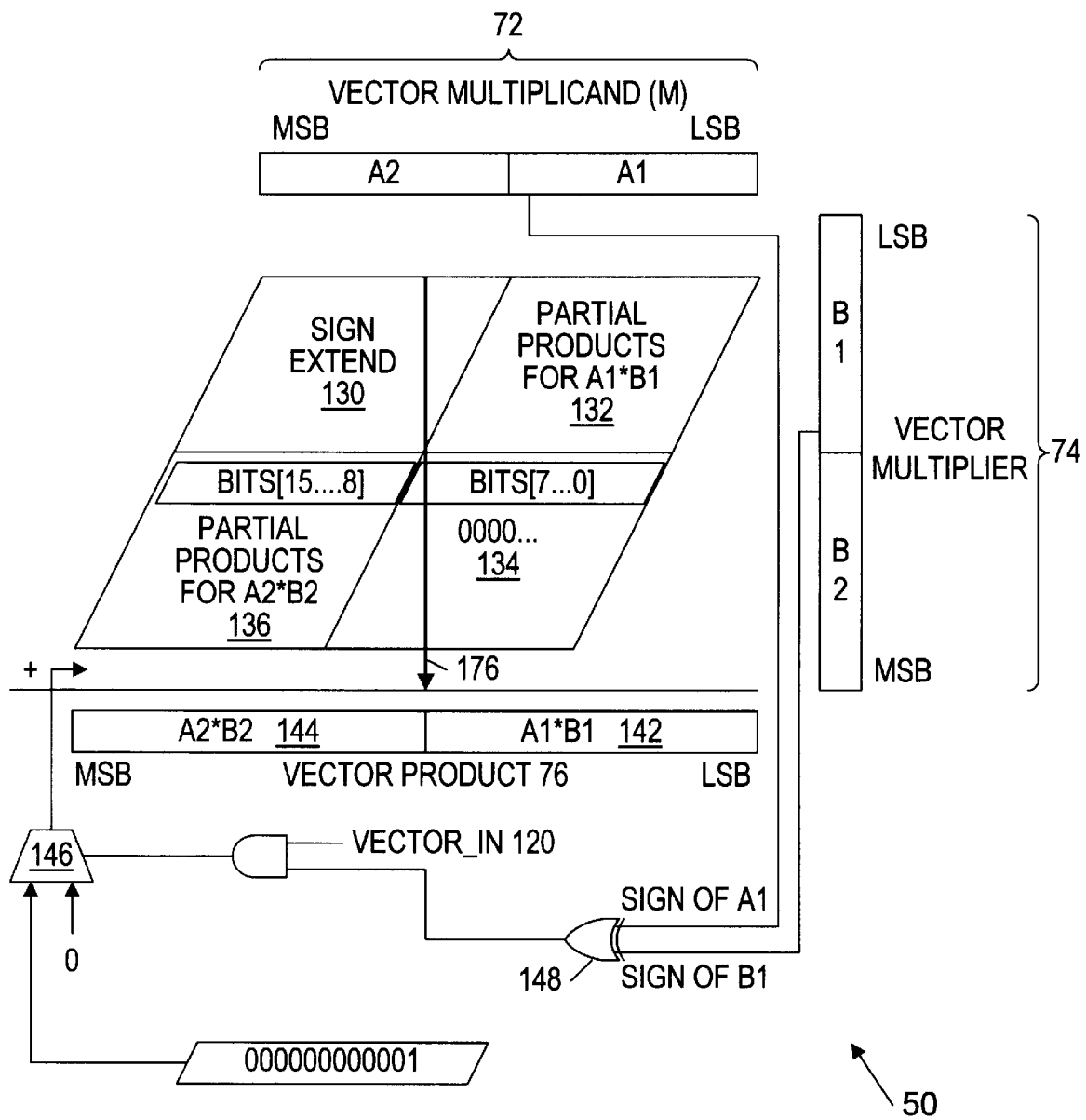
FIG. 14 is a diagram illustrating yet another embodiment of the multiplier from FIG. 4 that is configured to perform vector multiplication.

Turning now to FIG. 14, another embodiment of multiplier 50 is shown. In this embodiment, the partial products in quadrant 130 are not zeroed out. Instead, the selected partial products in quadrant 132 are allowed to sign extend across quadrant 130. In some instances, e.g., when vector components A1 and B1 have opposite signs, final product 76 will have a lower order vector component 142 that will be negative and may result in a sign extensions across quadrant 130. This sign extension may affect the value of the more significant vector component 144 within final product 76. Multiplexer 146 is configured to insert a constant to be summed with the selected partial products to form final product vector component 144. The constant (e.g., a binary value of one) is calculated to compensate for a negative sign extension across final product 144. For example, a negative sign extension may be equivalent to "11111111," thus adding a constant of one (i.e., "00000001") will negate the effect of the sign extension on result vector component 144. As this sign extension occurs only when vector components A1 and B1 have different signs, an XOR-gate 148 may be used in conjunction with vector_in input 120 to control multiplexer 146 so that the constant is only added when final product 142 will be negative and a component-wise vector multiplication is being performed. As illustrated, XOR-gate 148 may receive the sign bits (i.e., the most significant bits) of vector components A1 and B1 as inputs.

Vector Dot Product

Multiplier 50 may also be configured to calculate the "vector dot product" or inner product of two vectors. The following example illustrates the calculation of a vector dot product. Assuming vector A equals (x1, x2, x3), and vector B equals (y1, y2, y3), then the vector dot product A·B equals x1y1+x2y2+x3y3. As this example illustrates, calculation of the dot product entails performing a component-wise vector multiplication and then summing the vector component products.

Figure 15:
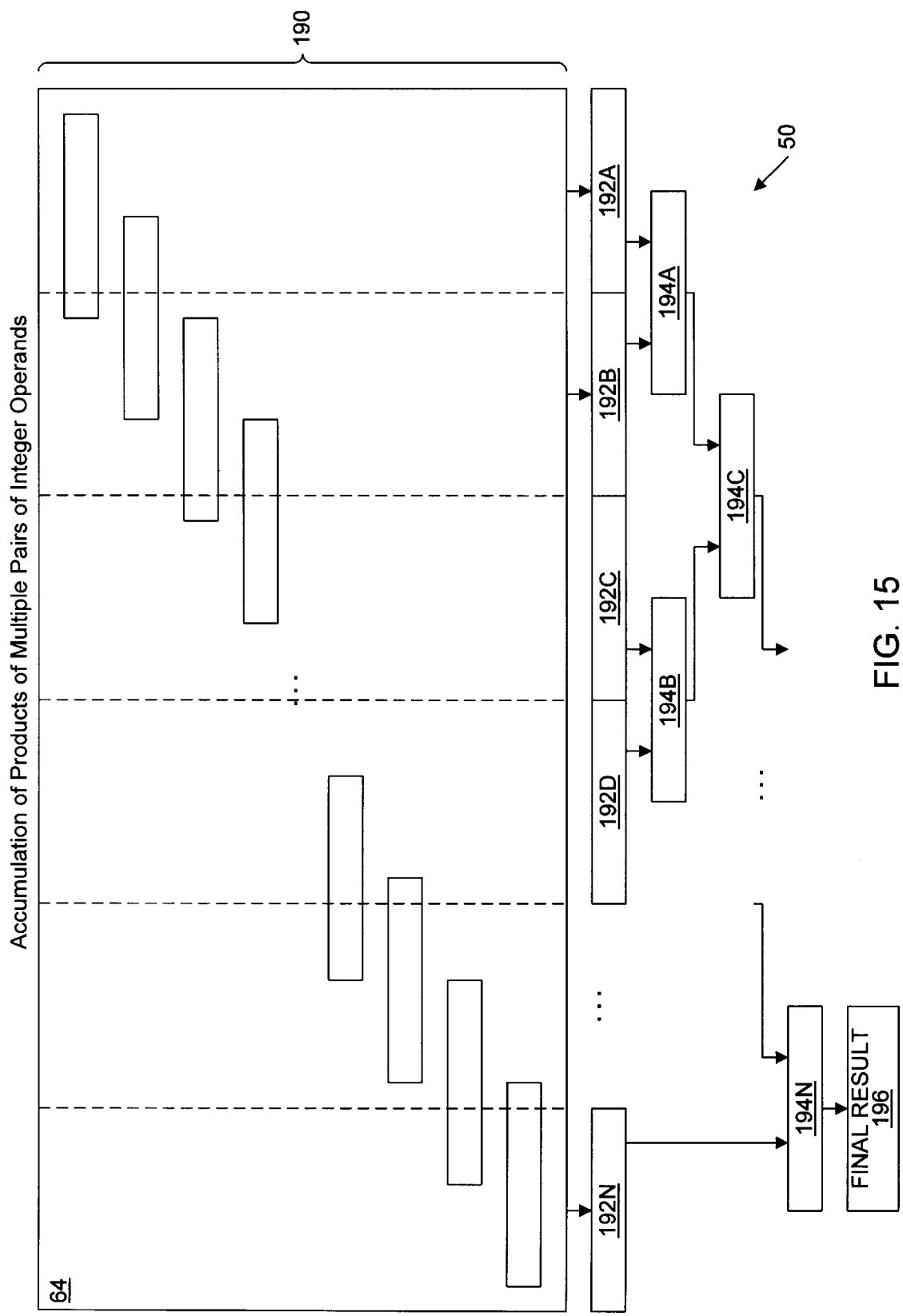
FIG. 15 is a diagram illustrating one embodiment of a multiplier that is configured to calculate vector dot product of a pair of vector operands.

Turning now to FIG. 15, one embodiment of multiplier 50 configured to calculate the vector dot product is shown. As shown in the figure, partial products 190 are summed within adder 64 to form vector component products 192A–N. Each vector component product 192A–N corresponds to one vector pair within multiplicand operand 72 and multiplier operand 74 as previously disclosed. Vector component products 192A–N are then summed using a plurality of carry-propagate adders 194A–N to form final result 196, which may then be output for use by other parts of microprocessor 10.

Figure 16:
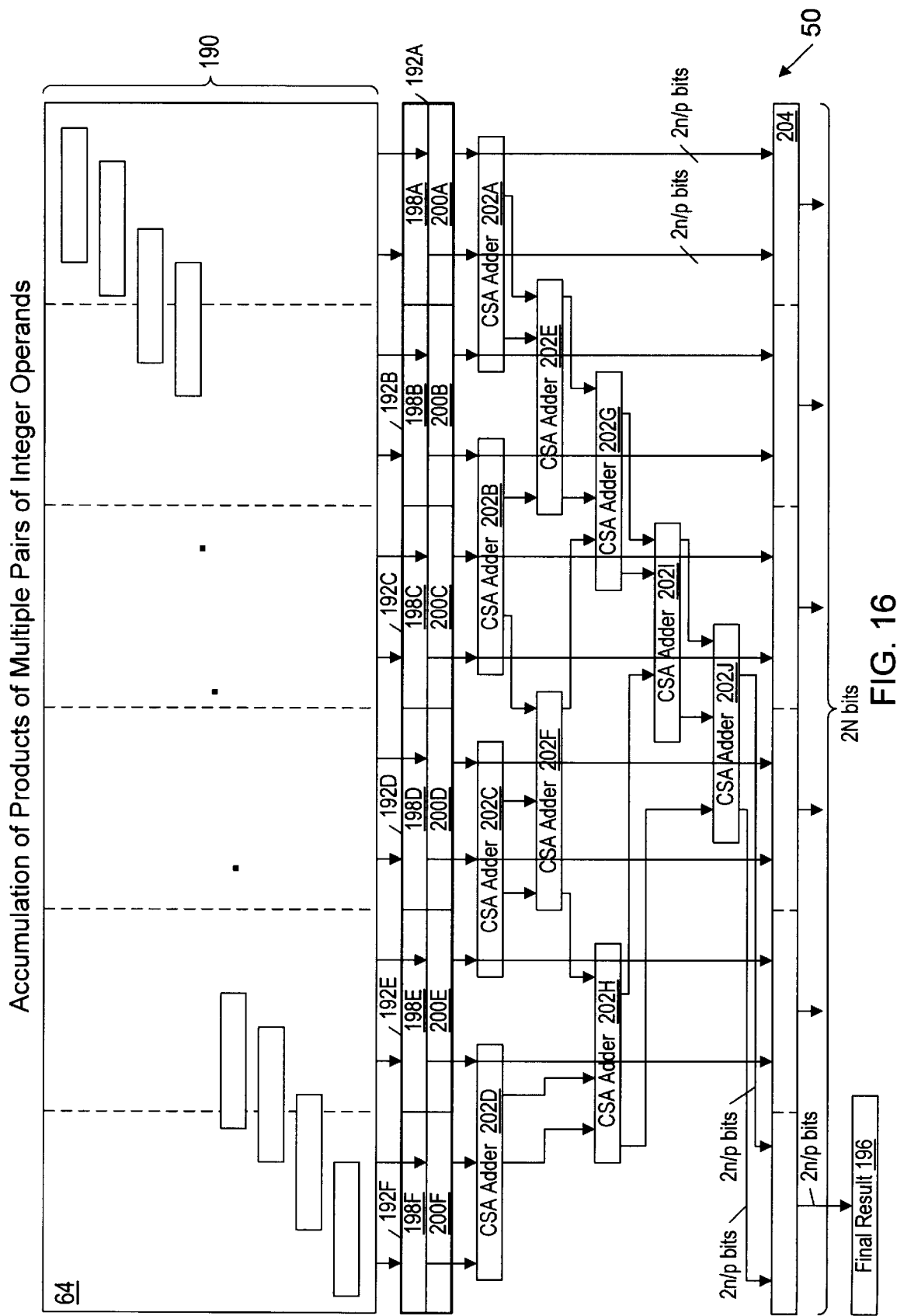
FIG. 16 is a diagram illustrating another embodiment of a multiplier that is configured to calculate the vector dot product of a pair of vector operands.

Turning now to FIG. 16, another embodiment of multiplier 50 configured to calculate the vector dot product is shown. In this embodiment, however, partial products 190 summed by adder 64 are kept in redundant form, i.e., each vector component product 192A–F is represented by more than one value. For example, each vector component product 192A–F may be represented by two values, a sum value 198A–F and a carry value 200A–F. A set of carry-save adders (not shown) may be used within adder 64 to sum partial products 192 in redundant form. Advantageously, carry-save adders may significantly reduce the amount of time and die space required to sum partial products 192. At the single-bit level, a carry-save adder will take three bits of the same significance and produce a sum value (having the same significance) and a carry value (having a significance one bit higher than the sum value). In contrast, the term "carry-propagate adder" denotes an adder that is not a carry-save adder. In one embodiment, a carry-save adder may be implemented as a number of independent full adders.

Once vector component products 192A–192F have been formed, they may be summed together using a second set of carry-save adders 202A–J. When the number of values remaining to be summed is reduced to two, a carry-propagate adder 204 may be used to perform the final summation. Note, however, that this configuration may require further modification if multiplier 50 is configured to propagate sign extension and carry bits as illustrated in FIG. 14. The embodiment of multiplier 50 illustrated in FIG. 14 relies upon carries from less significant products propagating into the more significant ones. In this case, summing partial products 190 and products 192A–F using carry-save adders may cause final result 196 to be less than the correct result by one unit-in-the-last-place (ULP) for each product below the most significant product. This is because carries from lower products are not incorporated into upper products during carry-save adds.

To ensure that final result 196 is correct when multiplier 50 is configured in a manner similar to the embodiment of FIG. 14, carry-propagate adder 204 may be configured to accept summands having a width equal to the cumulative width of all products 192A–F. Assuming the length of each operand (multiplier and multiplicand) is n bits wide and comprises p vector components, each product 192A–F will have a width of 2n/p. Thus to accommodate all products 192A–192F, adder 204 may be 2n bits wide or wider. The redundant forms of each product 192–192F (e.g., sum values 198A–F and carry values 200A–F) are conveyed as inputs to adder 204 (excluding the most significant product 192F). In place of the most significant product 192F, the final two summands remaining from the carry-save summation of products 192A–192F are input to adder 204 as the most significant inputs. While adder 204 will output a 2n-bit wide result, only the most significant 2n/p bits comprise the final result 196. This configuration advantageously allows adder 204 to propagate carry bits from lower order products to higher order products, thereby ensuring a proper result while still retaining the advantages associated with carry-save addition. Furthermore, the cost in die space of having a 2n-bit wide carry-propagate adder such as adder 204 may be reduced if other functions to performed by multiplier 50 also require a wide carry-propagate adder.

As with previous embodiments, this embodiment of multiplier 50 may be configured to accept operands having varying widths (n), and varying numbers of vector components (p). For example, multiplier 50 may be configured to calculate the dot product of two vector operands, each 64-bits wide and each having four vector components.

Rounded Products

As previously noted, some embodiments of multiplier 50 may be configured to conserve hardware resources (e.g., signal lines and registers) by returning only a portion of the final product (or products, in the case of component-wise vector multiplication) per clock cycle. For example, the higher order bits of the final product may be returned first, and then the lower order bits may be returned in subsequent clock cycles. However, in some embodiments it may be advantageous to return the higher order bits rounded to the nearest unit in the last place ("ULP").

Figure 17:
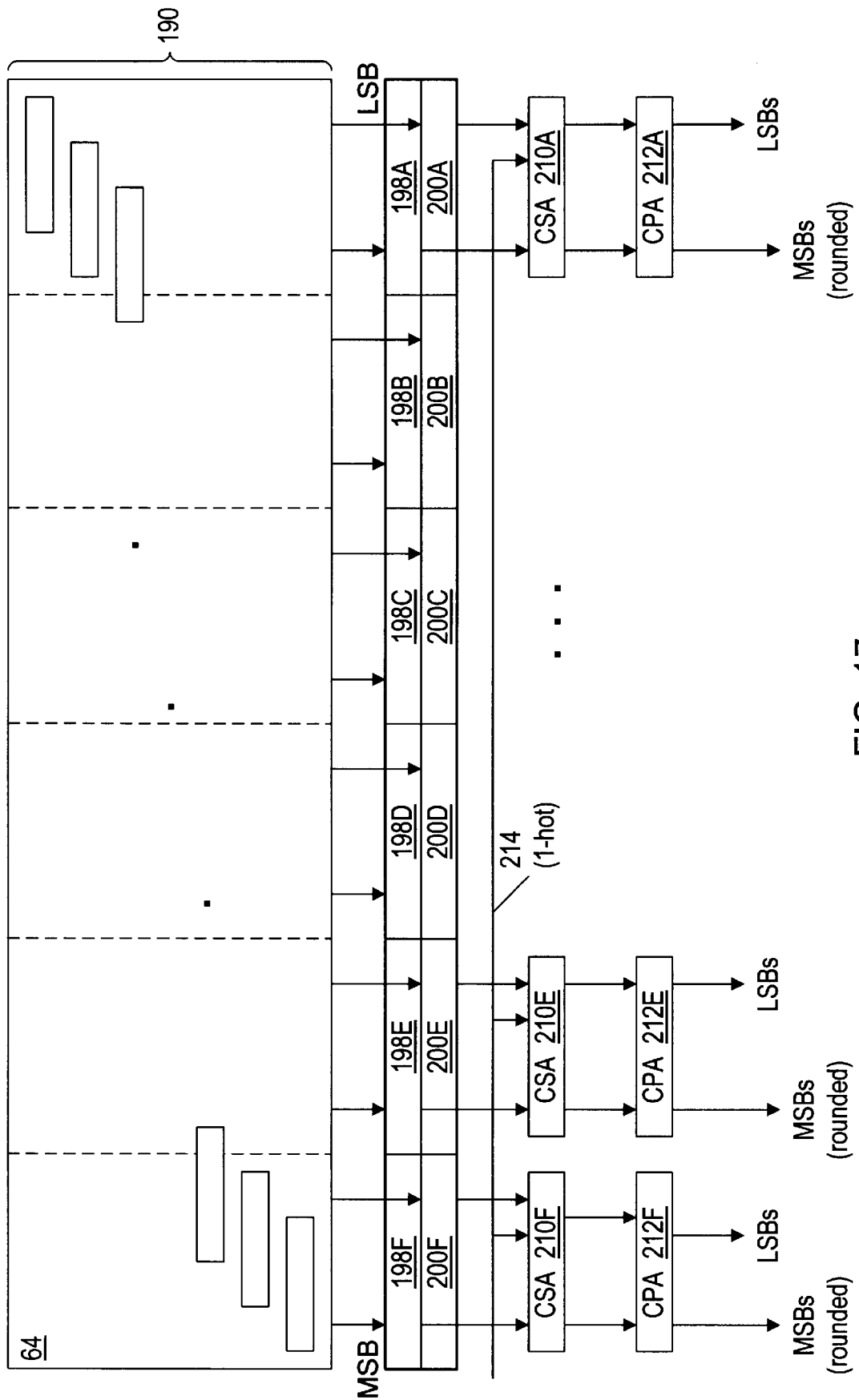
FIG. 17 is a diagram illustrating one embodiment of a multiplier that is configured to return vector component products in portions, some of which may be rounded.

Turning now to FIG. 17, a diagram of another embodiment of multiplier 50 is shown. This embodiment is configured to round the higher order bits of each vector component product to the nearest ULP. As in the previous embodiment (illustrated in FIG. 16), partial products 190 are reduced in redundant form (e.g., a sum value and a carry value for each pairs of vector components) by adder 64. However, in this embodiment a plurality of adders 210A–210F are used to add a rounding constant 214 to each vector component product. Rounding constant 214 may comprise a single asserted bit (i.e., a "one-hot") added to the bit position below the least significant bit position in the portion of the vector component to be rounded. For example, assuming a vector component product has a width of 8 bits, and the four most significant bits (MSBs) are to be rounded, then a constant one would be added to the fourth bit (as illustrated in Table 2). By adding a constant one in the appropriate bit position, the upper portion of the vector component product may be rounded efficiently and without large amounts of additional logic.

TABLE 2

| Bit Number–> | 7 (MSB) | 6 | 5 | 4 | 3 | 2 | 1 | 0 (LSB) |
|---|---|---|---|---|---|---|---|---|
| Vector Component Product | 0 | 1 | 1 | 0 | 1 | 0 | 1 | 1 |
| Rounding Constant | 0 | 0 | 0 | 0 | 1 | 0 | 0 | 0 |
| Rounded MSBs Output | 0 | 1 | 1 | 1 | | | | |

As shown in FIG. 17, each adder 210A–210F is configured to receive the redundant form of a single vector component product. For example, adder 210A is configured to receive sum value 198A and carry value 200A and combine them with rounding constant 214. Adder 210A combines these three values and generates a redundant form output comprising a new sum value and a new carry value. Advantageously, adders 210A–210F may be configured as independent carry-save adders, thereby preventing carry-bits caused by rounding constant 214 from propagating to more significant vector component products. The outputs of each adder 210A–210F are coupled to the inputs of one of a plurality of carry-propagate adders 212A–212F. Each carry-propagate adder 212A–212F is configured to sum the outputs of adders 210–210F and thereby generate a non-redundant form of each vector component product. The rounded MSBs of each vector product may be output first, while the remaining least significant bits ("LSBs") may be output during a subsequent clock cycle. Adders 212–212F may be configured independently to avoid the possibility of an unwanted carry-bit propagating across vector product boundaries.

In another embodiment, additional adders (not shown) may be configured to generate the LSBs (which are unrounded) separately from the MSBs. Advantageously, this may prevent the rounding process from altering the value of the LSBs. For example, adder 212A may be configured to generate the rounded MSBs by summing the sum and carry values generated by adder 210A, while an additional adder may be configured to sum the lower bits of sum value 198A and carry value 200A to generate the LSBs.

In the previously described embodiments, each adder 210A–210F and 212A–212F is configured to perform addition without propagating carry bits from one vector component product to another. While this may be desirable in many configurations, the non-propagation of carry bits may disrupt some configurations of adder 50. For example, the embodiment illustrated in FIG. 14 relies upon the propagation of sign extension bits across vector component product boundaries. If carry bits are not allowed to propagate during the final addition stages which convert the redundant-from vector component products to non-redundant-form, the higher order products may be incorrect.

Figure 18:
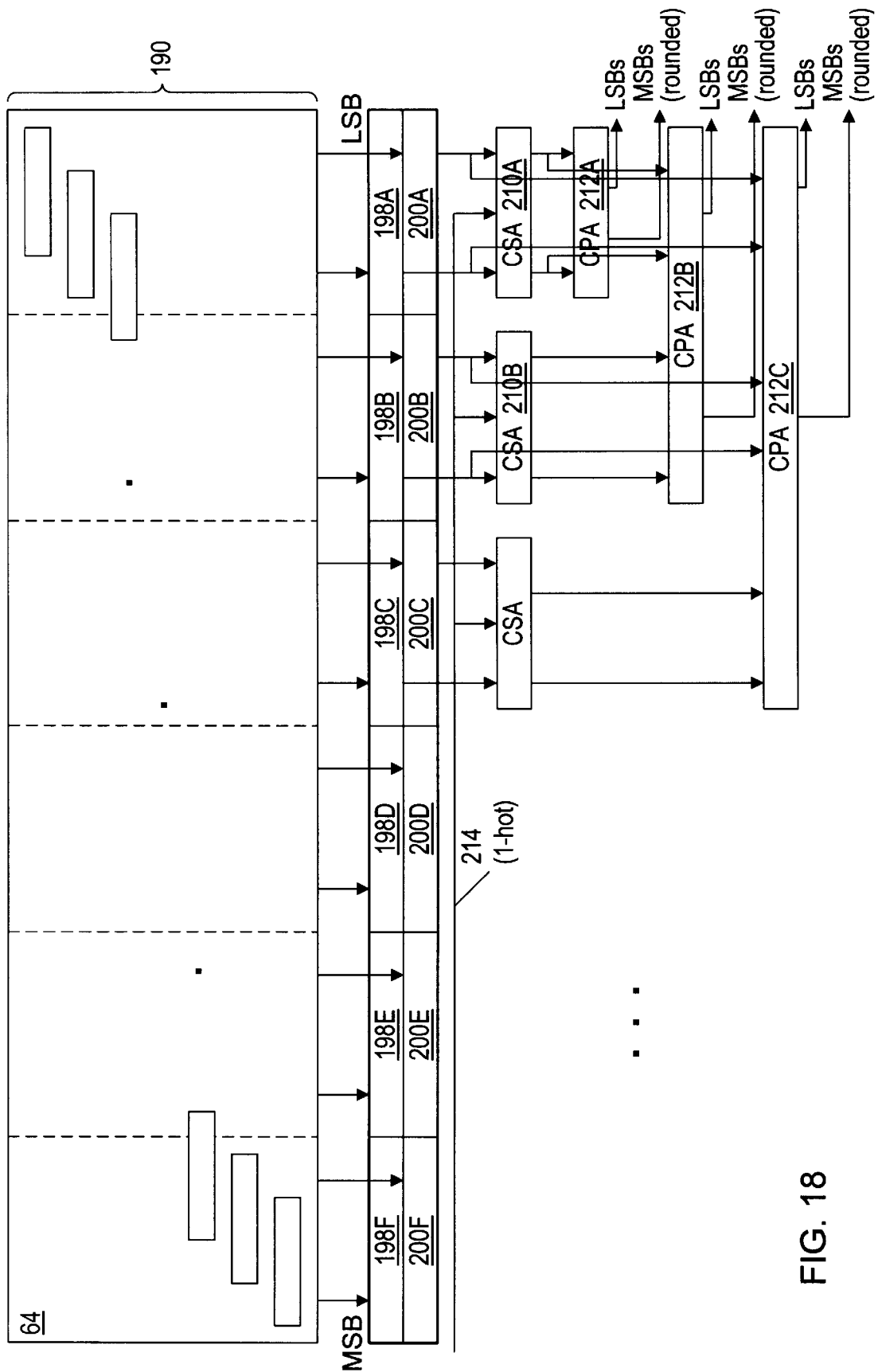
FIG. 18 is a diagram illustrating another embodiment of a multiplier that is configured to return vector component products in portions, some of which may be rounded.

Turning now to FIG. 18, an embodiment of multiplier 50 which rounds the higher order bits of each vector component product, yet still allows carry bits to propagate across consecutive vector component product boundaries, is shown. In this embodiment, rounding constant 214 is once again added to the redundant form sum values 198A–198F and carry values 200A–200F of each vector component product by carry-save adders 210A–210F. In order to allow carries from partial products 190 to propagate without allowing carries from rounding constant 214 to propagate, separate carry-propagate adders 212A–212F are used for each vector component product. The length of each adder 212A–212F may equal the number of bits in the vector component product itself plus all of the bits corresponding to less significant vector component products. For example, assuming each vector component product is eight bits wide, adder 212B may be 16 bits wide and may add redundant vector component values 198A–198C and 200A–200C. Advantageously, undesired carry-out bits from each vector component product will not affect higher order vector component products in this configuration. Furthermore, the carry bits that may be required for correct operation of the embodiment of multiplier 50 illustrated in FIG. 14 still propagate to form the correct result despite possible sign-extensions.

Note that other configurations of multiplier 50 are possible. For example, rounding constant 214 may be incorporated within the logic of adder 64, thereby potentially eliminating the need for an extra level of adders. Furthermore, multiplier 50 may be configured to round and return the upper portions of scalar products and vector dot products in addition to vector component products. The types of adders used may also be changed according to the implementation, e.g., carry-propagate adders may be used through out in conjunction with multiplexers configured to prevent carry bits from propagating across vector component product boundaries. In addition, various control signals, e.g., a round_in signal, may be used to indicate whether rounding is to be performed.

Fast Rounding and Normalization

Another possible area for improving the speed of multiplication relates to rounding and normalization. When performing floating point multiplication, the multiplier and multiplicand operands (i.e., the significands of two floating point numbers) are received in normalized form. A binary number is said to be normalized when the most significant asserted bit is directly to the left of the binary radix point. For example, $1.010011_2$ is normalized, while $10.10011_2$ and $0.01010011_2$ are not. In order to normalize a binary number, the number is shifted either right or left until the most significant asserted bit is directly to the left of the binary radix point. The number's exponent is then increased or decreased an amount equal to the number of positions that the number was shifted.

When multiplier 50 performs floating point multiplication, it receives two normalized significands. In some embodiments, multiplier 64 may be configured to output the results in normalized form. For example, multiplier 50 may receive two 32-bit normalized significands as operands and be configured to output one 32-bit result in normalized form. After multiplier 50 generates and selects the partial products, they are summed by adder 64 to create the final result. As the final result may be in redundant form, it may be passed through a carry-propagate adder as previously described. Once in non-redundant form, the result is rounded and normalized before being output. Different methods of rounding are possible. For example, IEEE Standard 754 defines four different rounding methods: round to nearest (even), round to positive infinity, round to minus infinity, and round to zero. The round to nearest method is particularly useful because it ensures that the error in the final product is at most one-half ULP (unit in the last place).

Figure 19:
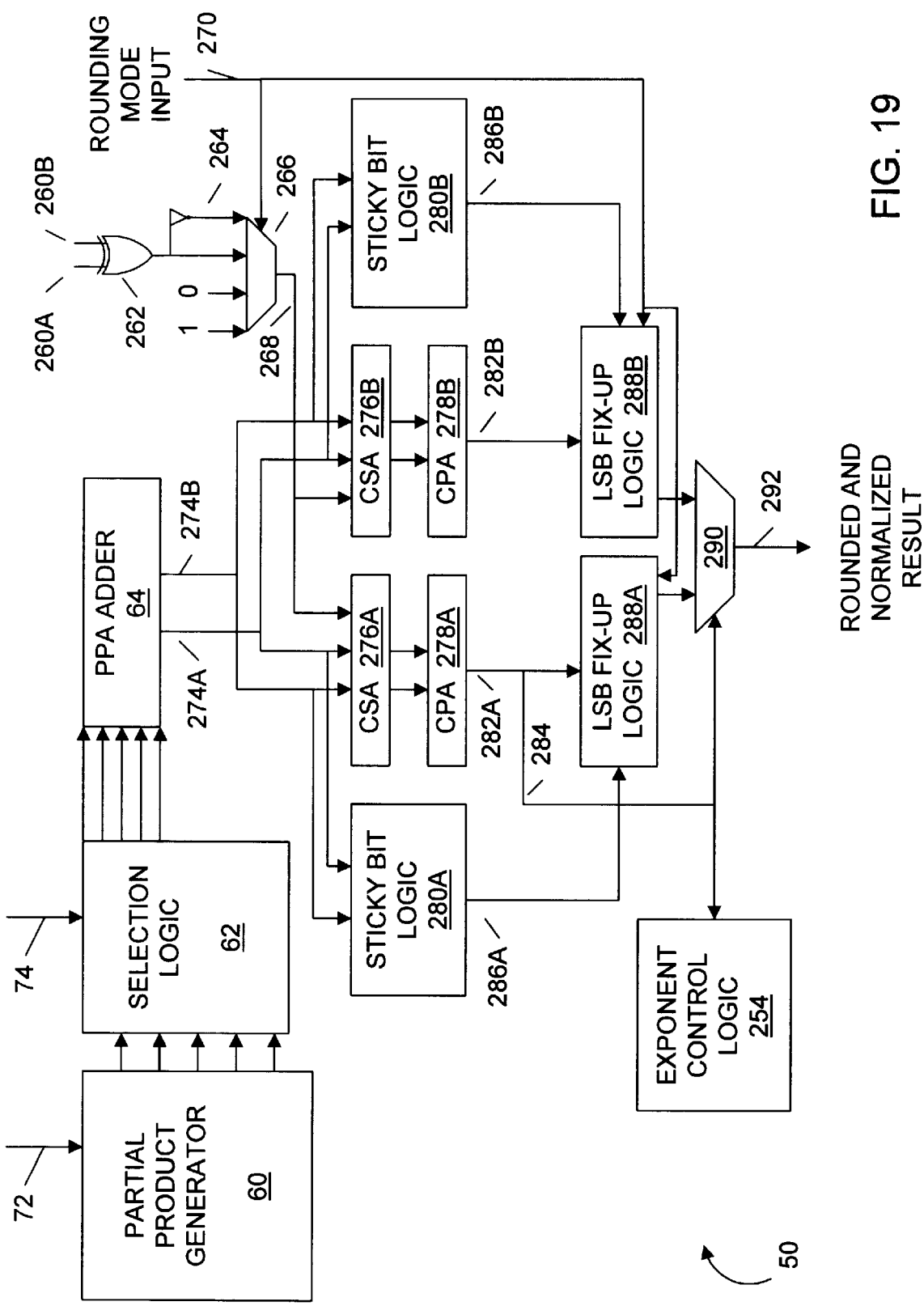
FIG. 19 is a diagram illustrating one embodiment of the multiplier from FIG. 6 configured to perform rounding.

Turning now to FIG. 19, another embodiment of multiplier 50 is shown. This embodiment comprises two "paths" which are configured to perform IEEE rounding and normalization by calculating two results in parallel, i.e., one result assuming there is an overflow and one result assume no overflow. This embodiment comprises a pair of carry-save adders 276A–B, a pair of carry-propagate adders 278A–B, a pair of sticky bit logic units 286A–B, and a pair of LSB fix-up logic units 288A–B. The "no-overflow path" comprises carry-save adder 276A, carry-propagate adder 278A, sticky bit logic unit 286A, and LSB fix-up logic unit 288A, while the "overflow path" comprises carry-save adder 276B, carry-propagate adder 278B, sticky bit logic unit 286B, and LSB fix-up logic unit 288B. Both carry-save adders 276A and 276B are configured to receive sum value 274A and carry value 274B from partial product array adder 64. Each carry-save adder 276A and 276B is also configured to receive a rounding constant 268 from multiplexer 266.

Multiplexer 266 is configured to select rounding constant 268 from one of four rounding constants. The first rounding constant is a hard-wired constant one and is selected when rounding mode input 270 indicates that round to nearest (even) is the selected rounding mode. The constant is added to the guard bit position by both carry save adders 276A and 276B. The second rounding constant is a hard-wired zero and is selected when rounding mode input 270 indicates that round to zero (truncate) is the selected rounding mode. The third rounding constant is the sign of the final product of the multiplication being performed. This sign may be obtained by exclusively ORing the sign bit 260A of multiplicand operand 72 and the sign bit 260B of multiplier operand 74 within XOR gate 262. The resulting sign bit is added to the guard bit position, and each bit position less significant than the guard bit position, by carry-save adders 276A and 276B. The fourth rounding constant is the inversion of the third rounding constant. It may obtained by inverting the rounding constant obtained from XOR gate 262 with inverter 264. The resulting inverted sign bit is added to the guard bit position and each bit position less significant than the guard bit position by carry-save adders 276A and 276B.

Carry-save adders 276A and 276B are configured to receive and add sum value 274A, carry value 274B, and the selected rounding constant from multiplexer 266. Carry-save adders 276A and 276B convey their results in redundant form to carry-propagate adders 278A and 278B, respectively. Carry-propagate adders 278A and 278B reduce the results to non-redundant form 282A and 282B and convey them to LSB fix-up logic units 288A and 288B, respectively.

In parallel with the addition performed by adders 276A–B and 278A–B, sticky bit logic units 280A–B calculate sticky bits 286A–B. Sticky bit logic units 280A–B each receive sum value 274A and carry value 274B as inputs. The calculation of sticky bits and the operation of sticky bit logic units 280A–B are described in greater detail below.

LSB fix-up logic units 288A and 288B are coupled to carry-propagate adders 278A–B and sticky bit logic units 280A–B. Fix-up logic units 288A–B are configured to conditionally invert the least significant bit of the non-redundant results received from adders 278A–B. In one embodiment, fix-up logic units 288A–B are configured to perform the inversion or "fix-up" when the "round to nearest" mode is being performed and the following equation is true: (inverse of L)·(G)·(inverse of S)=1, wherein L and G are the least significant bits (LSBs) and guard bits, respectively, of the sum of sum value 274A and carry value 274B, and wherein S is the corresponding sticky bit (either 286A or 286B). Note that L and G may be calculated within fix-up units 288A–B using sum value 274A and carry value 274. The calculation of L and G may be performed in parallel with the additions performed by adders 276A–B and 278A–B and need not include a rounding constant. L and G may be calculated within fix-up units 288A–B, or by using an extra component within multiplier 50 (e.g., a third pair of carry-save/carry-propagate adders). The fix-up may advantageously compensate for cases in which adders 276A–B have added a constant when a constant was not actually needed (e.g., result+1 is generated when result+0 is needed).

Next, the desired number of upper bits from the outputs of LSB fix-up logic units 288A and 288B may be conveyed to multiplexer 290, which selects one of the two values (overflow or no overflow) as output 292. Multiplexer 290 may be controlled by MSB 284 from the output of fix-up logic unit 288A. By looking at the most significant bit, a determination of whether an overflow occurred can be made. If an overflow occurred, the upper bits from the output of LSB fix-up logic unit 288A are selected. If an overflow did not occur, the upper bits from the output of LSB fix-up logic unit 288B are selected. Note that other control configurations are also possible, e.g., MSB 284 may be the most significant bit of the output from fix-up logic unit 288B. Furthermore, in some embodiments of multiplier 50 only one fix-up logic unit may be needed. For example, the single fix-up logic unit may be coupled to the output of multiplexer 290 and perform the fix-up before final result 292 is output.

In one embodiment, exponent control logic unit 254 is also controlled by the same signal that controls multiplexer 290. If an overflow occurs, exponent control logic unit 254 is configured to increment the corresponding exponent. This completes the normalization of the output.

Advantageously, the embodiment of multiplier 50 depicted in the figure may be able to round and normalize the final result in less time because normalization is performed in parallel. Furthermore, the fix-up is performed while multiplexer 290 is selecting a result (overflow or no overflow). This may further reduce the cycle time of this embodiment of multiplier 50.

Figure 20:
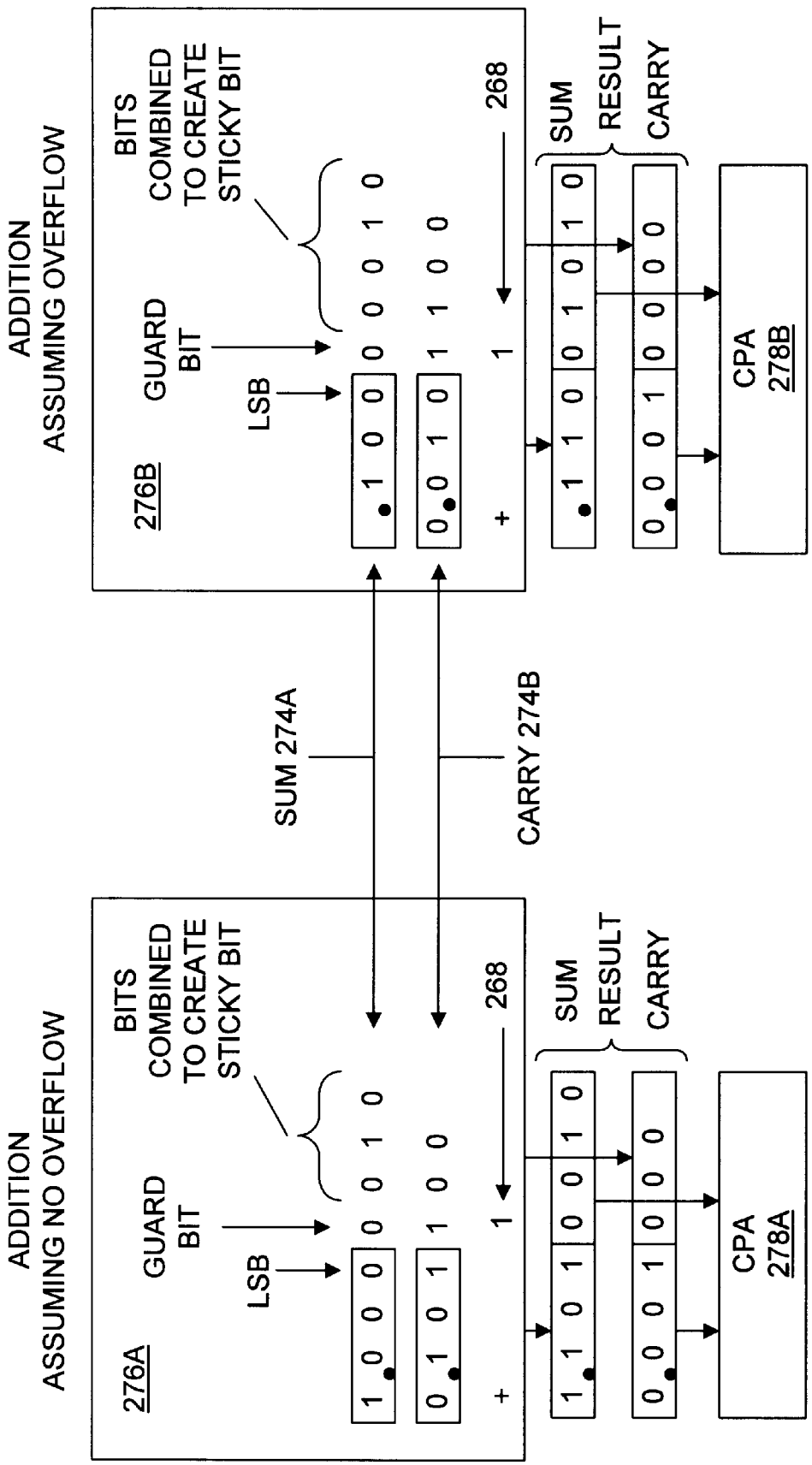
FIG. 20 is a diagram illustrating a numerical example of the operation of the multiplier from FIG. 19.

Turning now to FIG. 20, a diagram illustrating the operation of one embodiment of carry-save adders 276A and 276B is shown. The example assumes eight bit sum and carry values 274A–B are being rounded to four bit values and that round to nearest (even) is being performed. Adders 276A–B each receive sum value 274A, carry value 274B, and rounding constant 268 as inputs. In the example shown, adder 276A is configured to add a constant one to the guard bit position of sum value 274A and constant value 274B assuming there will not be an overflow. The guard bit position is the bit position that is one bit less significant than the least significant bit of the portion to be output. An overflow occurs when the summation of sum value 274A, carry value 274B, and any added rounding constants, creates a carry out from the bit position directly to the left of the binary radix point. An overflow may require the result to be shifted to the right (and the corresponding exponent to be incremented) in order to produce a normalized output.

As the figure illustrates, adder 276A adds a constant one to the guard bit position of sum value 274A and carry value 274B assuming there will be no overflow. In contrast, adder 276B adds rounding constant 268 to the guard bit position of sum value 274A and carry value 274B assuming there is an overflow. Thus, adder 286B adds the constant one in a different bit position than adder 276A. For this reason, adders 276A and 276B each generate a different result. The results from adder 276A are conveyed to carry propagate adder 278A, which is configured to reduce them to non-redundant form. Similarly, the results from adder 276B are conveyed to carry propagate adder 278B, which operates in manner similar to adder 278A.

Figure 21:
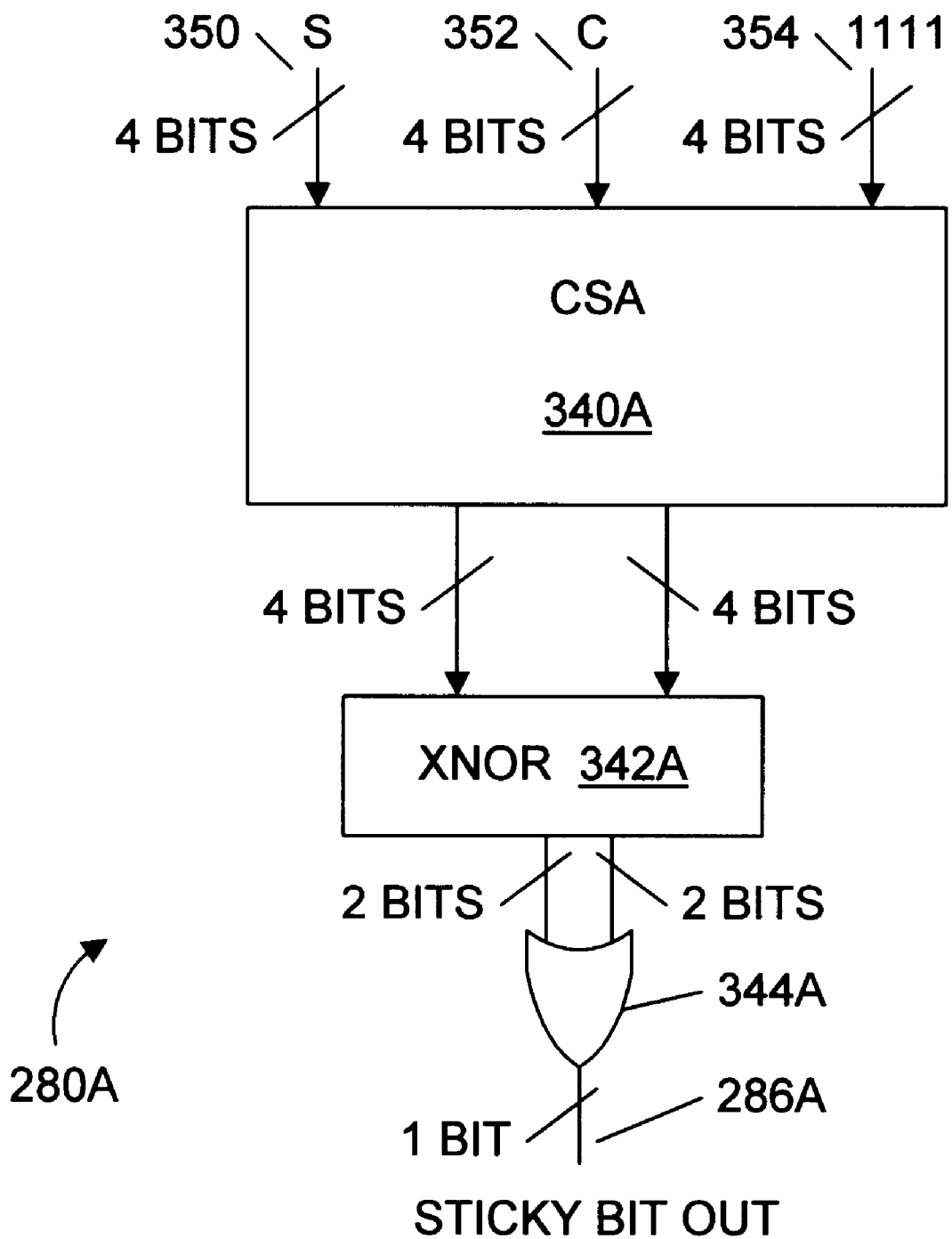
FIG. 21 is a diagram illustrating details of one embodiment of the sticky bit logic from FIG. 19.

Turning now to FIG. 21, more detail of one embodiment of sticky bit logic unit 280A is shown. As the figure illustrates, sticky bit logic 280A receives the lower four bits of the sum and carry values (350 and 352, respectively) generated by adder 276A. A constant 354 (e.g., 1111) is added to the sum and carry bits within carry save adder 340A, thereby generating two different 4-bit outputs which are routed to exclusive NOR gate 342A. The output from exclusive NOR gate 342A is routed to 4-input OR gate 344A, which outputs sticky bit 286A. Sticky bit logic 280B is configured similarly to sticky bit logic 280A, but it may be configured to receive one extra bit, e.g., five bits as opposed to four bits, due to the assumed overflow.

Turning now to FIG. 22, a numerical example of the operation of the embodiment of multiplier 50 from FIG. 20 is shown. This example assumes an eight bit output from adder 64 is being rounded to a four bit result. The figure shows each of the four IEEE rounding modes being performed by both carry-save adders 276A and 276B. The selected rounding constant 268 corresponds to the rounding mode. The selected rounding constant 268 is added to sum value 274A and carry value 274B by carry save adders 276A and 276B. As the figure illustrates, the starting bit position to which the constant is added varies from adder 276A to adder 276B. As previously noted, this is because adder 276A adds the constant to the guard bit position assuming there is no overflow, while adder 276B assumes there is an overflow. In parallel, sticky bit logic units 280A and 280B each calculate their own version of the sticky bit (286A and 286B, respectively), also reflecting whether or not an overflow is presumed to occur.

Next, LSB fix-up logic units 288A and 288B fix-up (invert) the LSB of output 282A, if necessary. As the figure illustrates, the fix-up is only performed when round to nearest (even) is the selected rounding mode and the formula (inverse of LSB)·(Guard bit)·(inverse of Sticky Bit)=1 is true. Note that in this embodiment the LSB and Guard bit are taken from the sum of sum value 274A and carry value 274B without selected rounding constant 268. After the fix-up, the upper four bits are output to multiplexer 290. In one embodiment, LSB fix-up logic 288A and 288B may each comprise a single inverter configured to invert the least significant bit of results 282A and 282B, respectively.

Figure 23:
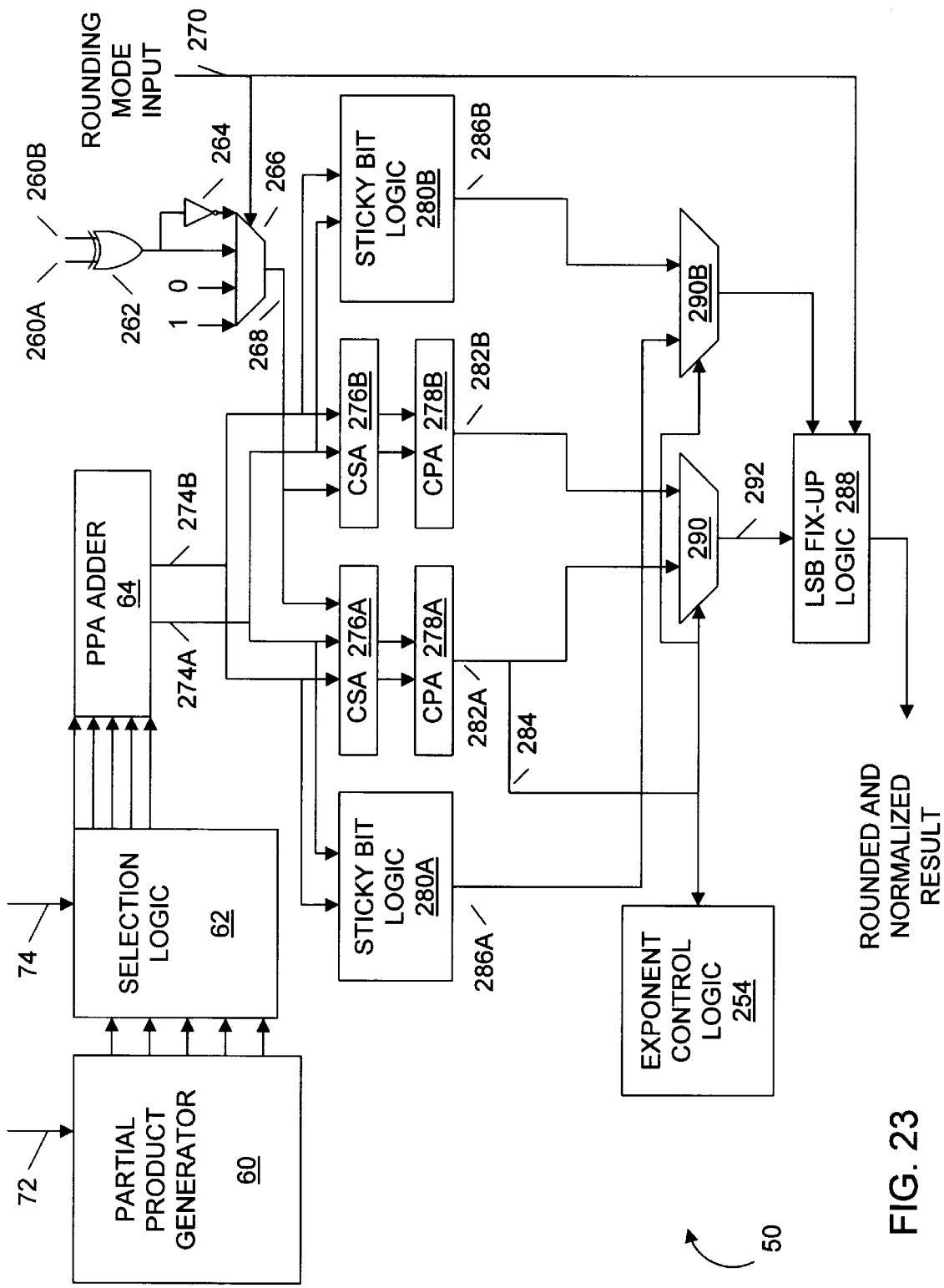
FIG. 23 is a diagram illustrating another embodiment of the multiplier from FIG. 6.

Other configurations of multiplier 50 are possible and contemplated. Turning now to FIG. 23, another embodiment of multiplier 50 configured to perform rounding and normalization is shown. In this embodiment, the "fix-up" or inversion of the LSB is performed by a single LSB fix-up logic unit 288 after multiplexer 290 performs the overflow/no overflow selection. A second multiplexer 290B is included to select which sticky bit 286A or 286B will be used by LSB fix-up logic unit 288 in determining whether to perform the inversion. Note the rounding and normalization hardware disclosed herein may be configured to round and normalize redundant results from other functional units also, e.g., adders.

Fast Newton-Raphson Iteration to Calculate the Reciprocal (1/B)

As microprocessor 10 already contains a highly optimized multiplier 50, it would be advantageous to perform other calculations on multiplier 50 as well, e.g., division. This may be accomplished by recasting division operations into reciprocal operations followed by multiplication operations. For example, the operation "A divided by B" (A/B) may be recast into "A multiplied by the reciprocal of B" (A×B$^{-1}$). Forming the reciprocal of B may also be recast into a series of multiplication operations by using a version of the Newton-Raphson iteration. The Newton-Raphson iteration uses the equation $X_1=X_0\times(2-X_0\times B)$ to calculate the reciprocal of B. The initial estimate, $X_0$, may be determined in a number of different ways. For example, $X_0$ may be read from a ROM table using B as the index, wherein $X_0$ approximates 1/B. In another embodiment, $X_0$ may be calculated directly from B or from one or more ROM tables configured to output seed values. The seed values may be manipulated, e.g., using arithmetic and combinational logic, to determine $X_0$. Once $X_0$ is known, the first iteration may be performed. Thereafter, the results from each iteration are used in place of $X_0$ in subsequent iterations. This forces $X_{n+1}$ to converge on 1/B in a quadratic fashion.

Figure 24:
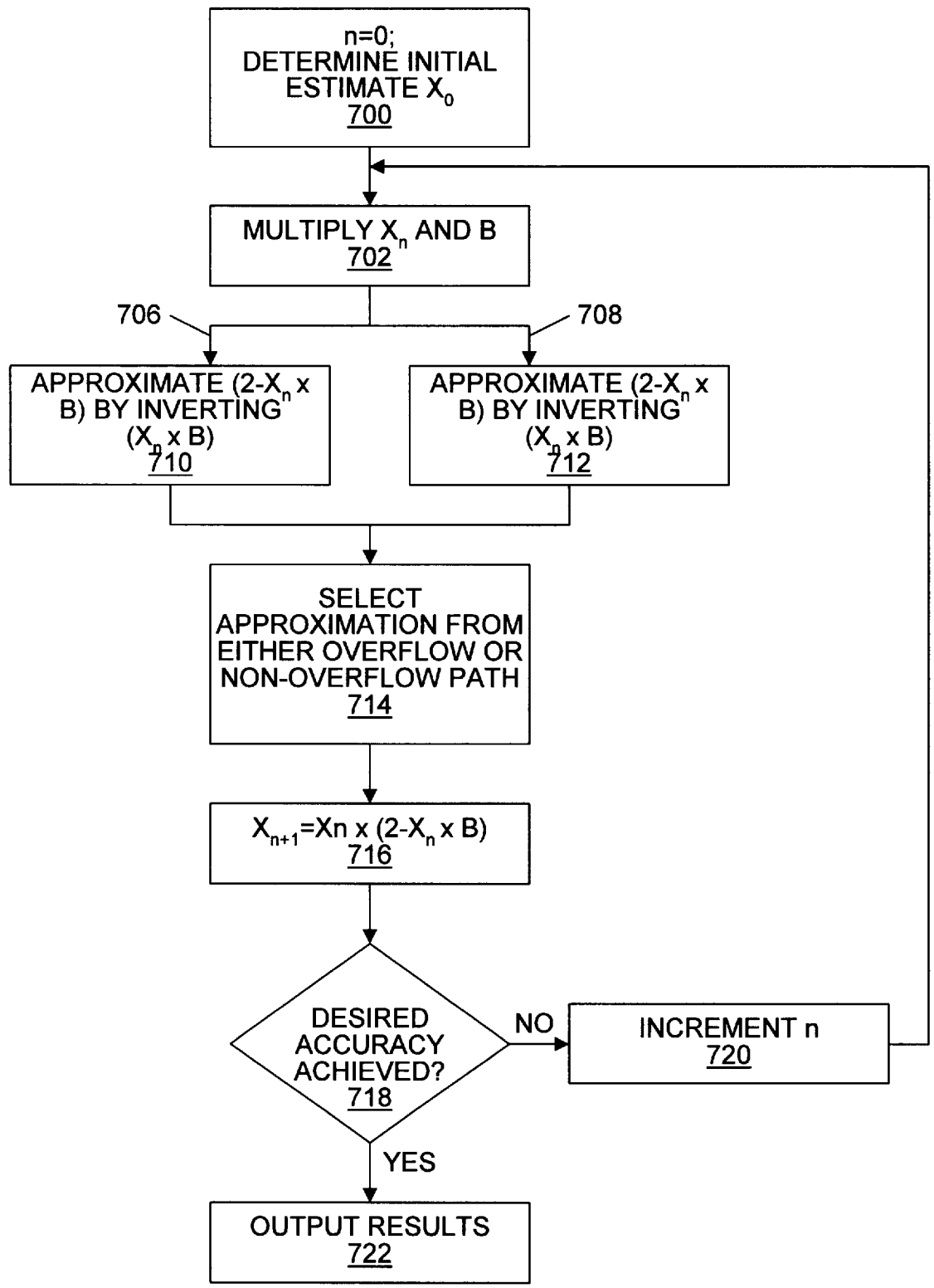
FIG. 24 is a flowchart illustrating one embodiment of a method for calculating the reciprocal of an operand.

Turning now to FIG. 24, a flowchart depicting one embodiment of a method to calculate the reciprocal using multiplier 50 is shown. As previously noted, $X_0$ is calculated first (step 700). Once $X_0$ is determined, it is multiplied by B (step 702). The results are then routed down two parallel paths 706 and 708, one that assumes an overflow took place in the multiplication (path 706), and another that assumes no overflow occurred (path 708). Because $X_0$ is close to 1/B, the product of $X_0$ and B will be close to one, i.e., either slightly over one or slightly under one. As a result, an overflow will only occur during the multiplication if the result is slightly greater than one (i.e., of the form 10.000 . . . with an exponent equal to $2^{-1}$). If there is no overflow, the result will be slightly less than one (i.e., in the form 01.111 . . . with an effective exponent equal to $2^{-1}$).

After the multiplication, the term $(2-X_0\times B)$ is formed within each path by inverting the $(X_0\times B)$ results. Since $(X_0\times B)$ is close to one, $(2-X_0\times B)$ may be approximated by the absolute value of the two's complement of $(X_0\times B)$. To further speed the calculation, the one's complement may be used because it only differs by a one in the least significant digit. The approximations for $(2-X_0\times B)$ are performed in parallel within each path (steps 710 and 712). Specifically, in overflow path 706, the bits are inverted to get 01.111 . . . (with an effective exponent equaling $2^{-1}$). In non-overflow path 708, the bits are inverted to get 10.000 . . . (with an effective exponent equaling $2^{-1}$). Note that the sign bit of each intermediate value may also be forced to zero (positive).

Next, either the overflow path result or the non-overflow path result is selected (step 714). This selection can be performed by examining the result from the path that assumes no overflow occurred. If the most significant bit of this result is a one, then an overflow occurred within the non-overflow path, and the result from the overflow path should be selected as the proper result. The corresponding sign and exponent bits are also selected along with the result. Note that different bits may be selected from each path. This is illustrated by the following example. Assuming the product from the multiplier is 64 bits wide, then the bits may be numbered from 0 (the least significant bit) to 63 (the overflow bit), with the binary radix point located between the most significant bit 62 and the most significant fractional bit 61. If an overflow has occurred, bits 62 through 0 are selected with the radix point positioned between bits 62 and 61. If an overflow has not occurred, bits 63 though 0 are selected with the radix point positioned between bits 63 and 62. Thus bits 10.000 . . . may be selected as 1.0000 . . . (along with a hardwired exponent equaling $2^0$). Advantageously, this configuration may save time by normalizing the inverted bits without requiring a dedicated normalization step. Note that other configurations and other widths are contemplated. Furthermore, all the bits from the selected path need not be used. In some embodiments fewer bits may be selected, and in other embodiments extra bits may be padded with constants to meet a desired length.

After the appropriate bits are selected, the result is routed back to the multiplier, which multiplies it with $X_0$ to complete the first iteration and form $X_1$ (step 716). If the desired accuracy has been achieved (step 718), the results are output (step 722). If the desired accuracy has not been achieved (step 720), the iteration is repeated to form $X_2$, wherein $X_2=X_1\times(2-X_1\times B)$. As with the first iteration, the term $(X_1\times B)$ is close to one. The results of the multiplication are once again passed down paths 706 and 708 in parallel.

Depending upon the accuracy of the initial guess $X_0$ and the accuracy desired in the final result, the iteration may be performed any number of times (e.g., one, two, or five times). Using two paths may advantageously eliminate the need for normalization because the exponent and sign bits can be hard-wired based upon the known limits of the incoming operands and whether or not an overflow occurs.

Fast Newton-Raphson Iteration to Calculate the Reciprocal Square Root ($1/\sqrt{B}$)

In another embodiment, multiplier 50 may be configured to calculate the reciprocal square root of an operand B using a modified version of the Newton-Raphson iteration. The equation $Y_{n+1}=Y_n\times(3-B\times Y_n^2)/2$ may be used to calculate the reciprocal square root of B. Once again, the initial estimate, $Y_0$, may be determined in a number of ways, e.g., by using initial estimate generators that perform calculations on seed values read from ROM tables using B. In this iteration $Y_0$ approximately equals $1/\sqrt{B}$. Each subsequent iteration of the equation forces $Y_{n+1}$ to converges on $1/\sqrt{B}$ in a quadratic fashion. In one embodiment, both $Y_0$ and $Y_0^2$ may be produced using the same initial estimate generator that was used for the reciprocal calculation described above. This may be desirable because determining $Y_0^2$ may eliminate the need for a multiplication operation to form $Y_0^2$ from $Y_0$. As used herein, an initial estimate generator refers to any hardware capable of generating an initial value such as $X_0$ or $Y_0$, e.g., one or more ROM tables configured to output seed values that may be used to calculate the initial value using arithmetic and combinational logic.

Figure 25:
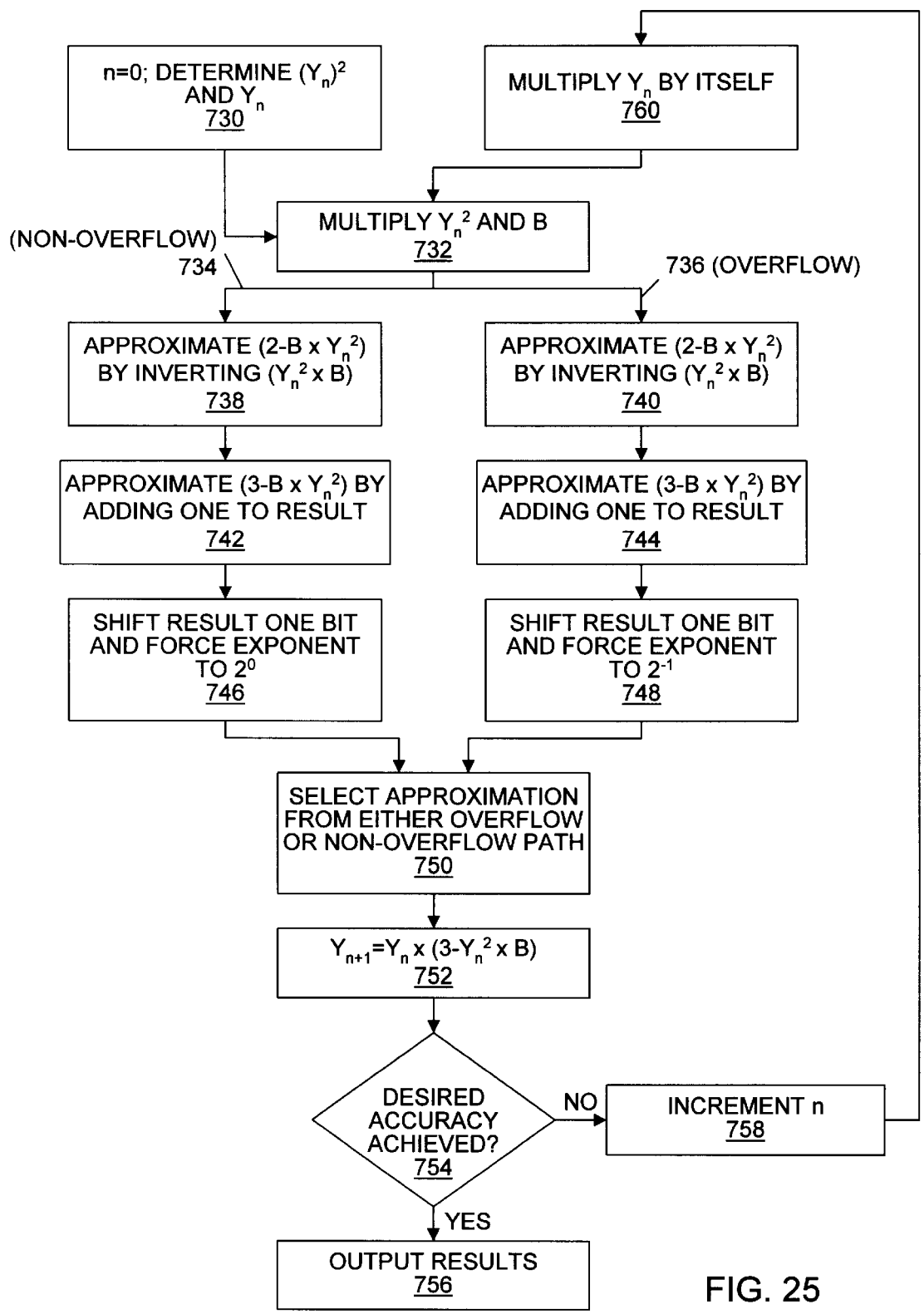
FIG. 25 is a flowchart illustrating one embodiment of a method for calculating the reciprocal square root of an operand.

Turning now to FIG. 25, a flowchart depicting one embodiment of a method to calculate the reciprocal square root using multiplier 50 is shown. As previously noted, $Y_0^2$ and $Y_0$ are determined first (step 730). Once $Y_0^2$ is determined, it is multiplied by B to form the term $(B\times Y_0^2)$ (step 732). The results are then routed down two parallel paths 734 and 736, one that assumes an overflow took place in the multiplication (path 736), and another that assumes no overflow occurred (path 734). Because $Y_0^2$ is close to 1/B, the product of $Y_0^2$ and B will be close to one, i.e., either slightly over or slightly under one. As a result, an overflow will only occur during the multiplication if the result $(B\times Y_0^2)$ is slightly greater than one (i.e., of the form 10.000 . . . with an effective exponent equal to $2^{-1}$). If there is no overflow, the result will be slightly less than one (i.e., in the form 01.111 . . . with an effective exponent equal to $2^{-1}$).

After the multiplication, the overflow path 736 forms the one's complement by inverting the result $(B\times Y_0^2)$ (step 740). The resulting value has the form 01.111 . . . with an effective exponent of $2^{-1}$ and approximates $(2-B\times Y_0^2)$. To form the term $(3-B\times Y_0^2)$, a one is effectively added to the result to form 1.111 . . . with an exponent of $2^0$ (step 744). This value must then be right shifted one bit to reflect the division by two in the term $(3-B\times Y_0^2)/2$(step 748). This results in a value having the form 1.111 . . . with an exponent of $2^{-1}$ (step 748).

The non-overflow path 734 also forms the one's complement by inverting the result $(B\times Y_0^2)$ (step 738). The resulting value, however, has the form 10.000 . . . with an effective exponent of $2^{-1}$. This form is normalized to 1.000 . . . with an exponent of $2^0$, which approximates $(2-B \times Y_0^2)$. To approximate the term $(3-B \times Y_0^2)$, a one is effectively added to the result to form 10.000 . . . (step 742). This value must then be shifted right one bit to reflect the division by two in the term $(3-B \times Y_0^2)/2$ (step 746). The result has the form 1.000 . . . In this path, the result's exponent is forced to $2^0$ (step 746).

Next, either the overflow path result or the non-overflow path result is selected (step 750). This selection can be performed as previously disclosed, i.e., based upon the value of the most significant bit of the result from each path. Different bits may be selected from each path to eliminate the need for normalization.

The selected result is then routed back to the multiplier, which multiplies it with $Y_0$ (determined during step 730) to complete the first iteration and form $Y_1$ (step 752). If the desired accuracy has been achieved (step 754), the results are output (step 756). If the desired accuracy has not been achieved, the iteration is repeated to form $Y_2$, wherein $Y_2 = Y_1 \times (3 \times B \times Y_1^2)/2$ (step 758). However, unlike the first iteration, subsequent iterations may require an additional multiplication to form the term $Y_n^2$ (step 760). As with the first iteration, the term $(B \times Y_1^2)$ is close to one. Once this term has been calculated, the results are once again passed down the two paths (overflow 736 and non-overflow 734) in parallel.

Depending upon the accuracy of the initial guess $Y_0$ and the accuracy desired in the final result, the iterative calculation may be performed any number of times (e.g., one, two, or five times). Advantageously, using two paths (overflow and non-overflow) may eliminate the need for normalization because the exponent and sign bits may be hard coded based upon the known limits of the incoming operands and whether or not an overflow occurs.

Note that the steps in the figures are show in a serial fashion for explanatory purposes only. Some steps may be performed in parallel or in a different order. Further note that the method above may also be used to determine the square root of an operand. To implement the square root function, an additional multiplication may be performed during each iteration.

Figure 26:
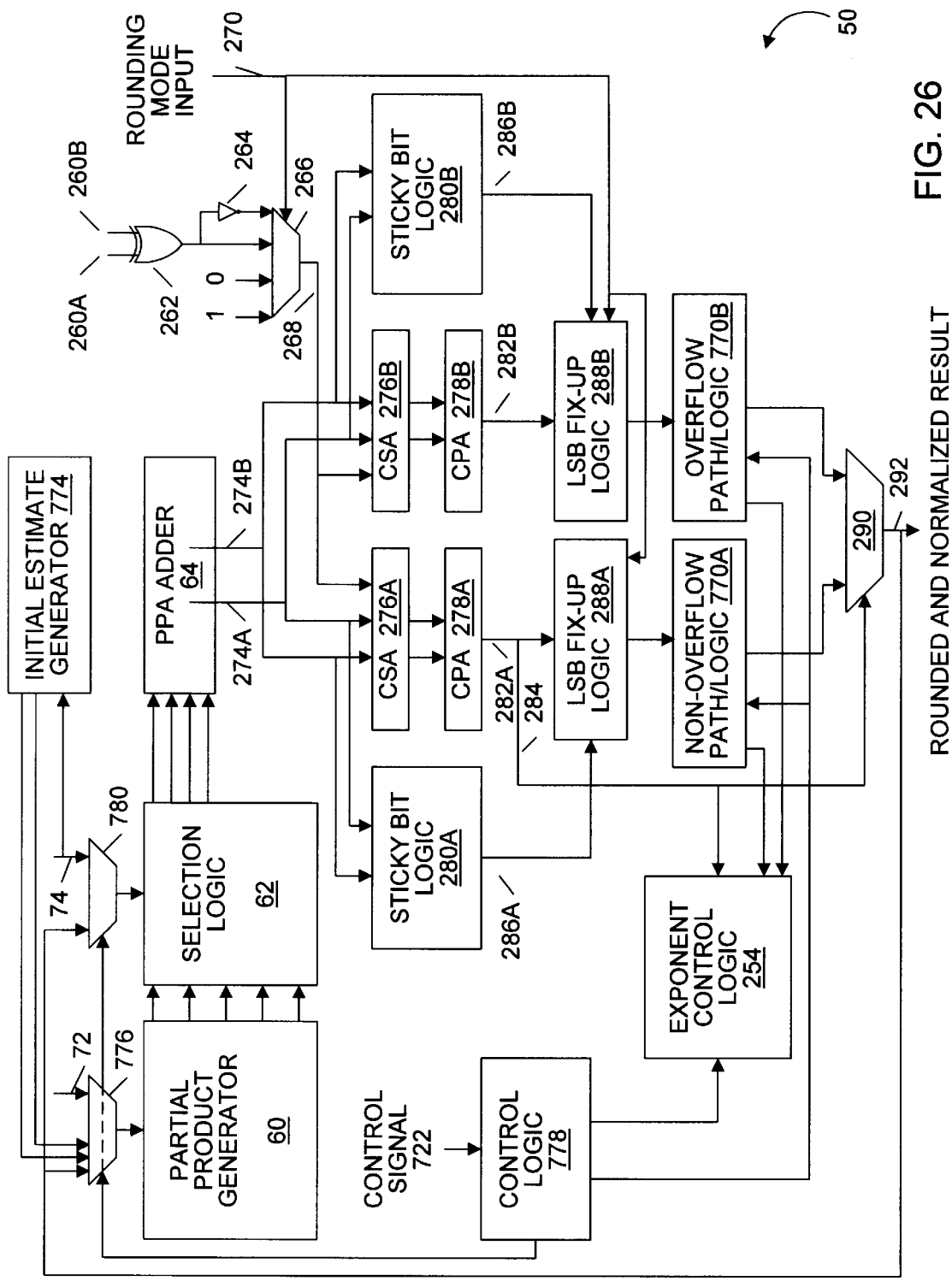
FIG. 26 is a diagram illustrating one embodiment of the multiplier from FIG. 6 that is configured to perform iterative calculations.

Turning now to FIG. 26, an embodiment of multiplier 50 configured to evaluate constant powers of an operand is shown. This embodiment may be configured to evaluate one or more constant powers of an operand such as −1 (reciprocal), −½, (reciprocal square root), and ½ (square root). In addition to the features of the previous embodiments, this embodiment of multiplier 50 comprises a non-overflow logic unit 770A, an overflow logic unit 770B, an initial estimate generator (IEG) 774, two multiplexers 776 and 780, and a control logic 778. Note that non-overflow logic unit 770A and overflow logic unit 770B may also be referred to herein as a "non-overflow path," and "overflow path," respectively.

Initial estimate generator 774 is coupled to receive multiplier operand 74 and communicate initial estimates, e.g., $X_0$ and $Y_0$, to multiplexer 776. Note as used herein, $X_0 = Y_0^2 \approx 1/B$, and $Y_0 \approx 1/\sqrt{B}$. Multiplexer 776 is configured to select the first multiplication operand from either multiplicand operand 72 or the initial estimate output by initial estimate generator 774. Similarly, multiplexer 780 is configured to select the second operand to be multiplied from either multiplier operand 74 or result 292 from multiplexer 290. Control logic 778 receives control signal 772 and controls multiplexers 776 and 780, exponent control logic 254, and logic units 770A–B. Non-overflow logic 770A is coupled to receive values from LSB fix-up logic 288A and output values to multiplexer 290. Similarly, overflow logic 770B is coupled to receive values from LSB fix-up logic 288B and also output values to multiplexer 290. Logic units 770A–B are controlled by control logic unit 778, which indicates which, if any, constant power operation is being performed. If a constant power operation is not being performed, logic units 770A–B may be configured to simply allow values from fix-up logic units 288A–B to propagate through to multiplexer 290 unchanged.

When a constant power operation is being performed, logic units 770A–B are configured to form approximations by inverting selected bits from the values received from fix-up logic units 770A–B. Logic units 770A–B are also configured to force (e.g., hard-wire) the exponents associated with the values received from fix-up logic units 288A–B to fixed values. These fixed exponents are communicated to exponent control logic 254. Alternatively, exponent control logic 254 may force the exponents to fixed constants when instructed to do so by logic units 770A–B. Logic units 770A–B may each comprise a plurality of inverters, a wire shifter, and one or more hard-wired constants. A wire shifter is a plurality of signal, data, or control lines that are selectively connected and or offset to provide fixed shifting and routing. The following examples illustrate the operation of logic units 770A–B and multiplier 50 in more detail.

Example of a Reciprocal Operation

When a reciprocal operation is performed, multiplier 50 receives the operand to be inverted (referred to herein as "operand B") as multiplier operand 74. Initially, multiplexer 780 is configured to select operand B. Initial estimate generator 774 also receives operand B and in response outputs an initial estimate or approximation of the reciprocal (referred to as $X_0$) to multiplexer 776. Multiplexer 776 is configured to select, based upon control signals from control logic 778, the initial estimate, which is then multiplied by operand B to form the quantity $(X_0 \times B)$. The quantity $(X_0 \times B)$ propagates through multiplier 50 until it reaches logic units 770A–770B. Non-overflow logic unit 770A receives a version from fix-up logic 288A that assumes no overflow has occurred. Based upon control signal 772, non-overflow logic unit 770A inverts the version of $(X_0 \times B)$ it receives to approximate the quantity $(2 - X_0 \times B)$. Non-overflow logic unit 770A may be configured to normalize its output by forcing the corresponding exponent to a constant, e.g., $2^0$. Note all references herein are to unbiased exponents. For example, an unbiased exponent $2^0$ may translate to a biased exponent of $2^{7F}$ (assuming a $+7F_{16}$ or $+127_{10}$ bias). Similarly, overflow logic unit 770B receives a version from fix-up logic 288B that assumes an overflow has occurred and inverts it. Overflow logic unit 770B may also be configured to normalize its output by forcing the corresponding exponent to a constant, e.g., $2^{-1}$. Note that in some embodiments, not all bits from fix-up logic units 288A–B may be used or inverted by logic units 770A–B.

Once the overflow and non-overflow approximations for the quantity $(2 - X_0 \times B)$ have been output by logic units 770A–B, multiplexer 290 is configured to select one of the approximations based upon the value of MSB 284 from the output of fix-up logic unit 288A. As previously noted, by looking at the most significant bit a determination of whether an overflow occurred can be made. If an overflow occurred, the approximation for the quantity $(2 - X_0 \times B)$ from logic unit 770B (the overflow path) is selected. If an overflow did not occur, the approximation for the quantity $(2-X_0 \times B)$ from logic unit 770A (the non-overflow path) is selected. Note that other control configurations are possible, e.g., MSB 284 may be the most significant bit of the output from fix-up logic unit 288B.

Once the appropriate approximation for the quantity $(2-X_0 \times B)$ has been selected by multiplexer 290, it is routed to multiplexers 776 and 780. Multiplexer 780 is directed by control logic 778 to select the approximation so that it may be multiplied by initial estimate $X_0$ to form the quantity $X_0 \times (2-X_0 \times B)$. During this multiplication, however, logic units 770A–B are configured to allow the values from fix-up logic units 288A–B to pass through unchanged. The result selected by multiplexer 290 is the approximation of the reciprocal of operand B after one Newton-Raphson iteration. As previously noted, the process may be repeated a number of times to achieve greater accuracy.

Example of a Reciprocal Square Root Operation

When a reciprocal square root operation is performed, multiplier 50 operates in much the same fashion as previously described for a reciprocal operation. The operand to be raised to the $-\frac{1}{2}$ power (referred to herein as "operand B") is received as multiplier operand 74. Initially, multiplexer 780 is configured to select operand B. Initial estimate generator 774 also receives operand B and in response outputs an initial estimate or approximation of the reciprocal (referred to as $Y_0^2$, which equals $X_0$) and the reciprocal square root (referred to as $Y_0$) to multiplexer 776. Multiplexer 776 is configured to select, based upon control signals from control logic 778, the initial estimate $Y_0^2$, which is then multiplied by operand B to form the quantity $Y_0^2 \times B$. The quantity $(Y_0^2 \times B)$ propagates through multiplier 50 until it reaches logic units 770A–770B. Non-overflow logic unit 770A receives a version from fix-up logic 288A that assumes no overflow has occurred. Based upon control signal 772, non-overflow logic unit 770A inverts the version of quantity $(Y_0^2 \times B)$ it receives to approximate the quantity $(2-Y_0^2 \times B)$. Logic unit 770A also pads the most significant bit of the quantity $(2-Y_0^2 \times B)$ with a constant one to approximate the quantity $(3-Y_0^2 \times B)$. Logic unit 770A may then normalize the quantity $(3-Y_0^2 \times B)$ by selectively routing (e.g., wire-shifting) bits to multiplexer 290 in a particular position or offset and by forcing the corresponding exponent to $2^0$.

Overflow logic unit 770B may be similarly configured to invert the version of quantity $(Y_0^2 \times B)$ it receives to approximate the quantity $(2-Y_0^2 \times B)$. Logic unit 770B also pads the most significant bit of the quantity $(2-Y_0^2 \times B)$ with a constant one to approximate the quantity $(3-Y_0^2 \times B)$. Logic unit 770B may then normalize the quantity $(3-Y_0^2 \times B)$ by selectively routing bits to multiplexer 290 in a particular position or offset and by forcing the corresponding exponent to $2^{-1}$. Note that in some embodiments, not all bits from fix-up logic units 288A–B may be used or inverted by logic units 770A–B.

Once the overflow and non-overflow approximations for the quantity $(3-Y_0^2 \times B)$ have been output by logic units 770A–B, multiplexer 290 is configured to select one of the approximations based upon the value of MSB 284 from the output of fix-up logic unit 288A. As previously noted, by looking at the most significant bit a determination of whether an overflow occurred can be made. If an overflow occurred, the approximation for the quantity $(3-Y_0^2 \times B)$ from logic unit 770B (the overflow path) is selected. If an overflow did not occur, the approximation for the quantity $(3-Y_0^2 \times B)$ from logic unit 770A (the non-overflow path) is selected. Other control configurations are also possible.

Once the approximation for the quantity $(3-Y_0^2 \times B)$ has been selected by multiplexer 290, it is routed to multiplexer 780. Multiplexer 780 is directed by control logic 778 to select the approximation so that it may be multiplied by initial estimate $Y_0$ that was read from initial estimate generator 744 to form the quantity $Y_0 \times (3-Y_0^2 \times B)$. During this multiplication, however, logic units 770A–B are configured to allow the values from fix-up logic units 288A–B to pass through unchanged. The result selected by multiplexer 290 is the approximation of the reciprocal square root of operand B after one Newton-Raphson iteration. As previously noted, the process may be repeated a number of times to achieve greater accuracy. However, in subsequent iterations the result must be squared to form $Y_n^2$, which is then used in place of the initial estimate $Y_0^2$ from initial estimate generator 774.

Note other configurations of multiplier 50 are possible and contemplated. For example, non-overflow logic 770A and overflow logic 770B may instead be configured to receive rounded and normalized value 292 from multiplexer 290, in which case a separate multiplexer (not shown) may be needed to select between the values output by non-overflow logic 770A and overflow logic 770B. In some embodiments of multiplier 50, registers may be used to store various intermediate results, e.g., the inputs to multiplexers 776 and 780, and the results from multiplexer 290. The registers may the store the intermediate results for use during subsequent clock cycles.

Figure 27:
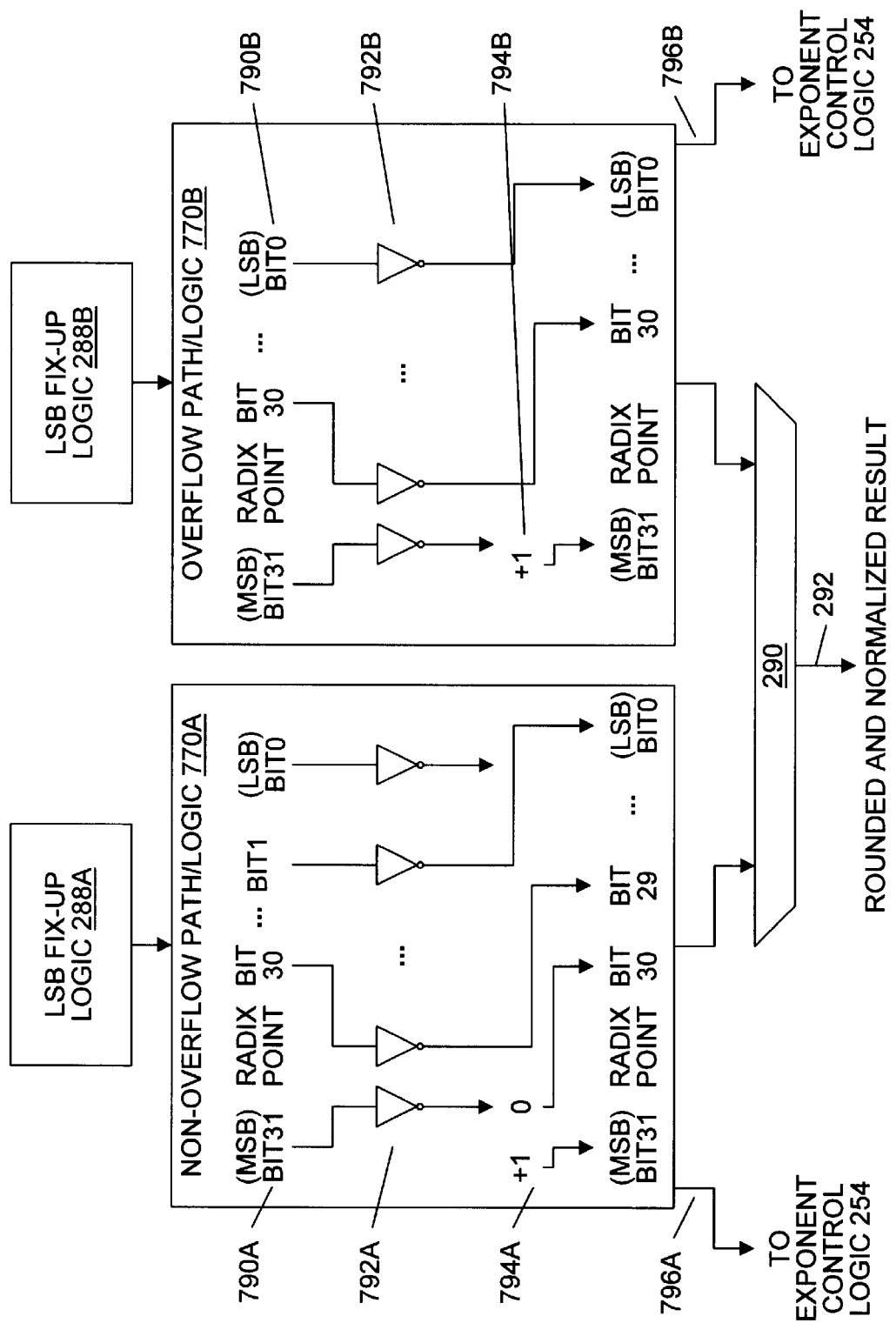
FIG. 27 is a diagram illustrating details of one exemplary embodiment of the non-overflow and overflow logic units from FIG. 26.

Turning to FIG. 27, details of one exemplary embodiment of non-overflow logic unit 770A configured to calculate the quantity $(3-Y_0^2 \times B)$ for the reciprocal square root calculation are shown. When the quantity $(Y_0^2 \times B)$ 790A is received from LSB fix-up logic 228A, inverters 792A invert selected bits to approximate the quantity $(2-Y_0^2 \times B)$. Note that an inverter may not be required for all bits, e.g., the most and least significant bits. Constants 794A are then used to replace the most significant bit of the quantity $(2-Y_0^2 \times B)$ 790A to approximate the quantity $(3-Y_0^2 \times B)$, which is output to multiplexer 290. A constant or control signal may be routed to exponent control logic 254 to force the corresponding exponent to $2^0$.

A numerical example further illustrates the operation of non-overflow logic unit 770A. First, the value $1.111 \ldots \times 2^{-1}$ is received from LSB fix-up logic 228A as an approximation of the quantity $Y_0^2 \times B$) 790A. Next, inverters 792A invert the quantity to generate $10.000 \ldots \times 2^{-1}$ as an approximation of the quantity $(2-Y_0^2 \times B)$. Finally, constants 794A are used to replace the most significant bits. The results are shifted, resulting in the quantity $1.00000 \ldots$, and the corresponding exponent is forced to $2^0$. Note that the most and least significant bits of the quantity $(Y_0^2 \times B)$ 790A may not be incorporated into the quantity $(2-Y_0^2 \times B)$.

Overflow logic 770B operates in a similar fashion. However, the most significant bit of quantity 790B is replaced with only a single constant 794B, and bits 30 through 0 are incorporated into the quantity $(2-Y_0^2 \times B)$. A numerical example further illustrates the operation of overflow logic unit 770B. First, the value $10.000 \ldots \times 2^{-1}$ is received from LSB fix-up logic 228B as an approximation of the quantity $(Y_0^2 \times B)$ 790B. Next, inverters 792B invert the quantity to generate $01.111 \ldots \times 2^{-1}$ as an approximation of the quantity $(2-Y_0^2 \times B)$. Finally, constant 794B is used to replace the most significant bit. The results are shifted, resulting in the quantity $1.1111 \ldots$, and the corresponding exponent is forced to $2^{-1}$.

Figure 28:
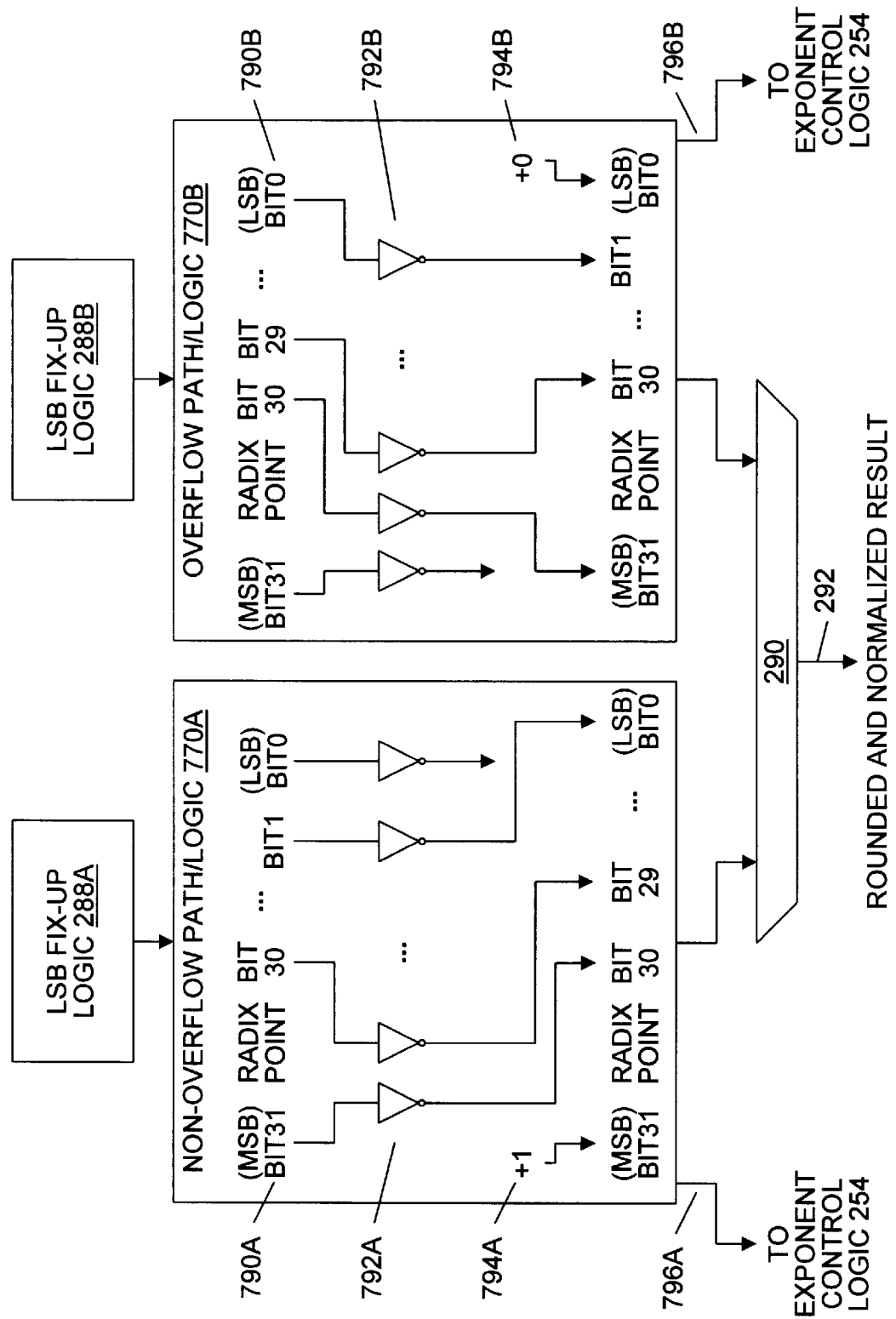
FIG. 28 is a diagram illustrating details of another exemplary embodiment of non-overflow and overflow logic units from FIG. 26.

Turning now to FIG. 28, another exemplary embodiment of non-overflow logic 770A and overflow logic 770B is shown. The embodiments shown in the figure are configured to return the quantity $(2-Y_0^2 \times B)$ for the reciprocal calculation. A numerical example illustrates the operation of non-overflow logic 770A and overflow logic 770B. Assuming non-overflow logic 770A receives a value $1.111 \ldots \times 2^{-1}$ as the quantity $(Y_0^2 \times B)$ 790A, then inverters 792A are used to invert the bits (excluding the least significant bit) to obtain a value $0.000 \ldots$ Constant 796A is then used to pad the most significant bit position. The remaining bits are all shifted one position, with the result $1.0000 \ldots$ being output to multiplexer 290. The corresponding exponent is forced to $2^0$ by signal 796A.

Overflow path 770B operates in a similar fashion. For example, assuming value 790B is $1.000 \ldots \times 2^{-1}$, then inverters 792B generate the value $0.111 \ldots$ which is shifted and output to multiplexer 290 as the value $1.11 \ldots$ Note the least significant bit may be padded with a constant 794B, e.g., zero, while the corresponding exponent is forced to $2^{-1}$ by signal 796B.

Note the examples and figures referred to herein are exemplary. Other configurations for non-overflow logic 770A and overflow logic 770B and multiplier 50 are also contemplated. For example, the least significant bit from quantity 790B may be duplicated instead of using constant 794B. Other constant values may also be used, and the widths of quantities 770A–B may be reduced before they are routed to multiplexer 290 (e.g., from 32 bits to 24 bits). Other logic components may be used in place of inverters 792A–B, and the bit routing structure disclosed above may be replaced by other logic components, e.g., a shifter. The functionality provided by non-overflow logic 770A and overflow logic 770B may be provided in other components internal or external to multiplier 50. In addition, multiplier 50 may be configured to perform both reciprocal and reciprocal square root functions, e.g., by incorporating two versions of non-overflow logic 770A and overflow logic 770B, or by incorporating multiplexers within non-overflow logic 770A and overflow logic 770B to select which routing of bits and constants should be applied.

Compression of Intermediate Products

When performing iterative calculations, multiplier 50 calculates intermediate products which may be stored in registers. During the next iteration, the intermediate product may be read from the register and used as an operand. Unfortunately, each iteration may introduce rounding errors that accumulate in the final result. For example, assuming an N-bit significand, the results from each multiplication have significands that are 2N bits wide. This result may be rounded to N-bits or some other width. The greater the number of iterations, the larger the potential rounding error may be in the final result. For obvious reasons, it is desirable to reduce the magnitude of this rounding error.

One possible method to reduce the rounding error is to calculate extra bits for each intermediate product and then round at lower bit positions. Each iteration may generate accurate bits in lower (less significant) bit positions than the previous iteration. However, due to the fixed size of the storage registers within multiplier 50, the extra bits will not fit unless the registers within multiplier 50 are widened accordingly. There are several potential drawbacks to using wider registers, including the additional die space requirements and the additional architectural state requirements for context switches. Thus, a mechanism for maintaining the accuracy provided by the extra bits without using wider registers may be desirable.

One possible method for providing such extra accuracy without increasing the size of the storage registers is to compress the intermediate results before they are stored. However, not all compression algorithms are well suited for use within multiplier 50. One concern, in particular, is speed. Another concern is the die space required to implement the compression.

Figure 29A:
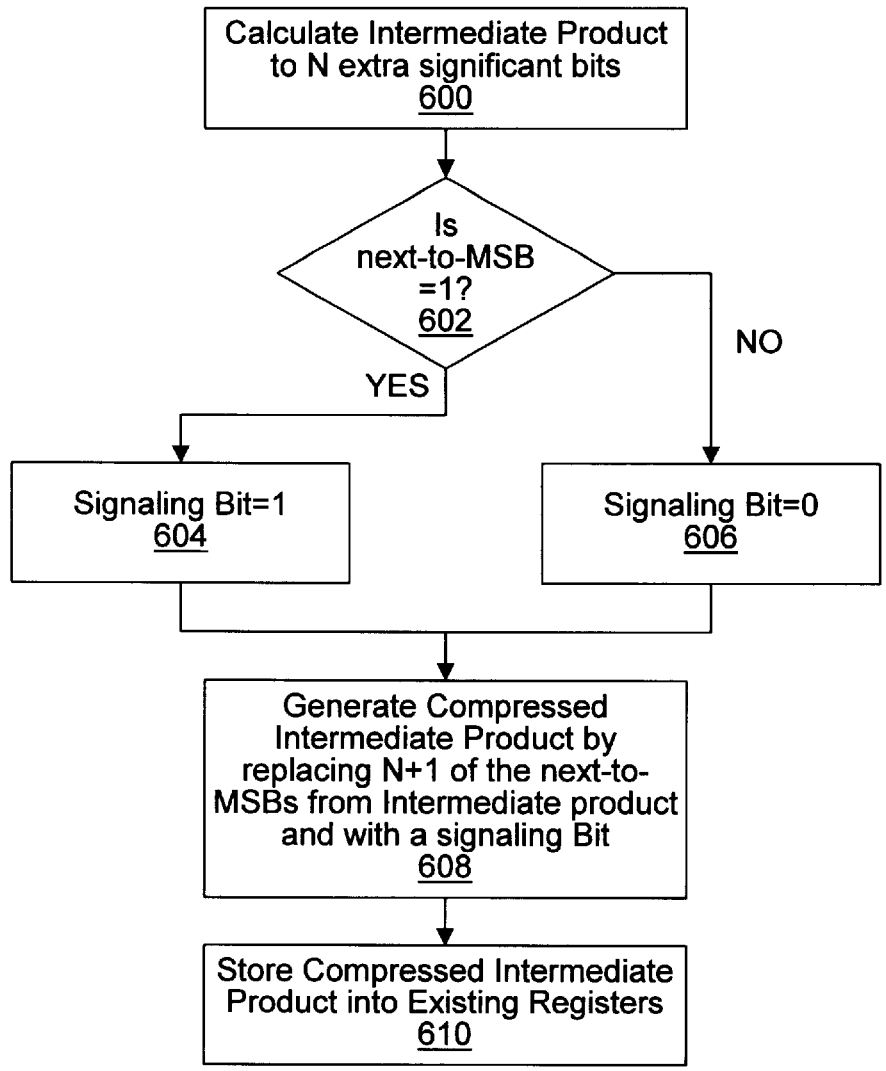
FIG. 29A is a flowchart illustrating one possible method for fast compression.

Turning now to FIG. 29A, a flowchart illustrating one possible method for fast compression is shown. In the embodiment illustrated, the intermediate product is first calculated to N extra significant bits (step 600), wherein N is a predetermined constant. For example, assuming multiplier 50 receives 24-bit operands, multiplier 50 may calculate intermediate products to a precision of 28 bits. In this case, N equals 4 bits. Once the intermediate product is calculated, the next-to-most significant bit is examined (step 602). The value of the next-to-most significant bit determines the value of a signaling bit. If the next-to-most significant bit equals one (step 604), then the signaling bit equals one also. If, on the other hand, the next-to-most significant bit equals zero (step 606), then the signaling bit equals zero. The signaling bit is used to replace a portion of the intermediate product, thereby compressing the intermediate product (step 608). In one embodiment, the portion replaced by the signaling bit is N+1 bits wide. While this method assumes that the portion being replaced comprises entirely one's or zero's, this may be a safe assumption when certain types of iterations are being performed. For example, when performing the Newton-Raphson iterations previously disclosed for calculating the square root and inverse square root, the products $(2-B \times X_n)$ and $(3-B \times Y_n^2)$ are formed during each iteration. As previously noted, these product are very close to one (e.g., either slightly over one, $1.00000000 \ldots \times 2^0$, or slightly under one, $1.11111111 \ldots \times 2^{-1}$). Accordingly, many of the leading bits (excluding the most significant bit in some cases) of the products are identical, i.e., either all zeros or ones, from one iteration to the next with differences occurring in the less significant bits. This property allows the method illustrated in FIG. 29A to be used effectively.

The maximum number of bits that may be compressed in a particular implementation may be determined by examining the number of bits that have the same values over the entire range of possible operand values. For example, if an embodiment using a 32-bit significand is determined to have nine bits that have the same value for all possible operand values, then the 32-bit results may compressed so that they may be stored in 24-bit registers.

While the present embodiment illustrated in the figure performs the compression whenever a particular iterative calculation is performed, in other embodiments the compression may be performed conditionally. For example, in one embodiment the compression may be performed only if a comparison of the bits to be compressed shows that they all have the same value. While many different types of hardware may be used to perform this comparison, one possible configuration may utilize multiple input AND gates and multiple input NAND gates. If the testing logic determines that the bits to be compressed do not all have the same value, then the operand may stored by truncating the extra least significant bits. While this implementation may lose the benefit of increased accuracy in some cases, this may be adequate if the bits to be compressed rarely have different values.

Figure 29B:
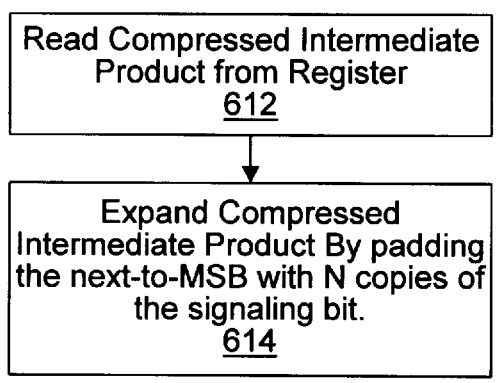
FIG. 29B is a flowchart illustrating one possible method for fast decompression.

When the compressed intermediate product is needed for the next iteration, it may be decompressed. Turning now to FIG. 29B, one possible method for decompressing the compressed intermediate product is illustrated. First, the compressed intermediate product is read from the storage register (step 612). Next, the compressed intermediate product is expanded by padding the next-to-most significant bits with copies of the signaling bit (step 614). The number of copies of the signaling bit that are padded or inserted below the most significant bit in this embodiment equals N-1. Advantageously, the expanded intermediate product now has the same width as the original intermediate product. For example, if the compressed intermediate product comprises 24 bits, and the original intermediate product comprises 28 bits, then the signaling bit will be copied 4 times to render an expanded intermediate product having 28 bits. Advantageously, using the methods illustrated in FIGS. 29A and 29B, no information is lost in the compression and decompression process.

Note that the bits replaced by the signaling bit need not be the most significant bit. They may begin with the next-to-most significant bit. For example, if the most significant bit of the intermediate product is bit 27, the bits replaced by the signal bit may comprise bits 22 through 26. Further note that the signaling bit may simply be a particular bit within the intermediate product, i.e., an extra calculation to determine the signal bit is not required. Furthermore, the signal bit need not be the most significant or least significant bit in the range of bits to be compressed, i.e., the signal bit may be a bit in the middle of the range of bits to be compressed.

Figure 30:
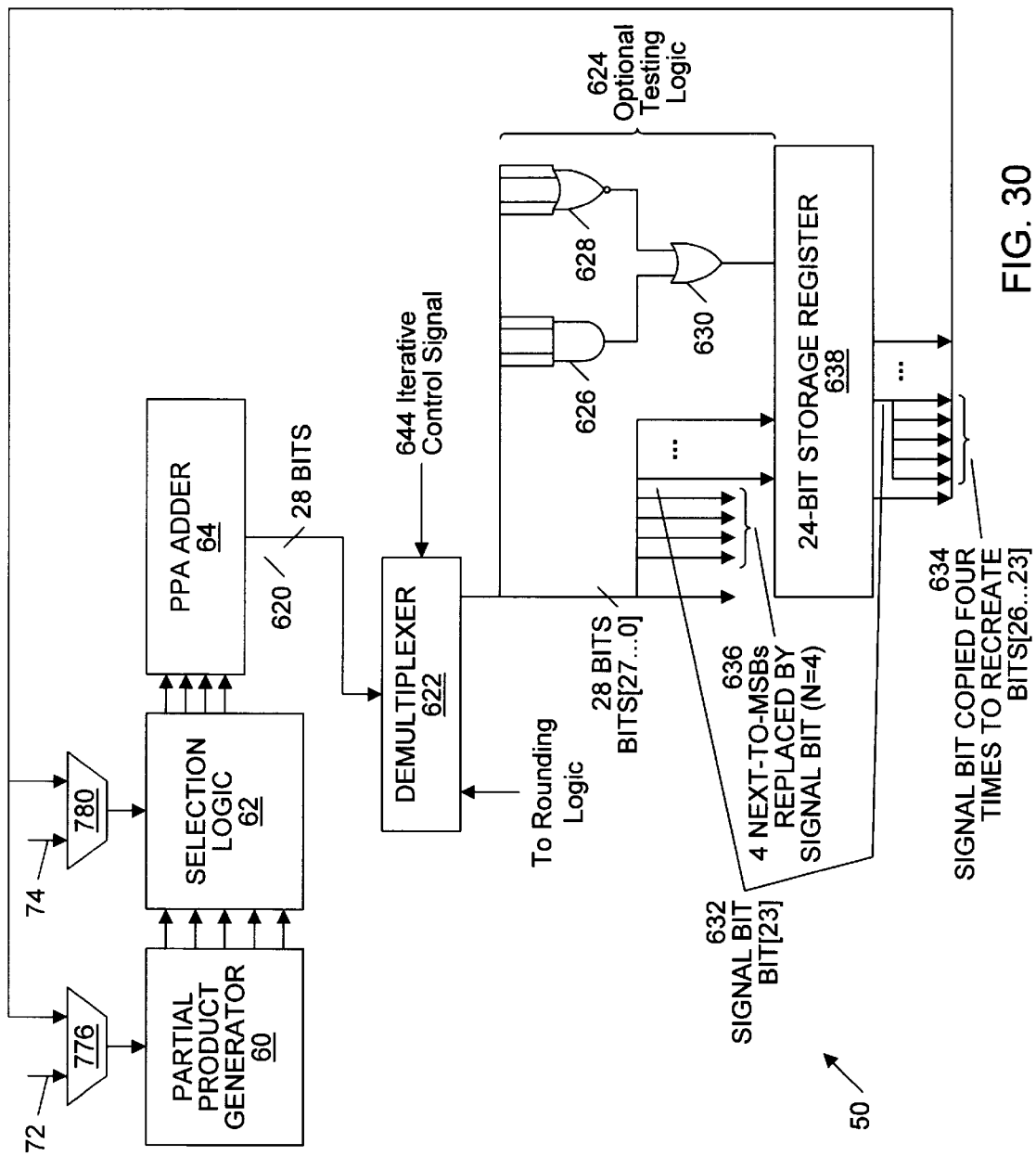
FIG. 30 is a diagram illustrating one embodiment of the multiplier from FIG. 4 configured to compress intermediate products.

Turning now to FIG. 30, one embodiment of multiplier 50 configured to compress intermediate products is shown. As in previous embodiments, this embodiment of multiplier 50 comprises partial product generator 60, selection logic 62, and partial product array adder 64. This embodiment also comprises demultiplexer 622, 24-bit storage register 638, and multiplexers 776 and 780. Demultiplexer 622 receives an intermediate product 620 from partial product array adder 64. Other embodiments are also contemplated. For example, demultiplexer 622 may receive intermediate product 620 from multiplexer 290 (see FIG. 26). Demultiplexer 622 routes intermediate product 620 according to an iterative control signal 644. For example, if iterative control signal 644 indicates that an iterative operation is being performed, then intermediate product 620 is routed to storage register 638. If, on the other hand, iterative control signal 644 indicates that an iterative operation is not being performed, then intermediate product 620 may be routed to standard rounding logic (not shown) and then output. In another embodiment, intermediate product 620 may be rounded before reaching demultiplexer 622. In this case, demultiplexer 622 may simply route product 620 to an output of multiplier 50 if an iterative calculation is not being performed.

In the event an iterative operation is being performed, storage register 638 is configured to store intermediate product 620 until it is needed for the next iteration. The signal and data lines coupled to the inputs and outputs of storage register 638 may be referred to herein as a wire shifter because they provide a fixed shifting function. As previously noted, storage register 638 may be implemented so that it is smaller than intermediate product 620. Assuming, for example, that intermediate product is 28 bits wide, storage register 638 may be configured to store only the 24 least significant bits of intermediate product 620. Assuming the five next-to-most significant bits of intermediate product 620 all have the same value for the particular iteration being performed, then bit 22 may be selected as a signal bit 632 to replace the four next-to-most significant bits 636. Thus, as the figured illustrates, storage register 638 may be configured to store bits 0–21, signal bit 632, and bit 27.

When the next iteration is performed, bits 0–21, signal bit 632, and bit 27 are read from storage register 638. To recreate the full 28 bits of intermediate product 620, signal bit 632 is copied four times to recreate bits 23–26. Advantageously, no information from intermediate product 620 is lost in the compression and decompression cycle.

Multiplier 50 may also be configured with optional testing logic 624, which is configured to determine whether the five most significant bits from intermediate product 620 have the same value. In one embodiment, testing logic 624 may comprise five-input AND gate 626, five-input NOR gate 628, and two-input OR gate 630. The output from two-input OR gate 630 may be used in a number of ways, e.g., to signal an error condition or to cause register 638 to store the 24 most significant bits without compression.

In some embodiments, testing logic 624 may be omitted. Furthermore, demultiplexer 622 may also be omitted. In such embodiments, product 620 may be rounded and then routed to both storage register 638 and the outputs of multiplexer 50. In the event of an iterative calculation, external logic may be used to ensure that functional units or other parts of the microprocessor will not use the data output by multiplier 50 until the iterative calculation is completed.

Figure 31A:
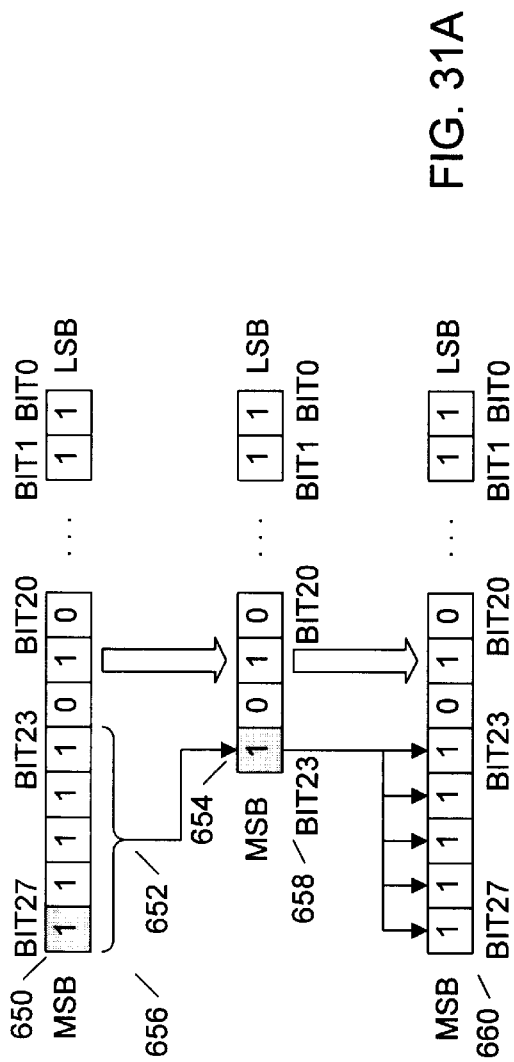
FIG. 31A is a figure illustrating one possible method for compression.

Turning now to FIG. 31A, a figure illustrating one possible method for compression is shown. As the figure illustrates, uncompressed intermediate product 656 may comprise 28 bits numbered 0 through 27. If the five most significant bits 652 from intermediate product 656 all have the same value, they may be compressed into one signal bit 654. This allows uncompressed intermediate product 656 to be represented and stored as compressed intermediate product 658, thereby using only 24 bits. When compressed intermediate product 658 is uncompressed, signal bit 654 is copied four times to create the four most significant bits of uncompressed intermediate product 660.

Figure 31B:
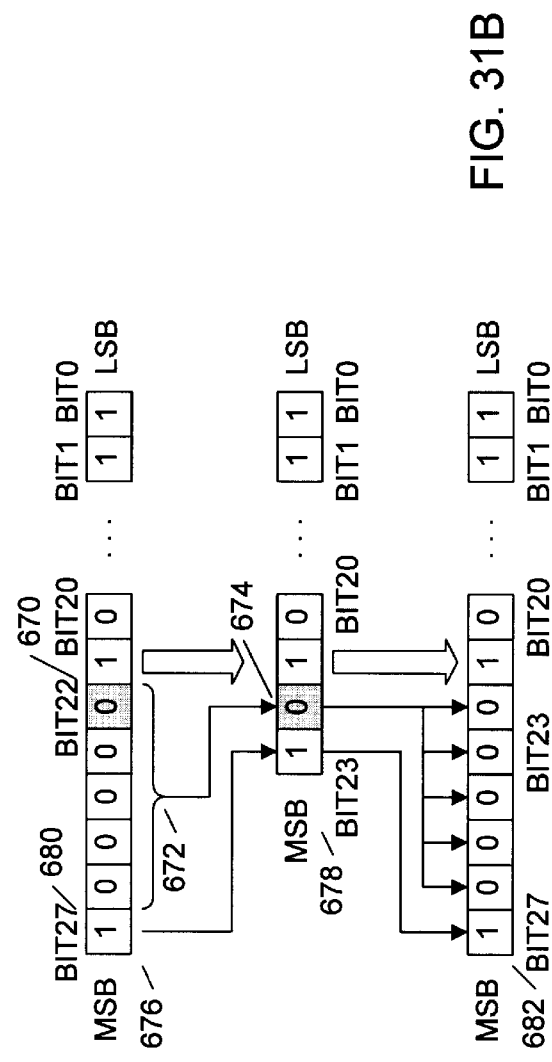
FIG. 31B is a figure illustrating another possible method for compression.

Turning now to FIG. 31B, a figure illustrating another possible method for compressing intermediate product is shown. In this embodiment, intermediate product 676 is characterized by having five equal bits 672 directly below most significant bit 680. As the figure illustrates, the five equal bits 672 may be compressed into one signal bit 674 even though they are not the most significant bits in intermediate product 676. Compressed product 678 is still able to fit within a 24 bit storage register. To decompress compressed product 678, four copies of signal bit 674 are inserted below most significant bit 680 within uncompressed product 682. Once again, no information from intermediate product 676 is lost in the process. As this example illustrates, the contemplated compression method may be used regardless of where the bits having equal values are located. Advantageously, no information is lost if the bits having equal values are located in the same position in each iteration.

Achieving Higher Frequencies of Exactly Rounded Results

When an infinitely precise result is rounded to the nearest machine number, the maximum possible error is one-half of a unit in the last place (ulp). When performing an iterative calculation such as the Newton-Raphson iterations discussed above for the reciprocal and reciprocal square root, the results converge toward the infinitely precise result. However, due to limitations in the number of bits of precision that are available, the number of iterations performed, and the approximations discussed above to improve the speed of each iteration, some input operands may generate results from multiplier 50 that do not equal the infinitely precise result rounded to the nearest machine number (also referred to as the "exactly rounded result"). This holds true even when each iteration is configured to use the "round to nearest" rounding mode.

Thus, it would be desirable to increase the frequency or probability that the calculated result equals the exactly rounded result. One method to determine whether the calculated result equals the exactly rounded result is to multiply the calculated result (calculated to at least one extra bit of accuracy, i.e., N+1 bits) and the original operand B (assuming the reciprocal of B has been calculated). The exactly rounded result may then be selected from the following three values: the N-bit result (without the extra bit) plus one in the least significant bit; the N-bit result minus one in the least significant bit; or the N-bit result plus zero. The exactly rounded result is selected based upon the value of the extra computed bit (i.e., bit N+1) and whether the result of multiplication was greater than one, less than one, or equal to one.

Rather than computing the exactly rounded result with a probability of one as described above (i.e., performing an extra multiplication step), multiplier 50 may be configured to achieve nearly the same accuracy (i.e., computing the exactly rounded result with a probability close to one) by adding an "adjustment constant" to the result produced from the last step of the iterative calculation before rounding. Depending upon the actual implementation of the multiplier (e.g., the number of bits of precision, the number of iterations performed, and the accuracy of the initial approximation) the probability that the calculated result is higher than the exactly rounded result ("$P_{high}$") may be greater than the probability that the calculated result is lower than the exactly rounded result ("$P_{low}$") If this is the case, then adding a negative adjustment constant in the final step of the iteration may increase the probability that the calculated result will equal the exactly rounded result ("$P_{equal}$"). Similarly, if $P_{high}$ is less than $P_{low}$, then adding a positive adjustment constant may increase $P_{equal}$. The probabilities $P_{high}$, $P_{low}$, and $P_{equal}$ may be determined by passing a large number of differing input operand values through the iterative calculation (as performed by the multiplier) and then comparing each result with the corresponding exactly rounded result. A computer program may be particularly useful in performing the comparisons. The comparisons may also be performed before rounding, i.e., comparing the infinitely precise results with the results from the multiplier's final iteration before they are rounded.

Turning now to FIG. 32, an embodiment of multiplier 50 configured to add a correction constant is shown. Generally, multiplier 50 may be configured similarly to other embodiments disclosed herein that are capable of performing iterative calculations. However, in this embodiment control logic 778 is configured to convey adjustment constant 800 to partial product array adder 64 during the last step of an iterative calculation. Partial product array adder 64 then sums adjustment constant 800 with the selected partial products from selection logic 62. Advantageously, this configuration may not require an additional set of adders to sum adjustment constant 800 into the result. Another potential advantage of this configuration is that any overflows or denormalizations that occur as a result of adjustment constant 800 are addressed by the rounding and normalization process already built into multiplier 50 (i.e., carry-save adders 276A–B, carry-propagate adders 278A–B, sticky bit logic units 280A–B, LSB fix-up logic units 288A–B, and logic units 770A–B).

In another embodiment, adjustment constant 800 may instead be summed into the result by carry-save adders 276A–B and or carry-propagate adders 278A–B. Another embodiment may incorporate an extra adder (not shown) to sum adjustment constant 800 with result 292 from multiplexer 290. However, this configuration may require additional logic in the event the result becomes denormalized or experiences an overflow as a result of the addition.

Control logic 778 may be configured to convey adjustment constant 800 to partial product array adder 64 during the final multiplication in each iteration, or just for the final multiplication during the final iteration. For example, if the iterative calculation involves two multiplication operations for each iteration, and three iterations are required to achieve the desired accuracy, then control logic 778 may be configured to convey adjustment constant 800 during the final multiplication of each iteration, i.e., three times, or only once during the second multiplication of the third and final iteration. In yet another embodiment, control logic 778 may convey adjustment constant 800 to partial product adder 64 during every multiplication in the iteration.

In yet another embodiment, control logic unit 778 may store a number of different adjustment constants 800, e.g., one for each type of iteration. In such a configuration, control logic unit 778 may convey the appropriate adjustment constant that corresponds to the type of iterative calculation being performed. Control logic unit 778 receives an indication of which iterative calculation is being perform via control signal 722. For example, when control signal 722 indicates that the reciprocal iterative calculation is to be performed, control logic 778 may convey a first adjustment constant 800 to partial product array adder 64. However, when control signal 722 indicates that the reciprocal square root iterative calculation is being performed, control logic 778 may convey a second, different adjustment constant to partial product array adder 64.

In another embodiment, multiplier 50 may be configured to calculate three versions of each result, i.e., a first result generated without adding an adjustment constant, a second result generated by adding an adjustment constant, and a third result generated by subtracting the adjustment constant. Alternatively, the second and third results could be calculated by adding different adjustment constants. These results may be calculated in parallel by multiplier 50. Once the result without the adjustment constant is generated, a multiplication may be performed as described above to determine whether the result is correct, too high, or too low. The corresponding result may then be selected.

Exemplary Configuration Using Two Multipliers

Figure 33A:
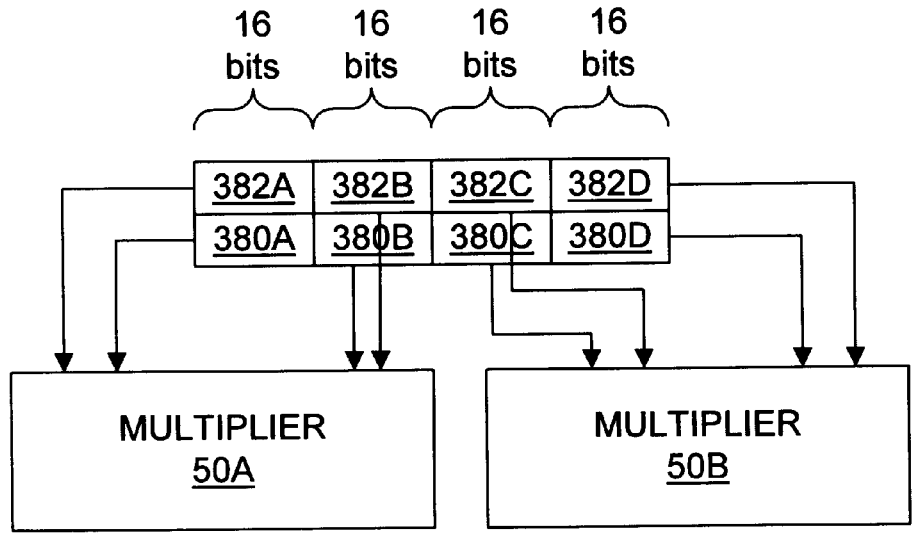
FIG. 33A is a diagram illustrating an example of a vector multiplication using two multipliers.

Turning now to FIG. 33A, an example of a vector multiplication using two multipliers 50A and 50B is shown. Multipliers 50A and 50B may be configured similarly to multiplier 50 as described in previous embodiments. As shown in the figure, multipliers 50A and 50B are configured to operate in parallel to execute a vector multiplication of a pair of vectors each comprising four 16-bit operands 380A–380D and 382A–382D. Note operands 380A–380D may come from a first 64-bit MMX register, while operands 382A–382D may come from a second 64-bit MMX register.

Figure 33B:
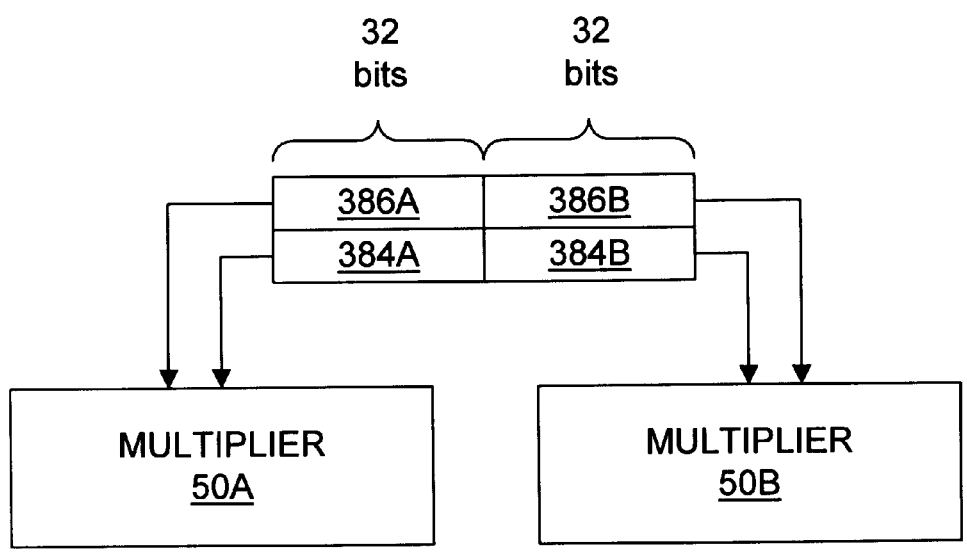
FIG. 33B is a diagram illustrating another example of a multiplication using two multipliers.

Turning now to FIG. 33B, another example of a vector multiplication using multipliers 50A and 50B is shown. In this configuration, multipliers 50A and 50B operate in parallel to multiply a pair of vectors each comprising two 32-bit operands 384A–384B and 386A–386B. Once again, operands 384A–384B may come from a first 64-bit MMX register, while operands 386A–386B may come from a second 64-bit MMX register. Further note that while a vector operation is being performed, each individual multiplier 50A and 50B is performing a scalar multiplication. Other modes of operation are also contemplated, for example, multiplier 50A may perform a 32-bit scalar multiplication independent from multiplier 50B. While multiplier 50A performs the multiplication, multiplier 50B may sit idle or perform an independent multiplication operation.

Exemplary Computer System Using Multiplier

Figure 34:
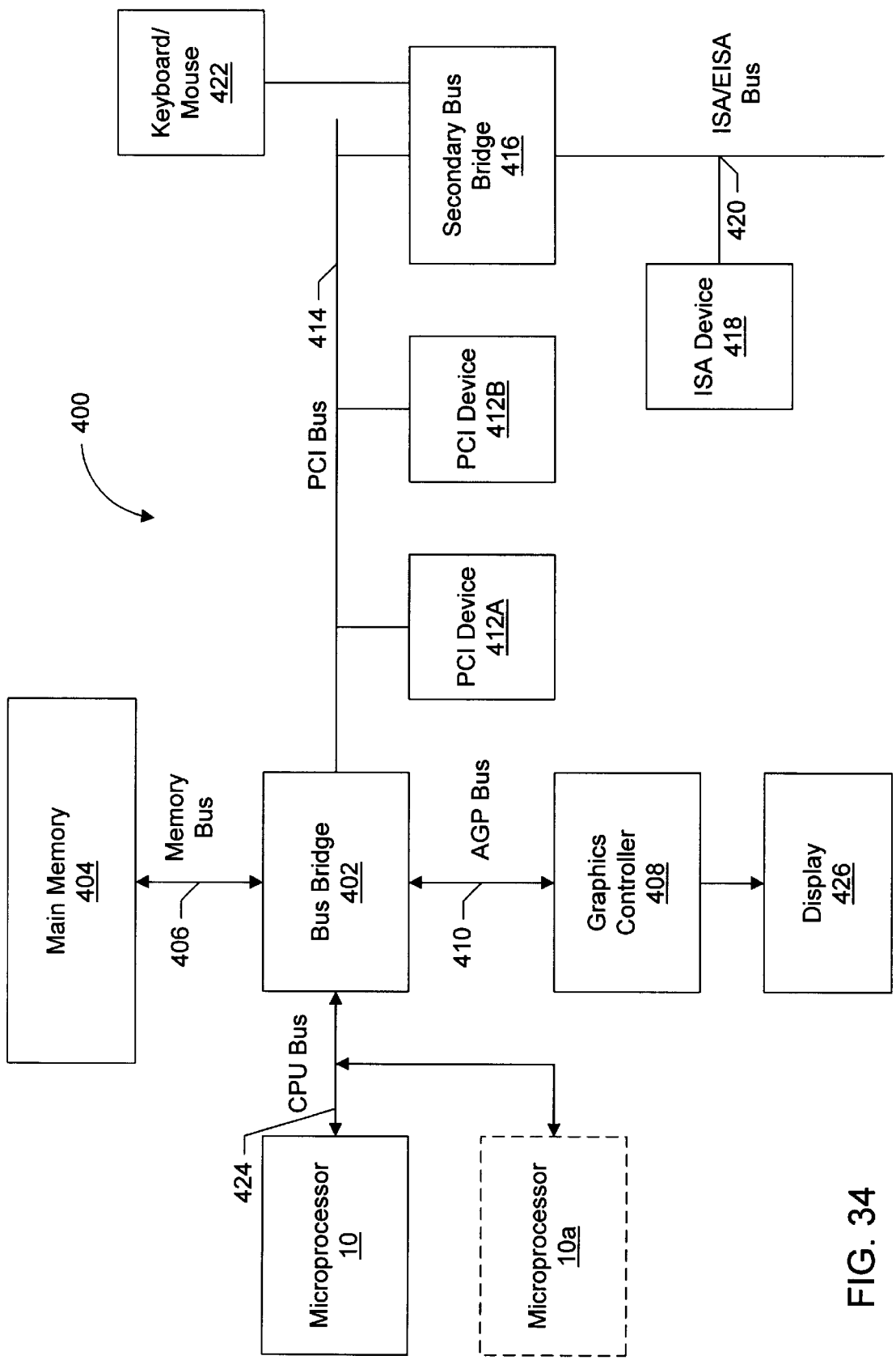
FIG. 34 is a block diagram of one embodiment of a computer system configured to utilize the microprocessor of FIG. 3.

Turning now to FIG. 34, a block diagram of one embodiment of a computer system 400 including microprocessor 10 is shown. Microprocessor 10 is coupled to a variety of system components through a bus bridge 402. Other embodiments are possible and contemplated. In the depicted system, a main memory 404 is coupled to bus bridge 402 through a memory bus 406, and a graphics controller 408 is coupled to bus bridge 402 through an AGP bus 410. Finally, a plurality of PCI devices 412A–412B are coupled to bus bridge 402 through a PCI bus 414. A secondary bus bridge 416 may further be provided to accommodate an electrical interface to one or more EISA or ISA devices 418 through an EISA/ISA bus 420. Microprocessor 10 is coupled to bus bridge 402 through a CPU bus 424.

Bus bridge 402 provides an interface between microprocessor 10, main memory 404, graphics controller 408, and devices attached to PCI bus 414. When an operation is received from one of the devices connected to bus bridge 402, bus bridge 402 identifies the target of the operation (e.g. a particular device or, in the case of PCI bus 414, that the target is on PCI bus 414). Bus bridge 402 routes the operation to the targeted device. Bus bridge 402 generally translates an operation from the protocol used by the source device or bus to the protocol used by the target device or bus.

In addition to providing an interface to an ISA/EISA bus for PCI bus 414, secondary bus bridge 416 may further incorporate additional functionality, as desired. For example, in one embodiment, secondary bus bridge 416 includes a master PCI arbiter (not shown) for arbitrating ownership of PCI bus 414. An input/output controller (not shown), either external from or integrated with secondary bus bridge 416, may also be included within computer system 400 to provide operational support for a keyboard and mouse 422 and for various serial and parallel ports, as desired. An external cache unit (not shown) may further be coupled to CPU bus 424 between microprocessor 10 and bus bridge 402 in other embodiments. Alternatively, the external cache may be coupled to bus bridge 402 and cache control logic for the external cache may be integrated into bus bridge 402.

Main memory 404 is a memory in which application programs are stored and from which microprocessor 10 primarily executes. A suitable main memory 404 comprises DRAM (Dynamic Random Access Memory), and preferably a plurality of banks of SDRAM (Synchronous DRAM).

PCI devices 412A–412B are illustrative of a variety of peripheral devices such as, for example, network interface cards, video accelerators, audio cards, hard or floppy disk drives or drive controllers, SCSI (Small Computer Systems Interface) adapters and telephony cards. Similarly, ISA device 418 is illustrative of various types of peripheral devices, such as a modem, a sound card, and a variety of data acquisition cards such as GPIB or field bus interface cards.

Graphics controller 408 is provided to control the rendering of text and images on a display 426. Graphics controller 408 may embody a typical graphics accelerator generally known in the art to render three-dimensional data structures which can be effectively shifted into and from main memory 404. Graphics controller 408 may therefore be a master of AGP bus 410 in that it can request and receive access to a target interface within bus bridge 402 to thereby obtain access to main memory 404. A dedicated graphics bus accommodates rapid retrieval of data from main memory 404. For certain operations, graphics controller 408 may further be configured to generate PCI protocol transactions on AGP bus 410. The AGP interface of bus bridge 402 may thus include functionality to support both AGP protocol transactions as well as PCI protocol target and initiator transactions. Display 426 is any electronic display upon which an image or text can be presented. A suitable display 426 includes a cathode ray tube ("CRT"), a liquid crystal display ("LCD"), etc.

It is noted that, while the AGP, PCI, and ISA or EISA buses have been used as examples in the above description, any bus architectures may be substituted as desired. It is further noted that computer system 400 may be a multiprocessing computer system including additional microprocessors (e.g. microprocessor 10a shown as an optional component of computer system 400). Microprocessor 10a may be similar to microprocessor 10. More particularly, microprocessor 10a may be an identical copy of microprocessor 10. Microprocessor 10a may share CPU bus 424 with microprocessor 10 (as shown in FIG. 5) or may be connected to bus bridge 402 via an independent bus.

It is still further noted that the present discussion may refer to the assertion of various signals. As used herein, a signal is "asserted" if it conveys a value indicative of a particular condition. Conversely, a signal is "deasserted" if it conveys a value indicative of a lack of a particular condition. A signal may be defined to be asserted when it conveys a logical zero value or, conversely, when it conveys a logical one value. Additionally, various values have been described as being discarded in the above discussion. A value may be discarded in a number of manners, but generally involves modifying the value such that it is ignored by logic circuitry which receives the value. For example, if the value comprises a bit, the logic state of the value may be inverted to discard the value. If the value is an n-bit value, one of the n-bit encodings may indicate that the value is invalid. Setting the value to the invalid encoding causes the value to be discarded. Additionally, an n-bit value may include a valid bit indicative, when set, that the n-bit value is valid. Resetting the valid bit may comprise discarding the value. Other methods of discarding a value may be used as well.

Although the embodiments above have been described in considerable detail, other versions are possible. Numerous variations and modifications will become apparent to those skilled in the art once the above disclosure is fully appreciated. It is intended that the following claims be interpreted to embrace all such variations and modifications.

What is claimed is:

1. A processor capable of calculating the reciprocal of an operand B comprising:

an initial estimate generator configured to receive said operand B and output an initial estimate $X_0$ of the reciprocal of the operand;

a multiplier coupled to receive said operand and said initial estimate, wherein said multiplier is configured to calculate a product of said initial estimate and said operand;

an overflow logic unit coupled to invert and normalize selected bits from said product to form a first approximation of the quantity $(2-X_0 \times B)$, wherein said first approximation assumes an overflow has occurred in said multiplier;

a non-overflow logic unit coupled to receive and invert selected bits from said product to form a second approximation of the quantity $(2-X_0 \times B)$, wherein said second approximation assumes an overflow has not occurred in said multiplier; and a multiplexer configured to select either said first or second approximations.

2. The processor as recited in claim 1, wherein said multiplier is configured to receive the selected approximation of the quantity $(2-X_0 \times B$ from said multiplexer and the initial estimate $X_0$ from said initial estimate generator, and wherein said multiplier is configured to multiply said selected approximation of the quantity $(2-X_0 \times B)$ and said initial estimate $X_0$ to form a result approximating the quantity $X_0 \times (2-X_0 \times B)$.

3. The processor as recited in claim 2, wherein said multiplier, said overflow logic unit, said non-overflow logic unit, and said multiplexer are each configured to repeat their respective operations using said result approximating the quantity $X_0 \times (2-X_0 \times B)$ from said multiplier in place of said initial estimate.

4. The processor as recited in claim 2, wherein said multiplier, said overflow logic unit, said non-overflow logic unit, and said multiplexer are each configured to repeat their respective operations a predetermined number of times using said result approximating the quantity $X_0 \times (2-X_0 \times B)$ from said multiplier in place of said initial estimate.

5. The processor as recited in claim 2, wherein said first approximation comprises a first exponent and a first mantissa, wherein said non-overflow logic unit is configured to replace said first exponent with a first constant, and wherein said second approximation comprises a second exponent and a second mantissa, wherein said non-overflow logic unit is configured to replace said second exponent with a second constant.

6. The processor as recited in claim 5, wherein said overflow logic unit and said non-overflow logic unit are configured to perform independently and in parallel.

7. The processor as recited in claim 2, wherein said multiplexer is configured to select either a first predetermined set of bits from said first approximation, or a second predetermined set of bits from said second approximation, wherein the selected set of bits is normalized.

8. A processor capable of evaluating a constant power of an operand comprising:

an initial estimate generator configured to receive said operand and output an initial estimate of said operand raised to said constant power;

a multiplier coupled to receive said operand and said initial estimate, wherein said multiplier is configured to calculate a product of said initial estimate and said operand;

a first plurality of inverters coupled to receive, invert, and normalize selected bits from said product to form a first approximation, wherein said first approximation assumes an overflow has occurred in said multiplier;

a second plurality of inverters coupled to receive, invert, and normalize selected bits from said product to form a second approximation, wherein said second approximation assumes an overflow has not occurred in said multiplier; and a multiplexer configured to select either said first or second approximations.

9. The processor as recited in claim 8, wherein said multiplier is coupled to receive the selected approximation from said multiplexer and said initial estimate from said initial estimate generator, wherein said multiplier is configured to multiply the selected approximation with said initial estimate to form an approximate result.

10. The processor as recited in claim 9, wherein said multiplier is configured to receive said approximate result, wherein said processor further comprises control logic configured to cause said multiplier to multiply said approximate result with said operand in an iterative manner.

11. The processor as recited in claim 9, wherein said multiplier is configured to receive said approximate result, wherein said processor further comprises control logic configured to cause said multiplier to multiply said approximate result with said operand in an iterative manner.

12. The processor as recited in claim 9, wherein said first approximation comprises a first exponent and a first mantissa, wherein said non-overflow logic unit is configured to replace said first exponent with a first particular value, and wherein said second approximation comprises a second exponent and a second mantissa, wherein said non-overflow logic unit is configured to replace said second exponent with a second particular value.

13. The processor as recited in claim 9, wherein said multiplexer is configured to select either a first predetermined set of bits from said first approximation, or a second predetermined set of bits from said second approximation, wherein said processor further comprises shifting hardware configured to normalize the selected set of bits.

14. The processor as recited in claim 9, wherein said first plurality of inverters and said second plurality of inverters are configured to operate independently and in parallel.

15. The processor as recited in claim 9, wherein said processor further comprises control logic configured to selectively route said initial estimate, said operand, and said approximate result to solve an iterative formula to evaluate the constant power of said operand.

16. The processor as recited in claim 15, wherein said iterative formula is based upon the Newton-Raphson iteration.

17. The processor as recited in claim 9, wherein said constant power is selected from the group consisting of $-1$, $-\frac{1}{2}$, and $\frac{1}{2}$.

18. A processor capable of calculating the reciprocal square root of an operand B comprising:

an initial estimate generator configured to receive said operand B and output an initial estimate $Y_0^2$ of the operand's reciprocal;

a multiplier coupled to receive said operand and said initial estimate, wherein said multiplier is configured to calculate a product of said initial estimate and said operand;

a overflow logic unit comprising a first plurality of inverters coupled to receive and invert selected bits from said product to form a first approximation of the quantity $(2-Y_0^2 \times B)$, wherein said first approximation assumes an overflow has occurred in said multiplier, wherein said overflow logic unit is configured to pad the most significant bit of said first approximation with a constant one to approximate the quantity $(3-Y_0^2 \times B)$;

a non-overflow logic unit comprising a second plurality of inverters coupled to receive and invert selected bits from said product to form a second approximation of the quantity $(2-Y_0^2 \times B)$, wherein said second approximation assumes an overflow has not occurred in said multiplier, wherein said non-overflow logic unit is configured to pad the most significant bit of said second approximation with a constant one to approximate the quantity $(3-Y_0^2 \times B)$; and a multiplexer configured to select either said first or second approximations.

19. The processor as recited in claim 18, wherein said initial estimate generator is also configured to output an initial estimate of the operand's reciprocal square root $Y_0$, and wherein said multiplier is configured to receive the selected approximation of the quantity $(3-Y_0^2 \times B)$ from said multiplexer and the initial estimate $Y_0^2$ from said initial estimate generator, and wherein said multiplier is configured to multiply said selected approximation of the quantity $(3-Y_0^2 \times B)$ and said initial estimate $Y_0$ to form a result approximating the quantity $Y_0 \times (3-Y_0^2 \times B)$.

20. The processor as recited in claim 19, further comprising a feedback loop coupled from said multiplexer to said multiplier, wherein said feedback loop conveys the selected approximation to said multiplier.

21. The processor as recited in claim 19, wherein said multiplier, said first and second pluralities of inverters, and said multiplexer are each configured to repeat their respective operations a predetermined number of times using the selected approximation squared in place of said initial estimate.

22. The processor as recited in claim 19, wherein said first approximation comprises a first exponent and a first mantissa, wherein said second approximation comprises a second exponent and a second mantissa, and wherein said overflow logic unit is configured to select a first constant in place of said first exponent, and wherein said non-overflow logic unit is configured to select a second constant in place of said second exponent.

23. The processor as recited in claim 22, wherein said first constant is $2^{-1}$, and wherein said second constant is $2^0$.

24. The processor as recited in claim 19, wherein said multiplexer is configured to select either a first predetermined set of bits from said first approximation, or a second predetermined set of bits from said second approximation, wherein said processor further comprising shifting logic configured to normalize the selected set of bits by shifting the selected bits.

25. The processor as recited in claim 19, wherein said overflow logic unit and said non-overflow logic unit are configured to perform independently and in parallel.

26. A method for evaluating a constant power of an operand using a multiplier comprising:

determining an initial estimate of the operand raised to a first constant power;

multiplying the operand and the initial estimate in the multiplier to form a first product;

calculating a normalized first intermediate approximation by performing a bit-wise inversion on the first product assuming an overflow occurred during the multiplying; and calculating a normalized second intermediate approximation by performing a bit-wise inversion on the first product assuming no overflow occurred during the multiplying; and selecting a set of bits from the first intermediate approximation or the second intermediate approximation to form a selected approximation.

27. The method as recited in claim 26, wherein said first constant power is selected from the group consisting of $-1$, $-\frac{1}{2}$, and $\frac{1}{2}$.

28. The method as recited in claim 26 further comprising multiplying the selected approximation by the initial estimate.

29. The method as recited in claim 26 further comprising multiplying the selected approximation by an estimate of the operand raised to a second constant power.

30. The method as recited in claim 26 wherein said determining comprises reading said initial estimate from an initial estimate generator, and wherein said initial estimate approximates the reciprocal of the operand.

* * * * *